US009595319B2

(12) United States Patent
Lee

(10) Patent No.: US 9,595,319 B2
(45) Date of Patent: Mar. 14, 2017

(54) PARTIAL/FULL ARRAY/BLOCK ERASE FOR 2D/3D HIERARCHICAL NAND

(71) Applicant: Peter Wung Lee, Saratoga, CA (US)

(72) Inventor: Peter Wung Lee, Saratoga, CA (US)

(73) Assignee: Peter Wung Lee, Saratoga, CA (US)

(*) Notice: Subject to any disclaimer, the term of this patent is extended or adjusted under 35 U.S.C. 154(b) by 0 days.

(21) Appl. No.: 15/137,284

(22) Filed: Apr. 25, 2016

(65) Prior Publication Data

US 2016/0314833 A1    Oct. 27, 2016

Related U.S. Application Data

(60) Provisional application No. 62/152,744, filed on Apr. 24, 2015.

(51) Int. Cl.
| | |
|---|---|
| *G11C 11/56* | (2006.01) |
| *G11C 16/04* | (2006.01) |
| *G11C 16/08* | (2006.01) |
| *H01L 27/115* | (2006.01) |

(52) U.S. Cl.
CPC ...... *G11C 11/5635* (2013.01); *G11C 11/5628* (2013.01); *G11C 16/0483* (2013.01); *G11C 16/08* (2013.01); *H01L 27/11556* (2013.01); *H01L 27/11582* (2013.01)

(58) Field of Classification Search
CPC ........... G11C 16/0483; H01L 27/11556; H01L 27/11582

USPC ......................................... 365/185.11, 185.13
See application file for complete search history.

(56) References Cited

U.S. PATENT DOCUMENTS

| | | | |
|---|---|---|---|
| 8,865,535 B2* | 10/2014 | Rabkin | H01L 29/6675 438/158 |
| 8,956,968 B2* | 2/2015 | Higashitani | H01L 27/11565 257/E21.577 |
| 9,123,420 B2* | 9/2015 | Rabkin | H01L 29/6675 |
| 2013/0273700 A1* | 10/2013 | Rabkin | H01L 29/6675 438/158 |
| 2016/0078928 A1* | 3/2016 | Lee | G11C 11/56 365/185.03 |
| 2016/0247570 A1* | 8/2016 | Chang | G11C 16/0483 |

* cited by examiner

*Primary Examiner* — Son Mai
(74) *Attorney, Agent, or Firm* — Raywell Group, LLC

(57) ABSTRACT

A novel 2D/3D hierarchical-BL NAND array with at least one plane on independent Psubstrate comprising a plurality of LG groups respectively associated with a plurality of local bit lines (LBLs) laid at a level below a plurality of broken or non-broken global bit lines (GBLs) connected to Page Buffer. Each LG group includes multiple blocks and connects an independent power supply line to each of the plurality of LBLs. Each block including N-bit 2D/3D NAND strings each with S cells connected in series and terminated by two string-select devices and coupled to a common source line. In particular, random-size partial-block WLs are selected from each block of randomly selected LG groups of one plane of the 2D/3D NAND array for erase at the same time with border WLs being optionally preread and program into another plane of the 2D/3D NAND array or optionally saved off-chip and wrote back for data security.

59 Claims, 23 Drawing Sheets

2D NAND Cell

3D NAND Cell

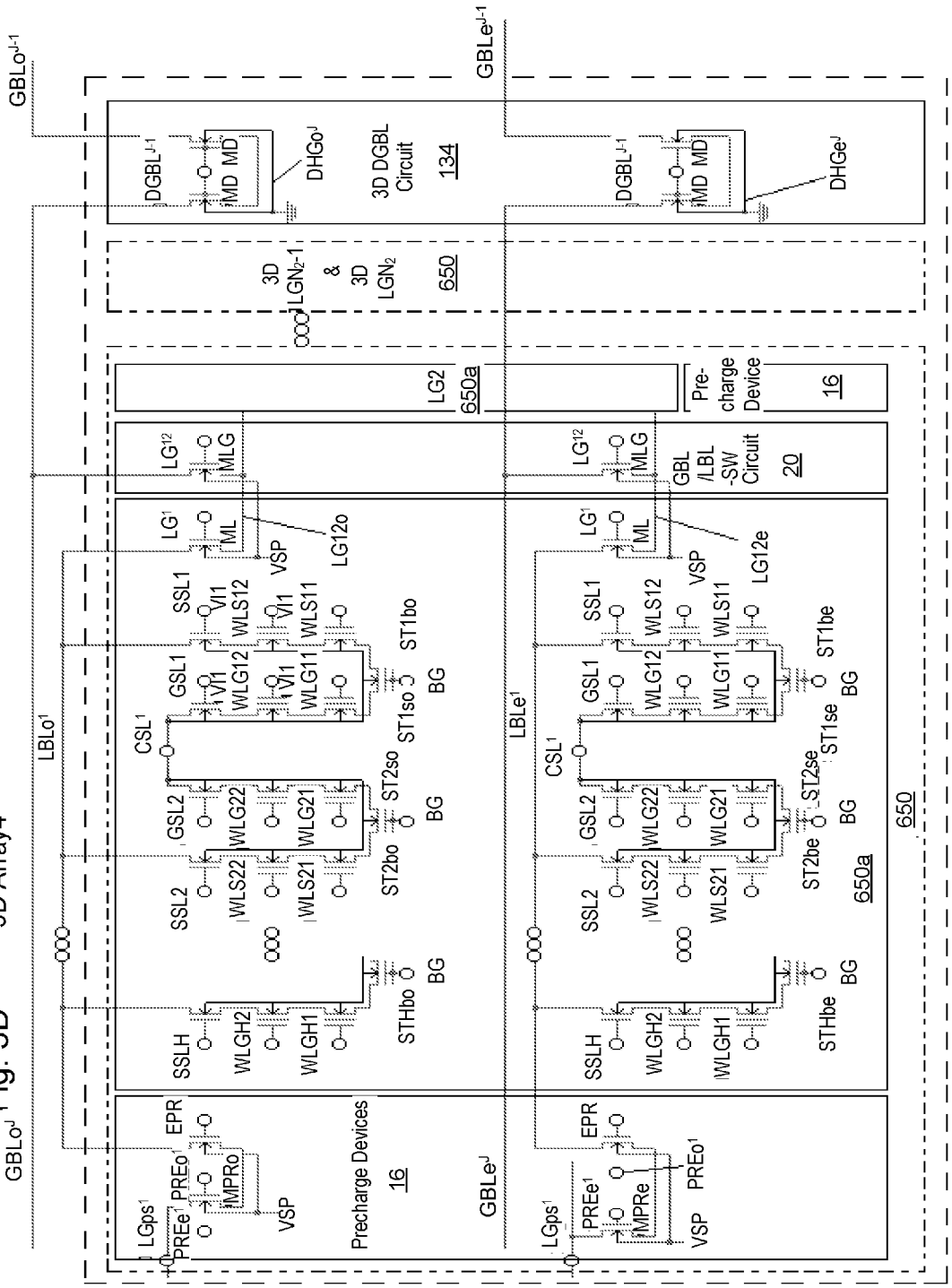
Fig. 5D 3D Array4

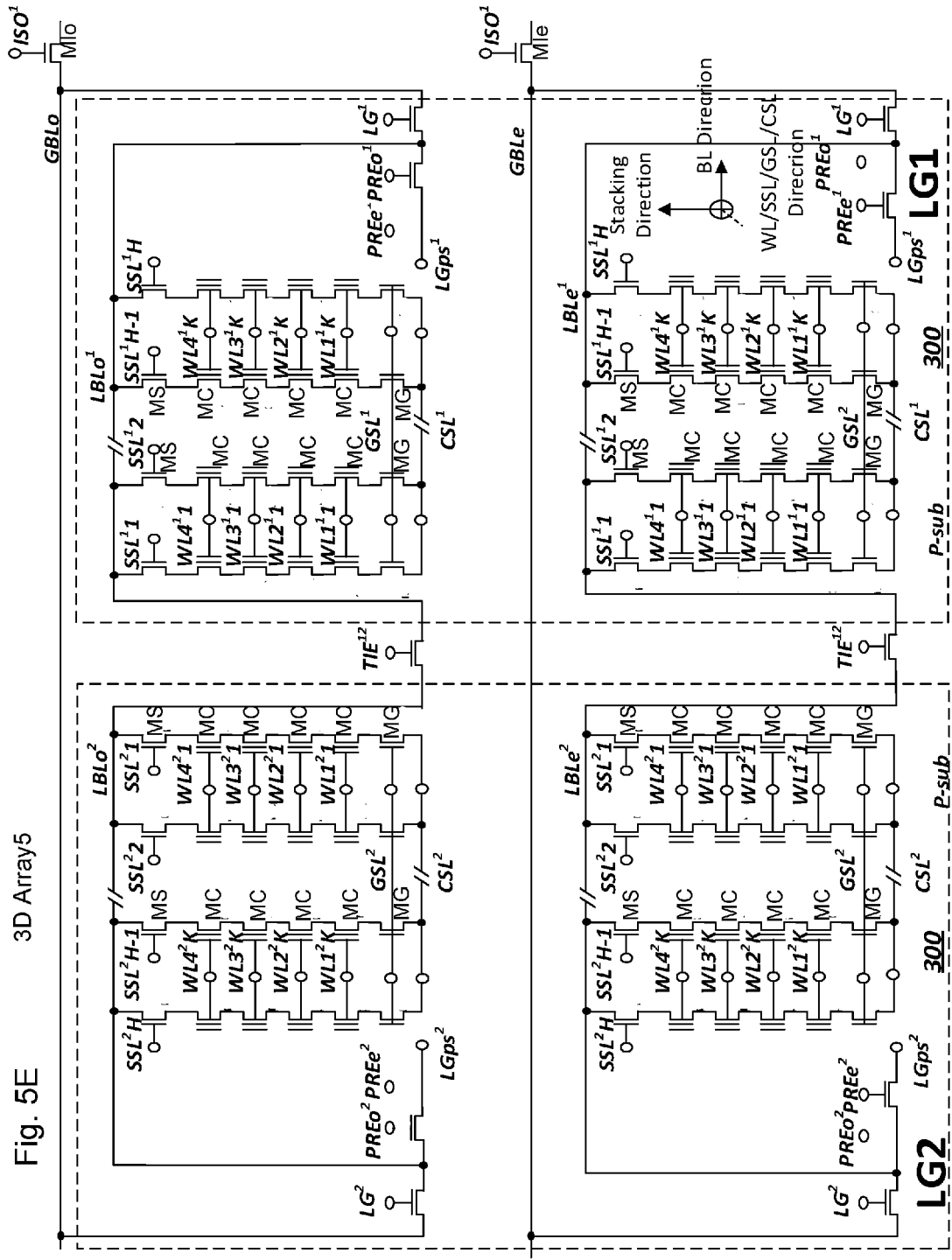
Fig. 5E   3D Array5

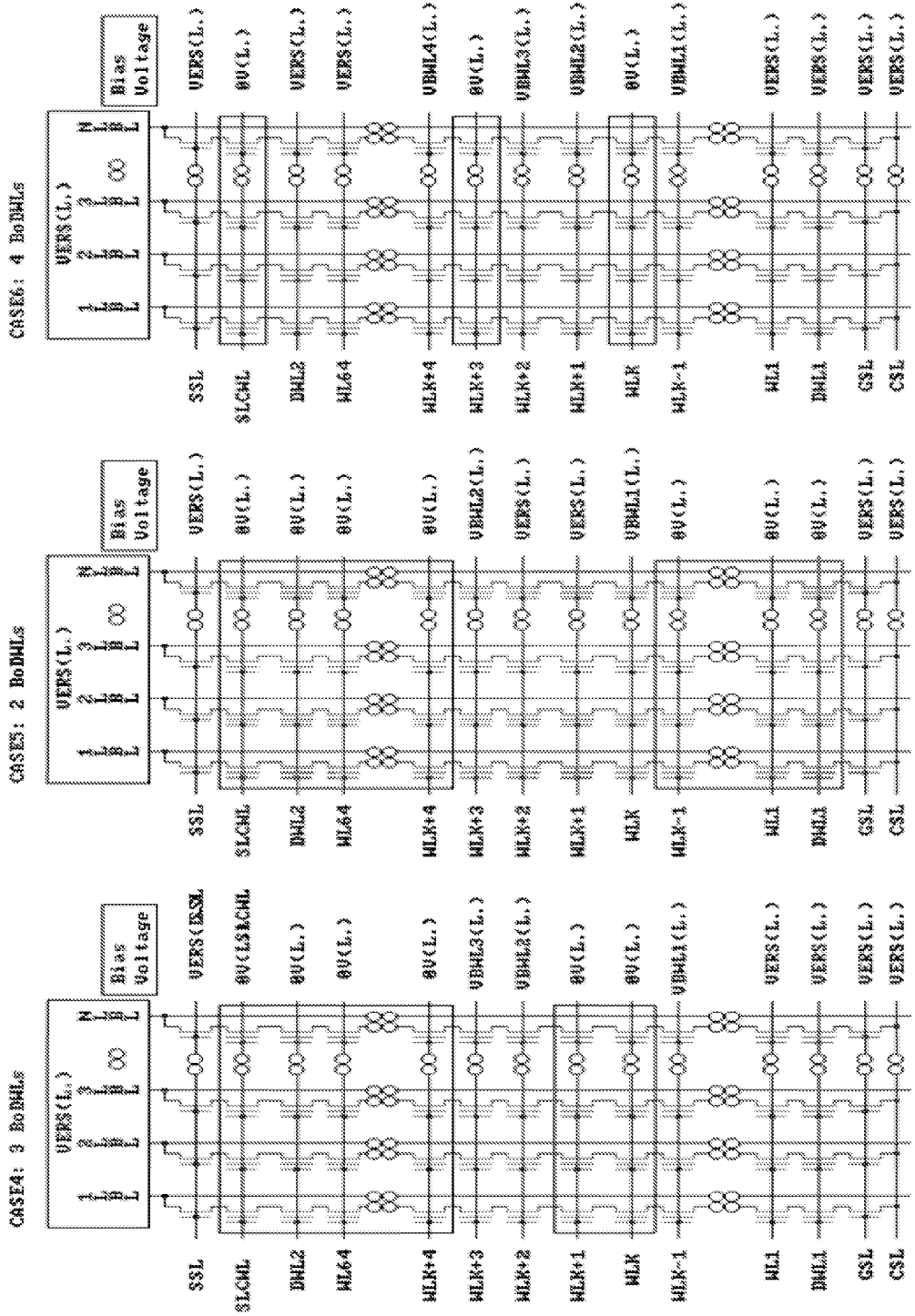

| 2D Random Size Partial Block Erase | | | T0 (Perform on all blocks) | | | | T1 (Perform on one selected block at a time) | | | | T2 (Perform on one selected block at a time) | | | |
|---|---|---|---|---|---|---|---|---|---|---|---|---|---|---|
| | | | VGWL | VG | VD/VS | VHXD | VGWL | VG | VD/VS | VHXD | VGWL | VG | VD/VS | VHXD |
| Selected Blocks | Selected WLs | | $V_{ERASE}$ | FL ($V_{ERASE}$) | FL ($V_{ERASE}$) | 0V | 0V | 0V | FL ($V_{ERASE}$) | VPP | 0V | FL (0V) | FL ($V_{ERASE}$) | 0V |
| | Non-selected WLs | 1 or 2 Border WLs | $V_{ERASE}$ | FL ($V_{ERASE}$) | FL ($V_{ERASE}$) | 0V | $V_{ERASE}$ | $V_{ERASE}$ | FL ($V_{ERASE}$) | VPP | $V_{ERASE}$ | FL( $V_{ERASE}$) | FL ($V_{ERASE}$) | 0V |
| | | Non-border WLS | $V_{ERASE}$ | FL ($V_{ERASE}$) | FL ($V_{ERASE}$) | 0V | $V_{ERASE}$ | $V_{ERASE}$ | FL ($V_{ERASE}$) | VPP | $V_{ERASE}$ | FL ($V_{ERASE}$) | FL ($V_{ERASE}$) | 0V |
| Non-selected WLs of non-selected Blocks | | | $V_{ERASE}$ | FL ($V_{ERASE}$) | FL ($V_{ERASE}$) | 0V | 0V/ $V_{ERASE}$ | FL ($V_{ERASE}$) | FL ($V_{ERASE}$) | 0V | 0V/ $V_{ERASE}$ | FL ($V_{ERASE}$) | FL ($V_{ERASE}$) | 0V |

Note:
A) $V_{TPW} = V_{DNW} = V_{ERASE}$   B) $V_{PP} = V_{ERASE} + V_t$   C) Minimum Random Size: 1-WL
D) Border WL's data have to be stored on-chip (separated TPW/DNW) or off-chip before and after erase for checking the possible Erase-induced bit errors.

Fig. 8

| | | Concurrent operation with multiple random full or partial block nLC erase by GIDL scheme (for 3D Array1) | | |
|---|---|---|---|---|
| LG | Voltage | Preparation Phase | Charge Up Phase | Erase Phase |
| NA | VGBL | float | float | float |
| NA | VISO | Vpass/Vread | Vpass/Vread | Vpass/Vread |
| sel | VCSL(sel) | float | float | float |
| un-sel | VCSL(un-sel) | 0V | 0V | 0V |
| sel | VLGo/e(sel) | 0V | 0V | 0V |
| un-sel | VLGo/e(un-sel) | 0V | 0V | 0V |
| sel | VLG(sel) | 0V | 0V | 0V |
| un-sel | VLG(un-sel) | 0V | 0V | 0V |
| sel | VLBLo/e(sel) | raise from 0V to Vsg | raise from Vsg to Vers | Vers |
| un-sel | VLBLo/e(un-sel) | float | float | float |
| sel | VPREo/e(sel) | raise from 0V to Vsg+Vt | raise from Vsg+Vt to Vers+Vt | Vers+Vt |
| un-sel | VPREo/e(un-sel) | 0V | 0V | 0V |
| sel | VLGps(sel) | Vers | Vers | Vers |
| un-sel | VLGps(un-sel) | 0V | 0V | 0V |
| sel | VSSL(sel) | raise from 0V to Vsg | Vsg | Vsg |
| sel/un-sel | VSSL(un-sel) | float | float | float |
| sel | VGSL(sel) | float | float | float |
| un-sel | VGSL(un-sel) | float | float | float |
| sel | VWL(sel) | float | float | drive down to 0V |
| sel/un-sel | VWL(un-sel) | float | float | float |
| sel | VTIE(sel) | 0V | 0V | 0V |
| un-sel | VTIE(unsel) | 0V | 0V | 0V |

Fig. 9A

| Concurrent operation with multiple random full or partial block nLC erase by GIDL scheme (for 3D Array2) | | | | |
|---|---|---|---|---|
| LG | Voltage | Preparation Phase | Charge Up Phase | Erase Phase |
| NA | VGBL | float | float | float |
| NA | VISO | Vpass/Vread | Vpass/Vread | Vpass/Vread |
| sel | VCSL(sel) | float | float | float |
| un-sel | VCSL(un-sel) | 0V | 0V | 0V |
| sel | VLG(sel) | 0V | 0V | 0V |
| un-sel | VLG(un-sel) | 0V | 0V | 0V |
| sel | VLBLo/e(sel) | raise from 0V to Vsg | raise from Vsg to Vers | Vers |
| un-sel | VLBLo/e(un-sel) | float | float | float |
| sel | VPREo/e(sel) | raise from 0V to Vsg+Vt | raise from Vsg+Vt to Vers+Vt | Vers+Vt |
| un-sel | VPREo/e(un-sel) | 0V | 0V | 0V |
| sel | VLGps(sel) | Vers | Vers | Vers |
| un-sel | VLGps(un-sel) | 0V | 0V | 0V |
| sel | VSSL(sel) | raise from 0V to Vsg | Vsg | Vsg |
| sel/un-sel | VSSL(un-sel) | float | float | float |
| sel | VGSL(sel) | float | float | float |
| un-sel | VGSL(un-sel) | float | float | float |
| sel | VWL(sel) | float | float | drive down to 0V |
| sel/un-sel | VWL(un-sel) | float | float | float |
| sel | VTIE(sel) | 0V | 0V | 0V |
| un-sel | VTIE(unsel) | 0V | 0V | 0V |

Fig. 9B

| Concurrent operation with multiple random full or partial block nLC erase by GIDL scheme (for 3D Array3) | | | | |
|---|---|---|---|---|
| LG | Voltage | Preparation Phase | Charge Up Phase | Erase Phase |
| NA | VGBL | float | float | float |
| sel | VEPR(sel) | 0V | 0V | 0V |
| un-sel | VEPR(un-sel) | 0V | 0V | 0V |
| sel | VBG(sel) | float | float | float |
| un-sel | VBGL(un-sel) | float | float | float |
| sel | VCSL(sel) | raise from 0V to Vsg | raise from Vsg to Vers | Vers |
| un-sel | VCSL(un-sel) | 0V | 0V | 0V |
| sel | VLG(sel) | 0V | 0V | 0V |
| un-sel | VLG(un-sel) | 0V | 0V | 0V |
| sel | VLBLo/e(sel) | float | float | float |
| un-sel | VLBLo/e(un-sel) | float | float | float |
| sel | VPREo/e(sel) | 0V | 0V | 0V |
| un-sel | VPREo/e(un-sel) | 0V | 0V | 0V |
| sel | VLGps(sel) | 0V | 0V | 0V |
| un-sel | VLGps(un-sel) | 0V | 0V | 0V |
| sel | VSSL(sel) | float | float | float |
| un-sel | VSSL(un-sel) | float | float | float |
| sel/un-sel | VGSL(sel) | raise from 0V to Vsg | Vsg | Vsg |
| sel | VGSL(un-sel) | float | float | float |
| un-sel | VWL(sel) | float | float | drive down to 0V |
| sel/un-sel | VWL(un-sel) | float | float | float |

Fig. 9C

| Concurrent operation with multiple random full or partial block nLC erase by FN tunneling scheme (for 3D Array4; VSP=0V) | | | | | |
|---|---|---|---|---|---|
| LG | Voltage | | Preparation Phase | Charge Up Phase | Erase Phase |
| NA | VGBL | | float | float | float |
| sel | VEPR(sel) | | 0V | 0V | 0V |
| un-sel | VEPR(un-sel) | | 0V | 0V | 0V |
| sel | VBG(sel) | | float | float | float |
| un-sel | VBGL(un-sel) | | float | float | float |
| sel | VCSL(sel) | | raise from 0V to Ver1 | raise from Ver1 to Vers | Vers |
| un-sel | VCSL(un-sel) | | 0V | 0V | 0V |
| sel | VLG(sel) | | 0V | 0V | 0V |
| un-sel | VLG(un-sel) | | 0V | 0V | 0V |
| sel | VLBLo/e(sel) | | float | float | float |
| un-sel | VLBLo/e(un-sel) | | float | float | float |
| sel | VPREo/e(sel) | | 0V | 0V | 0V |
| un-sel | VPREo/e(un-sel) | | 0V | 0V | 0V |
| sel | VLGps(sel) | | 0V | 0V | 0V |
| un-sel | VLGps(un-sel) | | 0V | 0V | 0V |
| sel | VSSL(sel) | | float | float | float |
| sel/un-sel | VSSL(un-sel) | | float | float | float |
| sel | VGSL(sel) | | 0V | raise from 0V to float | float |
| un-sel | VGSL(un-sel) | | float | float | float |
| sel | VWL(sel) | | 0V | 0V | 0V |
| sel | VWL(un-sel) | | 0V | raise from 0V to float | float |
| un-sel | VWL(un-sel) | | float | float | float |

Fig. 9D

| Multiple random full or partial block nLC erase by FN tunneling scheme (for 3D Array5) | | | | | |
|---|---|---|---|---|---|
| LG | Voltage | Preparation Phase | Charge Up Phase | Erase Phase |
| NA | VGBL | float | float | float |
| sel | Vpsub(sel) | raise from 0V to Ver1 | raise from Ver1 to Vers | Vers |
| un-sel | Vpsub(un-sel) | 0V | 0V | 0V |
| sel | VTIE(sel) | float | float | float |
| un-sel | VTIE(un-sel) | float | float | float |
| sel | VCSL(sel) | float | float | float |
| un-sel | VCSL(un-sel) | float | float | float |
| sel | VLG(sel) | float | float | float |
| un-sel | VLG(un-sel) | float | float | float |
| sel | VLBLo/e(sel) | float | float | float |
| un-sel | VLBLo/e(un-sel) | float | float | float |
| sel | VPREo/e(sel) | float | float | float |
| un-sel | VPREo/e(un-sel) | float | float | float |
| sel | VLGps(sel) | float | float | float |
| un-sel | VLGps(un-sel) | float | float | float |
| sel | VSSL(sel) | float | float | float |
| sel/un-sel | VSSL(un-sel) | float | float | float |
| sel | VGSL(sel) | 0V | raise from 0V to float | float |
| un-sel | VGSL(un-sel) | float | float | float |
| sel | VWL(sel) | 0V | 0V | 0V |
| sel | VWL(un-sel) | 0V | raise from 0V to float | float |
| un-sel | VWL(un-sel) | float | float | float |

Fig. 9E

PARTIAL/FULL ARRAY/BLOCK ERASE FOR 2D/3D HIERARCHICAL NAND

1. CROSS-REFERENCES TO RELATED APPLICATIONS

This application claims priority to U.S. Provisional Application No. 62/152,744, filed Apr. 24, 2015, commonly assigned and incorporated by reference herein for all purposes.

This application is related to U.S. patent application Ser. Nos. 14/283,209, 14/316,936, 14/341,739, 14/487,078, 14/583,178, 14/806,629, 14/828,427, 14/859,237, and 14/970,525, authored by the same inventor and incorporated by reference herein for all purposes.

2. BACKGROUND OF THE INVENTION

The embodiments of the present invention relate generally to memory architecture and associated operation. More particularly, the invention provides improved partial/full array/block erase schemes on some randomly selected full or partial memory blocks in partial/full array while the program and read operations are being concurrently executed on the other partial array in a 2D/3D NAND array based on 2-level local/global bitline (BL) hierarchical architecture.

The state-of-art 2D NAND memory and NAND-based system are not just a feasible option but already become the very popular component for desktop and laptop computers, cellular phone, data center, and/or network storage applications. The most advanced technology node for 2D NAND design is 15 nm node (1y-node) and the highest density is 128 Gb 8-state TLC per die. The further 2D NAND cell and technology scaling below 15 nm node to increase die memory density beyond 128 Gb has encountered a tremendous challenge due to reaching the technology and physical device limits. In order to increase NAND die memory density beyond 128 Gb to a level even higher than 1 Tb, the NAND industry has used 3D NAND cell technology as an alternative solution beyond the 2D NAND technology for years. Currently, both 2D and 3D NAND flash memory and system designs from SLC, MLC to TLC are coexisting but the 2D NAND captures more market share.

Although the die density improvement of 3D NAND technology looks promising in the near future, the improvements of performances and reliability of a 3D NAND design over 2D NAND counterpart are about 2 folds only and not significant. When flash technology migrates to 1xnm-node for a 2D NAND and 2xnm-node for a 3D NAND with tighter spacing between adjacent BLs and between adjacent WLs, the severe long-held AC (BL-BL switching charge/discharge-induced) coupling effect between any two physically adjacent BLs and the DC (BL-BL and WL-WL programing threshold Vt-induced) coupling effects (Yupin-effect) between any two physically adjacent BLs and WLs have resulted in highly unreliable or even failed nLC operations with more errors and less P/E cycles, particularly for the multi-level NAND Program and Read operations such as MLC, TLC, not mentioning XLC.

In addition, the advancements of NAND cell scaling also worsen HV Vpgm, MHV Vpass and LHV Vread gate disturbance or stress issues during respective nLC operations in all aspects such as program, read, program-verify and erase-verify in both 2D and 3D NAND flash memories. Note, the above HV stands for a High-Voltage (HV) of 16V~25V for single selected programmed WL in the selected block during an nLC program operation. The above MHV stands for a Medium-High-Voltage (MHV) of about 10V for Z non-selected passing WLs in the selected NAND block during a nLC program operation, where Z=63 when a NAND string comprising of 64 cells in series with two selected transistors. Lastly, the above LHV stands for a Low-High-Voltage of 6V for Z non-selected 63 WLs in each selected NAND block as passing WLs during an nLC read operation. The degree of above three gate voltage stresses in order is that Vpgm>Vpass>Vread, while the gate stress or disturb time in order is Tread>Tpass>Tpgm. For example, Tpass=64×Tpgm in the 64-cell NAND string array, while Tread>1,000×Tpgm typically because more read than program in most of NAND applications.

In general, the averaged P/E cycle spec for SLC NAND is 100K, MLC NAND is about 10K, TLC NAND is 3K or below, while Read P/E cycle performance is not mentioned specifically in NAND product spec. But as thumb of rule, Read P/E cycle spec is about 1000 folds of each corresponding nLC P/E cycle spec. In summary, the lowest Vread has the lowest HV stress, thus the least data degradation, while the highest Vpgm has the highest HV program stress, thus the worst data degradation and P/E NAND. As a result, the Vpgm plays the dominant role in determining the final P/E cycle spec.

As a matter of fact, the total HV stresses of 2D and 3D NAND flash cells during NAND product life cycle are not only limited to above 3 said HV program and read operations. In addition, conventionally, the HV 20V (Verase) stress of NAND Erase operation is much higher than Vpgm stress because Terase is much longer than Tpgm, Terase>>Tpgm, even though Verase is set to be compatible with Vpgm, e.g., Verase=Vpgm=20V. For example, Terase>2 ms, while Tpgm of $T_{SLC}$=250 µs, $T_{MLC}$=750 µs, $T_{TLC}$≈1-2 ms.

In other words, as TLC NAND is gradually prevailing in NAND market place in 2015 and beyond, the degree of lengthy cycle time of nLC Program and Program-Verify and Erase stresses play almost equal weight in determining the final P/E cycle spec. In addition, for a more successful TLC design, the Vpass and Vread stresses have to be also taken into the serious consideration. As a result, both in 2D and 3D NAND designs, more effective voltages and time reduction of all HV, MHV, and LHV stresses to increase not only P/E cycles but also P/E/R cycles becomes pivotal for the nLC life cycle. Note, herein E stands for erase, P stands for program, while R stands for read.

In light of above said AC and DC BL-BL and WL-WL coupling effects and HV, MHV and LHV stresses, although many techniques have been proposed and utilized conventional non-hierarchical 2D and 3D NAND designs and productions for years, these techniques cannot effectively reduce the varied HV stress time and voltages. Besides, in the conventional NAND design, only one NAND operation such as read, program and erase can be selectively performed at a time in each NAND plane, thus whole NAND memory and system performances are dramatically jeopardized.

Thereby, improved 2D/3D hierarchical NAND array architectures that allow the concurrent read, program and erase operations in any partial/full 2D/3D NAND planes with goals to effectively achieve reduction of HV stress voltage, legacies, power-consumption and numbers of error-bit of nLC read, program and erase operations are desired.

3. BRIEF SUMMARY OF THE INVENTION

The embodiments of the present invention relate generally to memory architecture and associated operation. More particularly, the invention provides improved partial/full array/block erase operation schemes on random-size partial-block of cells in a partial/full plane of a 2D/3D hierarchical NAND array based on local/global bitline (BL) architecture. Embodiments of the invention provide concurrent erase operation schemes in multiple randomly selected partial or full blocks with trade-off of risk of punch-through between the Border-WL and selected-WL and data loss of Border-WL cells. These schemes can be applied in both 2D and 3D hierarchical NAND memory designs.

In the following summarized embodiments of the present invention, the reference is made to the accompanying drawings that forms a part hereof, and in which is shown, by way of illustration, specific embodiments in which the disclosure may be practiced. In the drawings, like numerals describe substantially similar components throughout the several views. Other embodiments may be utilized and structural, logical, and electrical changes may be made without departing from the scope of the present disclosure.

In an embodiment, the present invention provides a hierarchical array structure implemented in both 2D and 3D NAND arrays so that three long latencies and HV stress of read, program and erase operations can reduced by concurrently performing these operations in multiple randomly selected full and partial blocks.

In another embodiment, the present invention provides a method particularly for performing a partial-block erase in any NAND plane for both 2D and 3D hierarchical NAND arrays, regardless of the erase scheme type of GIDL hot-hole injection or FN-tunneling, or regardless of 2D/3D cell type of 1-poly charge-trapping NAND cell or 2-poly floating-gate NAND cell.

In yet another embodiment, the present invention provides a method for performing concurrent read, program, and erase operations in any NAND plane on any 3D hierarchical NAND design, regardless of the peripheral circuits formed outside or right below the 3D NAND array.

In a specific embodiment, the present invention provides a 3D NAND array with 2-level hierarchical bit line architecture. The 3D NAND array includes one or more planes formed on isolated Psubstates. Each plane includes a plurality of global bit lines (GBLs) laid at a first level in bitline (BL) direction associated with K 3D HG groups separated by group-dividing devices. Each 3D HG group is divided into J 3D LG groups. Each 3D LG group is associated with a plurality of local bit lines (LBLs) laid at a second level in parallel to and respectively coupled to the plurality of GBLs via a plurality of GBL/LBL switch circuits. A pair of 3D LG groups is tied via a row of TIE-signal controlled devices. Each 3D LG group includes H blocks. Each of the H blocks includes the plurality of 3D NAND strings respectively associated with the plurality of LBLs cascaded in a row along a word line (WL) direction orthogonal to the BL-direction and commonly coupled via a row of precharge devices with two PRE signals for respective coupling odd and even LBLs to an independent power line laid in a third level along the WL-direction. Each 3D NAND string includes a series of S 3D NAND cells stacked around a vertical bulk region in a stacking-direction orthogonal to both the BL-direction and the WL-direction and terminated by a pair of string-select devices respectively at two ends of the 3D NAND string having its source node connected to a common source line per one or more blocks. The vertical bulk region is isolated from the Psubstrate of the plane. K, J, H, and S are integers of 2 and greater based on memory chip design.

In another specific embodiment, the present invention provides a 3D NAND array with 2-level hierarchical bit line architecture. The 3D NAND array includes one or more NAND planes with independent Psubstrates. Each plane includes a plurality of global bit lines (GBLs) laid at a first level associated with J 3D HG groups mutually connected by a row of 3D DGBL circuits. Each 3D HG group is divided into $N_2$ 3D LG groups. Each 3D LG group is associated with a plurality of local bit lines (LBLs) laid at a second level in parallel to GBL-direction and respectively coupled to the plurality of GBLs via a plurality of 3D GBL/LBL switch circuits. Each 3D LG group includes H blocks. Each of the H blocks includes a plurality of 3D NAND strings respectively associated with the plurality of LBLs cascaded in a row along a word line (WL) direction orthogonal to the GBL-direction and commonly coupled via a row of 3D precharge devices and an additional 3D EPR-controlled device with two PRE signals for respective coupling odd and even LBLs to an independent power line laid in a third level along the WL-direction. Each 3D NAND string includes a series of S 3D NAND cells formed in U-shape with two partial strings being stacked around a vertical bulk region in a stacking-direction orthogonal to both the GBL-direction and the WL-direction and linked by a BG-controlled device at bottom of the string. The 3D NAND string has its source node connected to a first string-select device controlled by SSL signal and its drain node connected to a second string-select device controlled by GSL signal and coupled to a common source line per one or more blocks. The vertical bulk region is isolated from the Psubstrate of the plane. J, $N_2$, H, and S are integers of 2 and greater based on memory chip design. Additionally, the 3D NAND array includes a block-decoder configured to use a latch signal to control passing a set of voltage signals from a voltage generator via a set of global bus lines respectively to all WLs and SSL and GSL of the first and second string-select devices per block. Further, the 3D NAND array includes a set of decoders for respectively sending control signals to the row of 3D DGBL devices, a plurality of 3D GBL/LBL switch circuits, two PRE signals and an EPR signal for a row of 3D precharge devices. Furthermore, the 3D NAND array includes driver circuits for respectively providing voltage signals for the common source line per one or more blocks and the independent power line per 3D LG group.

In yet another specific embodiment, the present invention provides a 3D NAND array with 2-level hierarchical bit line architecture. The 3D NAND array includes one or more NAND planes on respective Psubstrates. Each plane includes a plurality of global bit lines (GBLs) laid at a first level in bit line (BL) direction associated with K 3D HG groups separated by group-dividing devices. Each 3D HG group is divided into J 3D LG groups. Each 3D LG group is associated with a plurality of local bit lines (LBLs) laid at a second level in parallel to and respectively coupled to the plurality of GBLs via a plurality of 2D GBL/LBL switch circuit. A pair of 3D LG groups is tied via a row of 2D TIE-signal controlled devices. Each 3D LG group includes H blocks. Each of the H blocks includes a plurality of 3D NAND strings respectively associated with the plurality of LBLs cascaded in a row along a word line (WL) direction orthogonal to the BL-direction and commonly coupled via a row of 2D precharge devices with two PRE signals for respective coupling odd and even LBLs to an independent power line laid in a third level along the WL-direction. Each 3D NAND string includes a series of S 3D NAND cells stacked around a vertical bulk region in a stacking-direction orthogonal to both the BL-direction and the WL-direction.

The 3D NAND string has its source node connected to a first string-select device controlled by SSL signal and its drain node connected to a second string-select device controlled by GSL signal and coupled to a common source line per one or more blocks. The vertical bulk region is directly formed on the Psubstrate of the plane. K, J, H, and S are integers of 2 and greater based on memory chip design. Additionally, the 3D NAND array includes a block-decoder configured to use a latch signal to control passing a set of voltage signals from a voltage generator via a set of global bus lines respectively to all WLs and SSL and GSL of the first and second string-select devices per block. Further, the 3D NAND array includes a set of decoders for respectively sending control signals to the group-dividing devices, each 2D GBL/LBL switch circuit, TIE signal for each row of TIE-signal controlled devices, two PRE signals for 2D precharge devices. Furthermore, the 3D NAND array includes driver circuits for respectively providing voltage signals for the common source line per one or more blocks and the independent power line per 3D LG group.

4. BRIEF DESCRIPTION OF THE DRAWINGS

The following drawings are merely examples for illustrative purposes according to various disclosed embodiments and are not intended to limit the scope of the present invention.

FIG. 5D shows a part of a 3D hierarchical NAND array according to still another embodiment of the present invention.

FIG. 5E shows a part of a 3D hierarchical NAND array according to yet still another embodiment of the present invention.

FIGS. 7A-7F are circuit diagrams with bias conditions set for various different cases of random-size partial-block erase operations in 2D hierarchical NAND array of FIG. 2 according to an embodiment of the present invention.

FIG. 8 shows a 2D random-size partial-block erase operation with the optimal bias conditions according to an embodiment of the present invention.

FIG. 9A shows a preferred set of the bias conditions of a full or partial-block erase operation under a 3D hierarchical NAND array of FIG. 5A according to an embodiment of the present invention.

FIG. 9B shows a preferred set of the bias conditions of a full or partial-block erase operation under a 3D hierarchical NAND array of FIG. 5B according to an embodiment of the present invention.

FIG. 9C shows a preferred set of the bias conditions of a full or partial-block erase operation under a 3D hierarchical NAND array of FIG. 5C according to an embodiment of the present invention.

FIG. 9D shows a preferred set of the bias conditions of a full or partial-block erase operation under a 3D hierarchical NAND array of FIG. 5D according to an embodiment of the present invention.

FIG. 9E shows a preferred set of the bias conditions of a full or partial-block erase operation under a 3D hierarchical NAND array of FIG. 5E according to an embodiment of the present invention.

5. DETAILED DESCRIPTION OF THE INVENTION

Figure 1A:
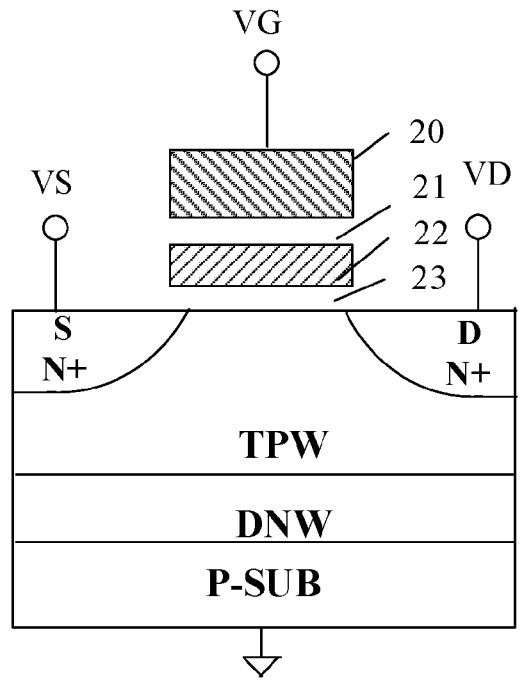
FIG. 1A shows a cross-sectional view of a 2-poly floating-gate 2D NMOS NAND cell in a 2D NAND string and on a triple P-well (TPW) within a Deep N-well (DNW) on top of P-substrate.

In the following detailed description of the present embodiments, reference is made to the previous pending utilities or provisional ones filed the same inventor and the following accompanying drawings that forms a part hereof, and in which is shown, by way of illustration, specific embodiments in which the disclosure may be practiced. In the drawings, like numerals describe substantially similar components throughout the several views. These embodiments are described in sufficient detail to enable those skilled in the ordinary art to practice the embodiments. Other embodiments may be utilized and any structural, logical, and electrical changes may be made without departing from the scope of the present disclosure. The following detailed description, therefore, is not intended to be exhaustive or to be limited to the precise form disclosed.

In following description, when N-bit nLC NAND memory is referred, it means that total 16 KB physical nLC NAND cells residing in one physical WL or page not including the additional syndrome ECC bytes for description simplicity for both 2D and 3D NAND. In this application, N-bit means a full physical WL page of 16 KB nLC cells. Thereby, N/2-bit means 8 KB ($N^1$-bit) which is ½ of one full physical page or ½ WL size storing 8 KB regular nLC NAND cells. Furthermore, N/4-bit means 4 KB ($N^2$-bit) which is ¼ of one full physical page or ¼ WL size storing 4 KB regular nLC NAND cells.

In this specification, a 2D hierarchical NAND array is used as an example for illustrating the inventive features of the present disclosure. The major features of this 2D hierarchical NAND array are summarized below while details will be seen further in descriptions of FIGS. 2, 3A, and 4, with part of them have been disclosed in one or more previous U.S. patent applications (for example, U.S. patent application Ser. No. 14/970,525) incorporated as references for all purposes:

1) A 2D hierarchical-BL structure: a) The 2D NAND array comprises one or two physically separate NAND planes with a full physical TPW and DNW separated by one row of first ISO 20V circuit in bit line (BL) or Y direction; b) each NAND plane includes J HG groups connected by $N^1$ GBL long vertical metal lines at top M2 level with 4λ-pitch; c) Each HG is further divided into multiple number $N^6$ of LG groups, each LG group including H blocks connected by N LBL short metal lines at lower M1 level with 2λ-pitch and one dedicated LGps metal line at lowest M0 level for Vinh and Vss local precharge and discharge operations; d) Each NAND block comprises N NAND strings with X1 2D NAND cells connected in series optionally with two dummy WLs [two WLs placed near each top string select MHV MS (MSe or MSo) transistor and one placed near the bottom string source select transistor MHV MG (MGe or MGo)] having a common source line (CSL) at the M0 level, where the top dummy row is reserved for saving $N^1$ Odd or $N^1$ Even SLC storage operation for all unfinished nLC Odd or Even $N^1$-bit digital program data whenever system power Vdd is shut off; X1=8, 16, 32, 64, 128 or any other Integer number; e) Each LBL at M1 level forms a $C_{LBL}$ capacitor as an 1-bit dynamic cache register (DCR) for temporarily storing 1-bit data like 1-bit DRAM cell so that J-page concurrent and pipeline operations can be performed in one or two physically separate NAND planes in LBL direction; f) Each NAND plane comprises $N^6$ pages of N $C_{LBL}$ capacitors as N-bit DCRs within each HG or $N^6$ LGs respectively coupled to $N^6$ LG-decoders, $N^6$ LGps lines, and $N^6$ LG-precharge circuits with a dramatically reduced N/4-bit ($N^2$-bit) data buffer (DB) and N/4-bit ($N^2$-bit) static cache register (SCR), where each DB includes one N/4-bit Multiplier, one N/4-bit sense-amplifier (SA) and a N/4-bit program-read buffer (PR/B).

2) GBL and LBL connection manners: a) (GBL//LBL)⊥(CSL//LGps). Optionally, one M2 GBL is connected to one M1 LBL on one-to-one basis, i.e., N M2 GBLs are connected to N M1 LBLs. Optionally, one M2 GBL is connected to 2/4/8 M1 LBLs, i.e., that means N/2 or N/4 or N/8 M2 GBLs are connected to N M1 LBLs. Optionally, one physical WL has N NAND cells. Optionally, both M0 CSL and M0 LGps line are laid out to be perpendicular to M2 GBLs and M1 LBLs. b) (GBL//LBL//LSL)⊥LGps. Optionally, one M2 GBL is connected to one M1 LBLs, i.e., N/2 M2 GBLs are connected to N/2 M1 LBLs shared by N NAND strings. Optionally, one M1 LBL is shared by two NAND strings and one adjacent LBL is used as one locally dedicated local source line (LSL). In other words, no CSL line at all in whole array. Optionally, LGps lines at M0 level are laid out to be perpendicular to M2 GBL, M1 LBL and M1 LSL lines. Optionally, one physical WL has N NAND cells.

3) nLC program and program-verify schemes are preferably performed in rotation manner between interleaved Odd and Even LBL cells in each single physical WL: a) In case of (GBL//LBL)⊥(CSL//LGps), optionally, if one M2 GBL is connected to 1 M1 LBL, a 3-step, 1-4-8-8 TLC, AVtz, ABL, Alt-LBL, Alt-WL, N-bit program and N-bit program-verify scheme is used in one single WL with 8 TLC fine program. Optionally, if one M2 GBL is connected to 2/4/8 M1 LBLs, a 3-step, 1-4-8-8 TLC AVtz, ABL-like, Alt-LBL, N/2-bit program and N/2-bit program-verify scheme is used in one single WL with 8 TLC fine program. Alt-LBL means operation is performed at alternating Odd and Even LBL cells. Optionally, J page can be performed program operation concurrently. Optionally, TLC read is performed without any source line voltage $V_{SL}$-based Vt compensation. b) In case of (GBL//LBL//LSL)⊥LGps, optionally, if one M2 GBL is connected to one M1 LBLs, a 2-step, 1-4-8 TLC, AVtz, ABL-like, Alt-BL, Alt-WL, N/2-bit program and N/2-bit program-verify scheme is used in one single WL without performing 8 TLC fine program. Optionally, concurrent operations can be performed. Optionally, TLC read is performed with N/2-bit $V_{SL}$-based Vt compensation in one single physical WL.

4) nLC program and program-verify schemes that are performed in rotation manner among 3 physically adjacent WLs: a) For 4-Vt MLC Alt-WL program, optionally, a 3 WL-based Alt-WL MLC program is used on the regular non-open WLs, and optionally, a 2 WL-based Alt-WL MLC program is used on the open-WLs. b) For 7-Vt TLC Alt-WL program, a 3 WL-based Alt-WL TLC program is used on the regular non-open WLs, or optionally, a 2 WL-based Alt-WL TLC program is used on the open-WLs.

5) nLC read schemes in single WL: a) In case of (GBL//LBL)⊥(CSL//LGps), no $V_{SL}$-based Vt compensation is performed. Optionally, if one M2 GBL is connected to one M1 LBL sub-case, i.e., N M2 GBLs are connected to N M1 LBLs, 3 N/2-bit Odd/Even MLC reads for Q1, Q2, and Q3 without using $V_{SL}$-based Vt compensation and 7 N/2-bit Odd/Even MLC reads for P1, P2, P3, P4, P5, P6 and P7 without using $V_{SL}$-based Vt compensation. Optionally, if one M2 GBL is connected to 2/4/8 M1 LBLs, i.e., N/2 or N/4 or N/8 M2 GBLs are connected to N M1 LBLs, 6 N/4-bit Odd/Even MLC reads for Q1, Q2 and Q3 without using $V_{SL}$-based Vt compensation and 14 N/4-bit Odd/Even MLC reads for P1, P2, P3, P4, P5, P6 and P7 without using $V_{SL}$-based Vt compensation. b) In case of (GBL//LBL)⊥LGps, $V_{SL}$-based Vt compensation is used in accordance with WLn+1 TLC page data. Optionally, if one M2 GBL is connected to one M1 LBLs, i.e., N/2 M2 GBLs are connected to N/2 M1 LBLs shared by N NAND strings where each M1 LBL is shared by two NAND strings. This is the case to use one adjacent LBL as one locally dedicated LSL. Furthermore, 3 N/2-bit Odd/Even MLC reads for Q1, Q2 and Q3 with $V_{SL}$-based Vt compensation and 7 N/2-bit Odd/Even MLC reads for P1, P2, P3, P4, P5, P6 and P7 with $V_{SL}$-based Vt compensation. M0 LGps lines are laid out to be perpendicular to M2 GBLs and M1 LBLs.

6) Over-program recording (programming) and accurate program-state program: a) This Over-program recording is performed in J-page basis. b) The Over-program recording means to program over-program cells' Vt to P8, which is defined at least 0.5V higher than the regular highest nLC program state. For example, if TLC highest program state is P7, then the over-program cell would be programmed to P8, which has Vt at least 0.5V higher than P7. c) Accurate program-state program means to program the over-program cell's true Vt in accordance with their nLC data in another location that can be in the spare of same physical WL or in a different WL. The true value can be stored in 1-bit of one original Vt of one original nLC data or in n-bit SLC form for a superior data. For example, each over-program TLC cell can be stored in a new 1-bit TLC cell or new 3 bits of SLC cells. d) The sequence of over-program cells in each nLC WL is used to program the sequence of new over-program cells' nLC states in same or different WL so that the accurate Vt compensation can be performed to find out the original nLC data of the over-program cells without using the complicate and time-consuming ECC calculation. e) The sequence and locations of the over-program cells in each selected nLC WL is obtained by performing additional P8 read operation by applying the Vtp8 min=$V_{WL}$ during P8 over-program read operation. Only the over-program cells, the read digital data is "1" and the rest of P0-P7 cells, the read data is "0." f) The over-program P8 read page data will be sequentially shifted out and analyzed by the off-chip Flash controller to find out the physical location of over-program cells in each physical WL so that the Vt-compensation operation can be performed subsequently without using ECC calculation.

Although particular embodiments of 2D and 3D hierarchical NAND array with the mixed pipeline and concurrent operations are disclosed in both 2D and 3D NAND manufacturing technologies, other derivatives, modifications and changes from the present invention will be apparent to those of ordinary skill in the art and should be covered by this invention. Some embodiments have been covered in previous U.S. patent applications by the same inventor of this invention and are omitted here for description simplicity. Only the new inventive concepts are summarized below as the targeted objectives.

Some terminologies used throughout the current specification are explained or defined here.

a) ABL program stands for all bit lines program. In this invention with 2-level hierarchical NAND array having both LBLs and GBLs, it means All-LBL program.

b) ABL-like program stands for near All-BL program. All LBLs in Odd/Even numbered columns of the hierarchical NAND array are selected for program in a first cycle with LBls in Even/Odd columns being program-inhibited. Next, all LBLs in Even/Odd columns are selected for program in a second cycle but LBLs in Odd/Even columns are program-inhibited. In both the first and the second cycles, the program-verify is performed. In this way, the BL-BL cells' threshold Vt coupling effect can be reduced.

c) AVtz program stands for an operation where all $2^n$ nLC Vt states are programmed simultaneously, where nLC represents different data storage types: n=1 for SLC with 2 Vtz, n=2 for MLC with 4 Vtz, n=3 for TLC with 8 Vtz and n=4 for XLC with 16 Vtz including the Vte erase state.

The J-page concurrent mixed pipeline operations include the following key regular NAND operations (here the J means generally multiple numbers depending on how each plane of the 2D/3D NAND array is divided via the 2-level hierarchical BL architecture):

a) A J-page ABL nLC program: Full 16 KB cells in one physical WL are selected for nLC program simultaneously.

b) A J-page N/2-bit Odd/Even nLC program-verify: Half-page of 8 KB cells are verified at the same time.

c) A J-page N/2-bit Odd/Even nLC erase-verify: All 16 KB cells are performed.

d) A J-page N/2-bit Odd/Even nLC read: Half-page of 8 KB cells are verified at the same time.

e) An ABL J-page N-bit LBL Vinh or Vdd precharge and discharge operations.

f) A first J-page Odd/Even N/2-bit V1 precharge followed by a second J-page Even/Odd N/2-bit V2 precharge to mitigate the LBL-LBL AC coupling effect to ensure the successful read, verify, and program operations, where V1>V2 and the preferred V1>3×V2 and V2=Vdd.

g) A N/4-page nLC data parallel loading and Vdd/Vss to Vinh/Vss voltage conversion in according with each N/4-page data.

The J-page concurrent mixed pipeline operations also include the following reliability related operations:

a) A J-page NAND Data-retention check and refresh without or without an erase step.

b) A J-page NAND wear-leveling check, data relocation and program.

c) A J-page Garbage-collection operation under preset policy.

d) A J-page read-post-program on J selected dispersed WLs to find over-program, J adjacent WL nLC data check to find WL-WL coupling effect by performing J-page read prior to writing back J-page data on J selected dispersed WLs.

e) A J-page nLC ABL concurrent and pipeline program for RAID4, RAID5 or other RAID-type of SSD systems with J-fold reduction in J-page data loading and J-page program latencies.

f) A flexible X-WL full or partially erased blocks with two boarder WLs cells un-erased but marked to protect two physically adjacent nLC WLs' data from being damaged in same block, where X value varies from minimum 3 to maximum 64 if a 64-NAND cell string scheme is used.

FIG. 1A shows a cross-sectional view of a 2-poly floating-gate 2D NMOS NAND cell in a 2D NAND string and on a triple P-well (TPW) within a Deep N-well (DNW) on top of P-substrate. In past 30 years of 2D NAND production, the 2D NMOS NAND cell structure is unified in one type as seen in the FIG. 1A for all mainstream 2D NAND manufacturers. The 2D NAND cell has 6 terminal nodes including N+ source node, N+ drain node, 2-poly gate node, TPW node, DNW node, and P-sub node. DNW node is a layer formed over the P-substrate and TPW node is a layer formed over the DNW layer. N+ source node and N+ drain node are respectively formed in the TPW layer with a separation channel region. A first insulation layer 23 overlies the channel region supporting a poly-1 layer 22 above. A second insulation layer 21 overlies the poly-1 layer 22 supporting a poly-2 layer 20 which serves as the gate node. During various NAND (program, read, erase, or verify) operations, the 6 terminal nodes of N+ source node, N+ drain node, 2-poly gate node, TPW node, DNW node, and P-sub node are subjected to respective bias voltages of $V_S$, $V_D$, $V_G$, $V_{TPW}$, $V_{DNW}$, and $V_{psub}$. This 2D cell represents one NAND cell of every 2D plannar NAND string used in all 2D hierarchical NAND arrays of the present invention.

Figure 1B:
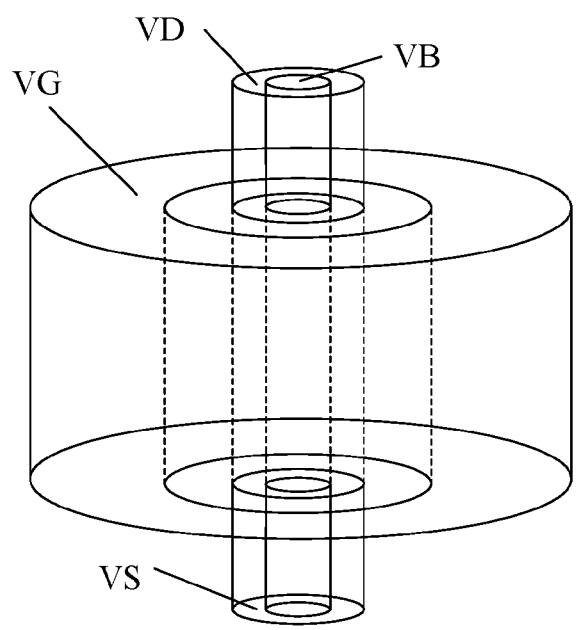
FIG. 1B shows a cross-sectional view of a 1-poly charge-trapping layer 3D NMOS NAND cell in a 3D cylinder string with a bulk in the center ring and WL gate formed on the outer ring.

FIG. 1B is a simplified cross-sectional view of the preferred vertical-channel 3D NAND cell structure for all 3D NAND cells types to be used to build a 3D NAND string and a 3D hierarchical NAND array by the present invention. As shown, it is a cross-sectional view of a 3D NMOS NAND cell in a 3D cylinder string with a bulk in the center ring and WL gate formed on the outer ring. Based on this vertical-channel structure, several 3D NAND cell structures can be created. Firstly, a 1-poly charge-trapping SONOS-type 3D NMOS NAND cell can be formed with its bulk being directly connected to NAND wafer's Psubstrate. This type of 3D NAND cell uses FN-tunneling scheme (the same as 2D NAND cell) to perform bulk erase for full and partial block erase. Secondly, a 1-poly charge-trapping SONOS-type 3D NMOS NAND cell is formed with its bulk being isolated directly from the wafer's Psubstrate. This type of 3D NAND cell uses GIDL-erase scheme to perform SL-side or BL-side full and partial block erase. Thirdly, a 2-poly Floating-gate type 3D NMOS NAND cell can be formed with its bulk being directly connected to NAND wafer's Psubstrate, thus capable of using FN-tunneling scheme to perform erase. Further, a 2-poly Floating-gate type 3D NMOS NAND cell is formed with its bulk being isolated directly from the wafer's Psubstrate, thus capable of using GIDL-erase scheme to perform SL-side full and partial block erase.

Each of the four types of 3D NAND cell has 4 terminal nodes including N+ source node at bottom inner ring, N+ drain node at top inner ring, Poly2-gate or Poly-gate node at outer ring, and P+ bulk node at center ring respectively associated with 4 bias voltages of $V_S$, $V_D$, $V_G$, and $V_B$. This $V_B$ can be either directly connected to wafer's Psubstrate for performing FN-tunneling erase or isolated from the Psubstrate for performing GIDL erase. Between each inner vertical channel ring and the outer Poly ring, a charge-storage layer is formed. There are two kinds to form the storage layer such as the 2-poly floating-gate 3D NAND NMOS cell or the 1-poly charge-traping 3D NAND NMOS cell. Above two kinds of 3D NAND cells and associated 3D NAND vertical NAND strings are used in various 3D hierarchical NAND arrays of the present invention.

In the current disclosure, several 2D and 3D hierarchical NAND arrays are used as examples for illustrating the inventive features of the present invention. The major features are summarized below while details will be seen further in descriptions from FIG. 2 to FIG. 10, with part of them have been disclosed in one or more previous U.S. patent applications (for example, U.S. patent application Ser. No. 14/970,525) incorporated as references for all purposes.

Figure 2:
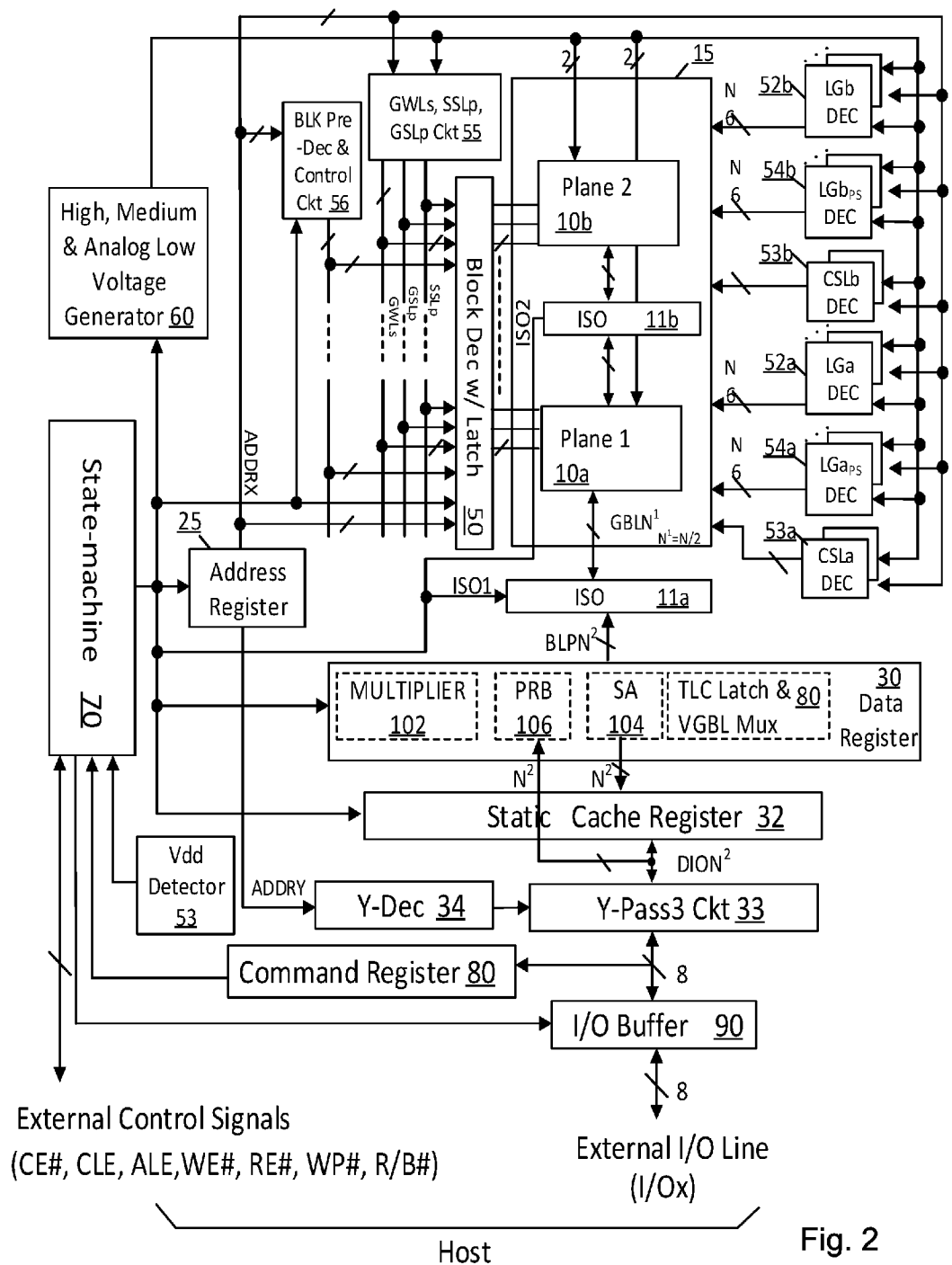
FIG. 2 is a circuit diagram of a preferred 2-level hierarchical LBL/GBL 2D/3D NAND chip having at least two separate 2D/3D NAND planes being divided by one row of 20V NMOS ISO circuit according to an embodiment of the present invention.

FIG. 2 is a circuit diagram of a preferred 2-level hierarchical LBL/GBL 2D/3D NAND chip according to an embodiment of the present invention. As shown, the 2D/3D hierarchical NAND array includes at least two adjacent 2D/3D NAND planes (Plane1 10*a* and Plane2 10*b*) laid in the bit line direction divided by two HV (20V) NMOS ISO circuits (11*a* and 11*b*) with varied decoders such as block decoder with latech (circuit 50), LG decoders (52*a* and 52*b*), LGps-decoders (54*a* and 54*b*), CSL decoders (53*a* and 53*b*) and Y-dec (34).

Each 2D/3D NAND plane 10*a* or 10*b* is further configured with a plurality 2D/3D HGs (HG groups). Each HG comprises a plurality of paired 2D/3D LGs (LG groups). Each LG further comprises a plurality of 2D/3D NAND blocks along bitline (BL) direction and each block further comprises N 2D/3D NAND strings with their N individual but being connected by N parallel low-level local bitlines LBLs, $N^1$ top-level parallel global bitlines GBLs, $N^2$ BLP data lines (connected to Page Buffer), and one common sourceline CSL and one independent power line LGps of the preferred 2D/3D hierarchical NAND array, where $N^2$ (BLP Data lines)≤$N^1$ (GBL lines)≤N (LBL lines). Each LG comprises one page of N-bit LBL-based DCRs and is further divided into multiple blocks of N 2D/3D NAND strings. Between every two adjacent blocks of a CSL is shared by the N 2D/3D NAND strings in each block. Optionally, the LGps power line is laid out in parallel to the CSL for both Plane1 and Plane2. The N-bit data of each selected block of each 2D/3D NAND plane can be bidirectionally transferred between two adjacent 2D/3D NAND planes corresponly on $N^2$-based basis per cycle via Data Buffer as a transient $N^2$-bit temporary CACHE buffer.

Note, in this 2D/3D NAND array, all CSLs are metal lines laid at the lowest M0-level similarly as M0-level LGps lines. Optionally, CSLs are in parallel to the LGps lines but they are perpendicular to all LBLs laid in M1-level and GBLs laid in top M2-level. In addition, two M1-level 2λ-pitch LBLs are connected to one 4λ-pitch M2 GBL through a LG Y-Pass1 Odd/Even circuit to save cost. The definition of a 2λ-pitch M1-level LBL means 1λ M1-level LBL width and 1λ M1-level LBL spacing at the bottom-level, while a 4λ-pitch M2-level GBL means the width of GBL is W1 and GBL spacing is S1 and W1+S1=4λ. There are many possible combinations of W1+S1 of GBL. These two vertically 2D/3D NAND planes are separated by two 20V ISO circuits and are vertically connected to one shared reduced DB 30 via the second ISO circuit with 20V protection during any plane under erase operation. As a result, both planes can be erased on the same time or at different time, depending on the operation needs. More planes like above Plane1 and Plane2 can be made on another side of block decoders or DB and Static CACHE Register (SCR). Totally, 8 planes of four pairs of above Plane1 and Plane2 can be made for a higher density of 2D/3D NAND.

Since Plane2 (10*b*) and Plane1 (10*a*) are separated, thus there are two separate HV power lines from the circuit of high, medium, and analog LV generator (60) are routed to two separate bulks. In real erase operation of the present invention, the following scenarios can happen:

a) Only Plane1 is under an erase operation. By supplying Verase (up to 20V) to both bulks of Plane1 (10*a*) with both 2D/3D isolation circuits ISO1 (11*a*) and ISO2 (11*b*) being held at an off-state by setting $V_{ISO1}=V_{ISO2}=0V$.

b) Only Plane2 is under an erase operation. By supplying Verase to both bulks of Plane2 (10*b*) with the 2D/3D isolation circuit ISO2 (11*b*) being held at an off-state with the 2D/3D isolation circuit ISO1 (11*a*) being held at an on-state by setting. In other words, 2D/3D NAND Plane1 is connected to the LV Data Register or Data Buffer (DB) 30 and Plane2 Verase is isolated from reaching Plane1 and damaging the LV DB (30) and LV Static Cache Register (SCR) (32).

c) Both Plane1 and Plane2 are under erase operations. By supplying Verase to both bulks of Plane2 (10*b*) and Plane1 (10*a*) with both 2D/3D isolation circuits ISO 11*a* and 11*b* being held at off-state.

Note, during a partial-block erase disclosed herein, following scenerios are possible: a) Only Plane2 is under the partial-block erase, nLC data of a plurality of multiple border WLs of unselected WLs in Plane2 are transferred to the selected DCRs of Plane1 with ISO circuits of 11*a* and 11*b* in on-state before erase operation is carried out on Plane2. After the data transferring, ISO circuit 11*b* is turned off to isolate the subsequent Verase in Plane2 from reaching Plane1, LV DB and SCR for protection. b) Only Plane1 is under the partial-block erase, conversely, nLC data of the plurality of multiple border WLs of unselected WLs in Plane1 are transferred to selected DCRs of Plane2 with ISO circuits of 11*a* and 11*b* in on-state before the erase is carried out on Plane2. After the transferring, both ISO circuits 11*a* and 11*b* are turned off to isolate the subsequent Verase in Plane1 from reaching Plane2 to protect the stored nLC data and LV DB and SCR for protection. c) Both Plane1 and Plane2 are under a full-block erase operation, no need to store page data in the DCRs of Plane1 and Plane2 because there are no border WLs cells are affected. d) Both Plane1 and Plane2 under partial-block erase, this still can be done but a pre-read and storing of border WLs cells of non selected, erased partial blocks are not saved. In this case, the border WLs of the selected partial-block can not be really erased by applying 0V. Instead, Verase/2 or Verase-5V is applied so that the nLC data stored in two border WLs of non-selected partial-blocks would be highly protected.

The peripheral circuits in the 2D/3D NAND chip include various decoders such as block decoder (50), LG-decoder (52), LGps-decoder (54), CSL-decoder (53) and the size-reduced LV DB (30) and LV SCR (32). The block decoders (50) with a Latch is coupled to a HV & MHV pump generator (60) via a plurality of global bus lines circuit 55 and coupled to an Address Register with pre-decoded address information for selecting WLs, blocks, and LGs to allow the predetermined bias voltages such as Vpgm, Vpass, or $V_{READ}$, or Verase to be loaded and latched to selected WLs, blocks, and LGs for performing J-page concurrent nLC ABL program, ABL program-verify, ABL read and ABL erase-verify, partial-block-erase and erase-verify operations on each 2D/3D NAND plane of 10a or 10b. The LV DB (30) includes N/4-bit, 4 KB, multiplier (102), N/4-bit, 4 KB, program register buffer (PRB) (106) and N/4-bit, 4 KB, sense amplifier (SA) (104) and N/4-bit DAC Group (80) shared by 2 NAND planes.

Each of two 2D/3D ISO circuits 11a and 11b is a 20V ISO circuit utilized to isolate the 2D/3D NAND array's HV from damaging the LV DB during the erase operation of Plane1 and Plane2. The N/4-bit, 4 KB SCR (32) is to temporarily store the input and output 4 KB data. An I/O Buffers (90) is Byte-wise 8-bit I/Os. On-chip State-machine (70) is to control the regular nLC concurrent operation during normal Vdd and SLC operation during irregular or abnormal Vdd operation when unintended Vdd loss occurs.

The peripheral circuits in the 2D/3D NAND chip also includes a HV & MHV pump generator (60) which is a central HV pump circuit to generate Vpgm (20V), Verase (20V), Vpass (8-10V), $V_{READ}$ (4-6V) and Vinh (>7V) for all NAND operation-related voltages. A 2D/3D Y-dec circuit (34) is to decode 1-byte at a time between 8 KB SCR 32 and 1-byte I/O Buffer 90. A 2D/3D Y-pass3 circuit (33) is used to connect the Byte-wise I/Os to the 4 KB page-wise PRB or SCR.

One significant feature of this 2D/3D hierarchical NAND array is that the sizes of DB and SCR are reduced to only N/4-bit, which is ¼ of one full N-bit WLs but still provides a desired J-page ABL nLC program and a J-page N/2-bit Odd or Even read and verify. Each N/4-bit DB comprises N/4-bit Multiplier (102), N/4-bit SA (104), N/4-bit PRB (106), and N/4-bit DAC group (80). Each Multiplier is used to amplify each sensed analog signal of Vinh or Vss from each nLC cell. Each SA is used to amplify each sensed analog signal to a full digital signal. Each PRB is used to store the digital program and read data after amplification, while DAC group is used to generate $2^n$ $V_{LBL}$ voltages for nLC program or $2^n$ $V_{SL}$ voltages for the SL-based Vt compensation of the 2D/3D hierarchical NAND array with LSL and LBL being laid out in parallel of the present invention (as one embodiment of the 2D/3D NAND strings).

In addition, this preferred 2D/3D hierarchical NAND array allows a full or random-sized partial block erase and the random WL program operations in every selected block.

More details of each 2D/3D NAND plane circuit will be further explained in FIGS. 3A-3G below.

Figure 3A:
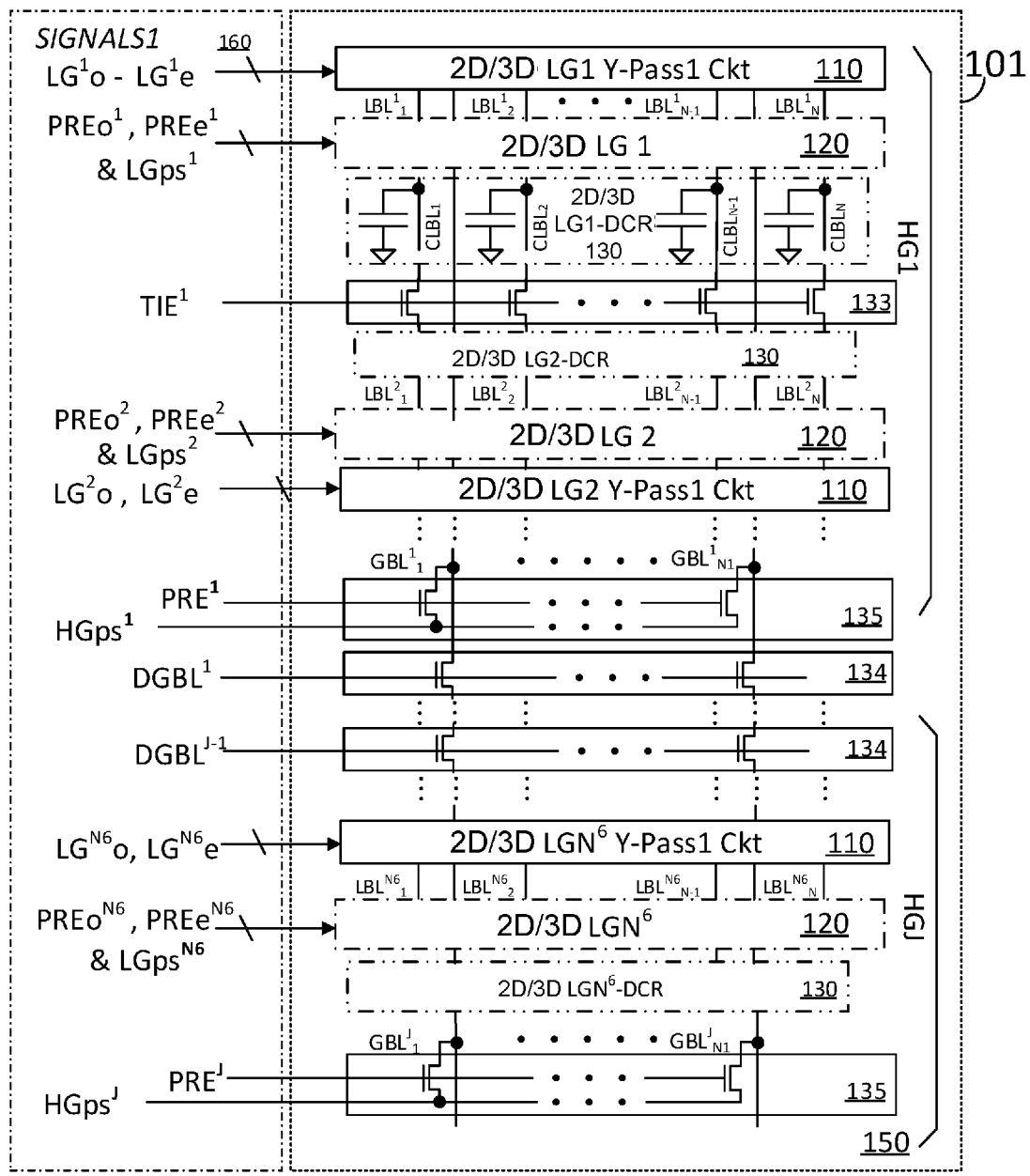
FIG. 3A is a simplified circuit diagram of J 2D/3D HG groups with broken GBL in a 2D/3D NAND plane shown in FIG. 2.

FIG. 3A is a simplified circuit diagram of J 2D/3D HG groups with broken GBL in a 2D/3D NAND plane shown in FIG. 2. As shown, it is a portion of one universal 2D/3D NAND array (101) that preferably includes J 2D/3D HGs (110) being connected by J−1 broken $N^1$ GBLs. Each 2D/3D HG group comprises $N^6/2$ pairs of 2D/3D LGs (120) (such as a pair of LG1 and LG2, to a pair of $LGN^6-1$ and $LGN^6$) respectively connected by one of $N^6/2$ rows of TIE NMOS devices. Each 2D/3D LG further comprises a 2D/3D Y-pass1 circuit (110) for connecting N LBLs with $N^1$ GBLs and a LG precharge-circuit (120) controlled by $N^1$ PREo and $N^1$ PREe gate signals with all N source nodes being connected to one common LGps line between two adjacent 2D/3D LGs.

The function of each 2D/3D LG (120) includes one page of N-bit DRAM-based CACHE registers (DCRs) using each LBL as a 1-bit DRAM-like cell capacitor $C_{LBL}$. Totally, there are $N^6$ N-bit DRAM CACHE registers being formed within each 2D/3D NAND array. Each CACHE is used to store $N^1$-bit $V_{LBL}$ voltages for ½-page of nLC N-bit program data.

Each long GBL metal is being divided into J broken GBL lines by J−1 GBL-divided row circuit (134) with gate control of DGBL. During each read operation, N/2 or $N^1$ bits Odd/Even cells in N/2 or $N^1$ LBL lines are sensed by corresponding SAs with N/2 or $N^1$ bits Even/Odd metal lines being held at fixed voltage to provent LBL-LBL AC coupling effect.

Each 2D/3D HG (150) can also be formed with one common HGps line connected to $N^1$ GBL lines as one HGps line in each 2D/3D LG (120). Each 2D/3D LG (120) is further divided into H 2D/3D NAND blocks (127) in LBL direction, where H=4 in an example. All H 2D/3D blocks within each 2D/3D LG are connected by N=16 KB LBLs such as $LBL^1_1$ to $LBL^1_N$ at M1-level that form one page of N-bit or $2N^1$-bit DCRs comprising N=16 KB $C_{LBL}$ capacitors such as $C_{LBL_1}$ to $C_{LBL_N}$, and $N^1$=8 KB broken GBLs at M2-level, where $N=2N^1$=16 KB for each physical nLC 2D WL. Both LGps and HGps lines are used to allow the precharge respective N LBL lines and N1 GBLs lines from locally selected LGs or HGs, rather from the Page Buffer to save power-consumption and multiple page concurrent read and program operations of the 2D/3D hierarchical NAND array.

Figure 3B:
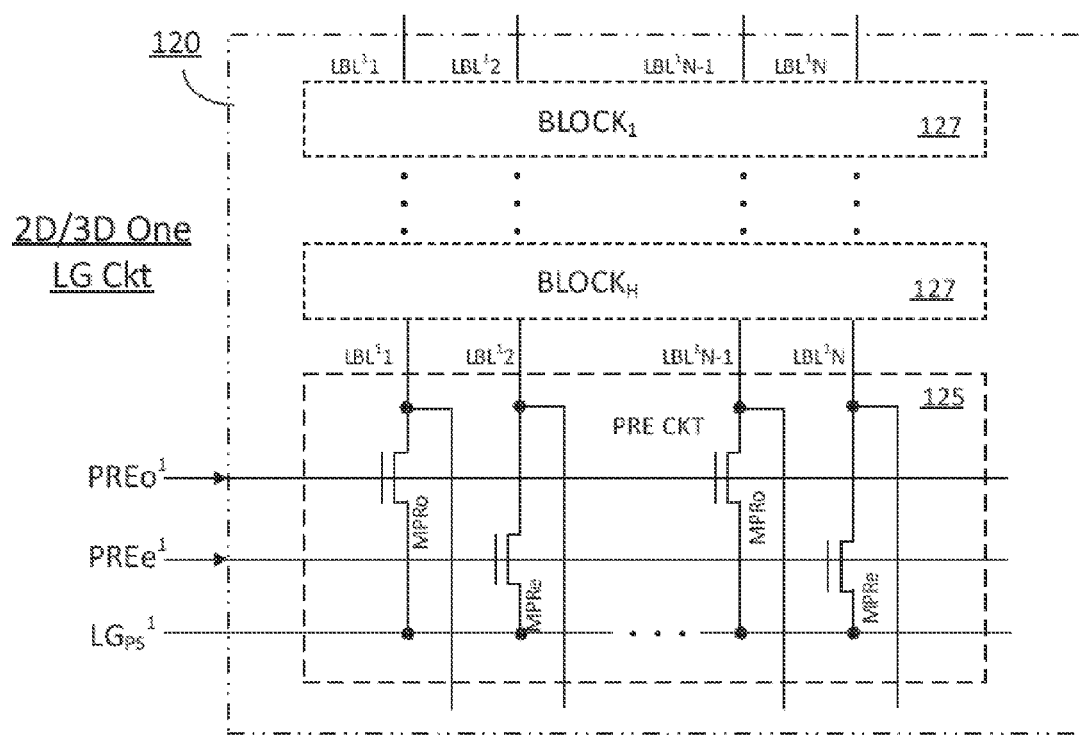
FIG. 3B is a simplified diagram of a LG group in a 2D/3D hierarchical NAND array having each LBL connected to an independent power line LGps via a precharge device according to an embodiment of the present invention.

FIG. 3B is a simplified diagram of a LG group in a 2D/3D hierarchical NAND array having each LBL connected to an independent power line LGps via a precharge device according to an embodiment of the present invention. This LG group circuit comprises H NAND blocks (127) and one dedicated $N^1$-bit Odd and $N^1$-bit Even LBL precharge and discharge circuit (125) with a single power supply connected to one 2D LGps through $N^1$-bit precharge and discharge NMOS MHV devices of MPRo and MPRe with their common gates being coupled to two corresponding signals of $PREo^1$ and $PREe^1$. In this example, $2N^1$-bit means N-bit or 16 KB and H=4.

Figure 3C:
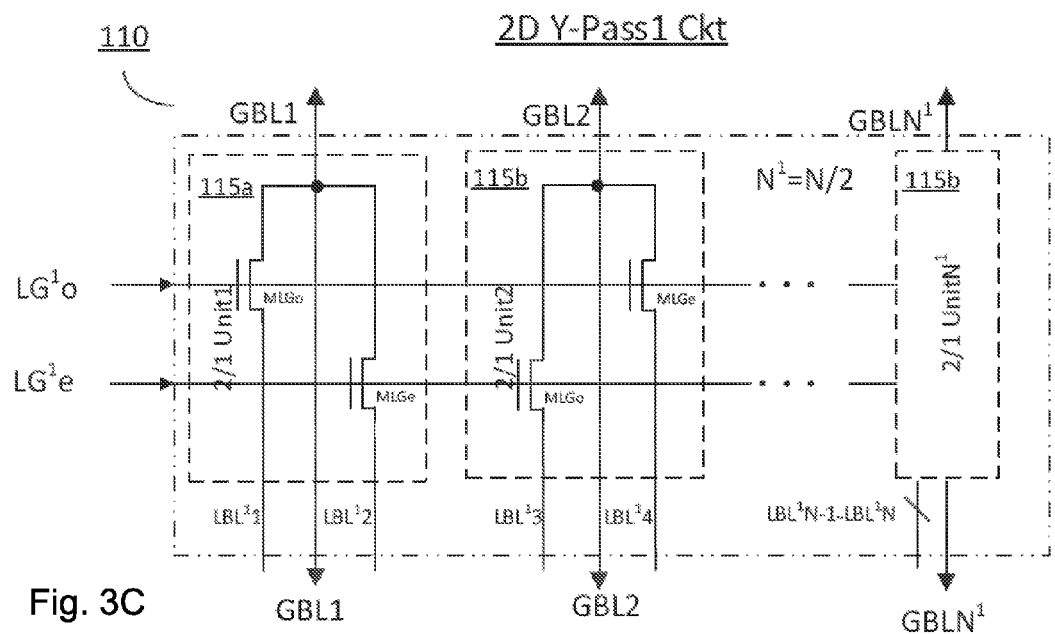
FIG. 3C is a simplified diagram of a LG Y-Pass circuit connecting GBLs to LBLs in a 2D hierarchical NAND array according to an embodiment of the present invention.

FIG. 3C is a simplified diagram of a LG Y-Pass circuit connecting GBLs to LBLs in 2D hierarchical NAND array according to an embodiment of the present invention. In this example, each 2D LG Y-Pass1 circuit comprises $N^1$ 2/1-units and each 2/1-unit comprises one pair of Odd and Even 2D NMOS devices MLGo and MLGe forming two rows of Y-pass1 $N^1$ LV NMOS transistors. MLGo device has its gate connected to $LG^1o$ and its source connected to one M1 Odd LBL. MLGe device has its gate connected to $LG^1e$ and its source connected to another interleaved M1 Even LBL. The $N^1$ common drain nodes of each pair of MLGo and MLGe devices such as $LBL^1 1$ and $LBL^1 2, \ldots, LBL^1 N-1$ and $LBL^1 N$, are respectively connected together to $N^1$ M2 GBLs such as GBL1 to $GBLN^1$. The loose layout pitch of M2 GBLs is twice of tight pitch of M1 LBLs, thus GBL layout is less critical than each tight LBL. Every paired M1 LBLo and M1 LBLe lines are connected to one M2 GBL line.

Figure 3D:
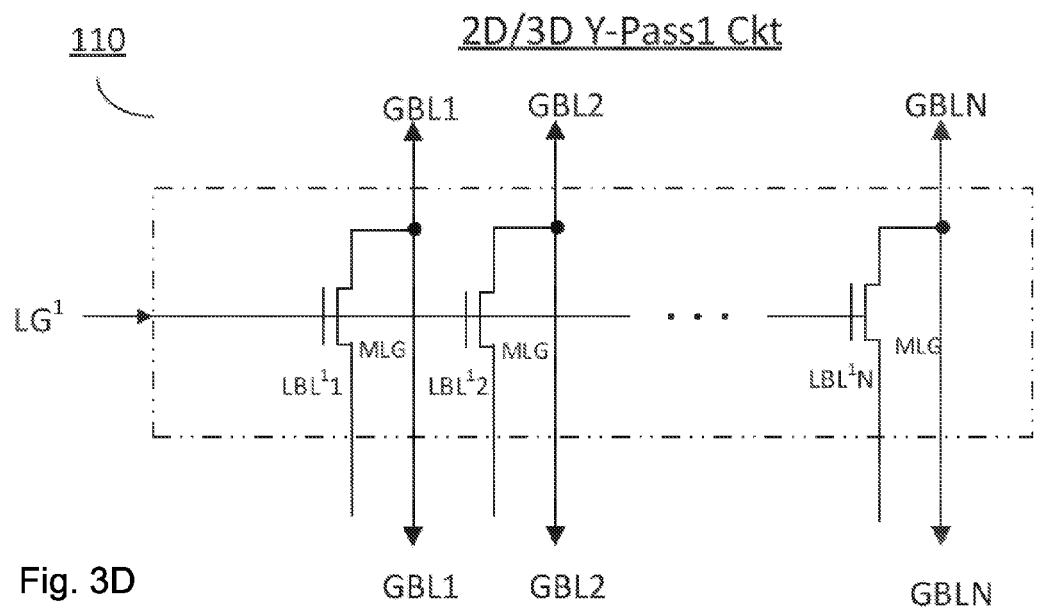
FIG. 3D is a simplified diagram of a LG Y-Pass circuit connecting GBLs to LBLs in a 2D/3D hierarchical NAND array according to an embodiment of the present invention.

FIG. 3D is a simplified diagram of a LG Y-Pass circuit connecting GBLs to LBLs in 2D/3D hierarchical NAND array according to an embodiment of the present invention. In this example, each 2D/3D LG Y-Pass1 circuit comprises one page of N-bit NMOS 2D/3D devices such as MLG with its gate being connected to one $LG^1$ and N source nodes are connected to N M1 Odd LBLs such as $LBL^1 1$, $LBL^1 2$, to $LBL^1 N$ and N drain nodes are connected to N M2-level GBLs such as GBL1 to GBLN of the present invention. In other words, GBL//LBL. The layout pitch of each 3D GBL is same as each 3D LBL pitch with same layout design rule and MHV is defined as MHV>7V, which is defined by the BVDS of MG and MS of string select NMOS devices.

Figure 3E:
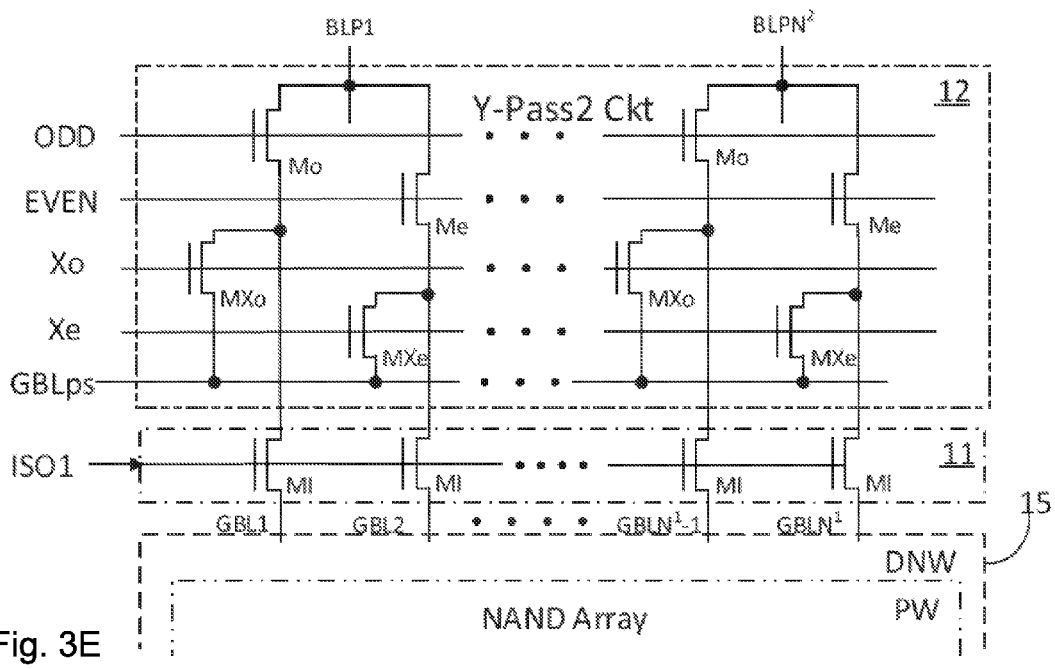
FIG. 3E is a simplified diagram of a LV Y-Pass circuit coupled to a HV ISO circuit connecting GBLs to N/4-bit data buffer in a 2D hierarchical NAND array according to an embodiment of the present invention.

FIG. 3E is a simplified diagram of a LV Y-Pass circuit coupled to a HV ISO circuit connecting GBLs to N/4-bit data buffer in 2D hierarchical NAND array according to an embodiment of the present invention. As shown, one 2D LV Y-Pass2 circuit (12) and one 2D HV ISO circuit (11) are physically placed between a 2D NAND array (15) formed on a 2D TPW within a 2D DNW on top of 2D P-substrate and a N/4-bit DR (not shown). The LV Y-Pass2 circuit (12) comprises two rows of Y-pass N/4 LV 2D NMOS transistors formed on top of P-substrate. One row of N/4 Odd transistors of NMOS Mo with N/4 gates being connected to one common control signal of ODD. Similarly, One row of N/4 Even transistors of NMOS Me with N/4 gates being connected to one common control signal of EVEN. The total $N^1 = \frac{1}{2}N$ common source nodes of $N^2 = \frac{1}{2}N^1$ pairs of Odd/Even transistors MXo/MXe are connected to one common GBLps power supply line laid out at M0 level in X-direction with control gates respectively being connected to Xo and Xe. Furthermore, one paired of GBL lines are connected to one BLP line through one paired HV ISO devices and one paired MXo and MXe LV NMOS devices. Total N M1-level LBLs are connected to $N^1$ M2-level GBL lines and further connected to $N^2$ BLP lines such as BLP1 to $BLPN^2$ through $N^1$ ISO HV devices of MI. The ISO circuit comprises $N^1$ 20V NMOS devices of MI with their common gates being tied to one ISO1. Since $N^1 = N/2$ in this example, thus $N^1$ 20V MI devices are saved.

Figure 3F:
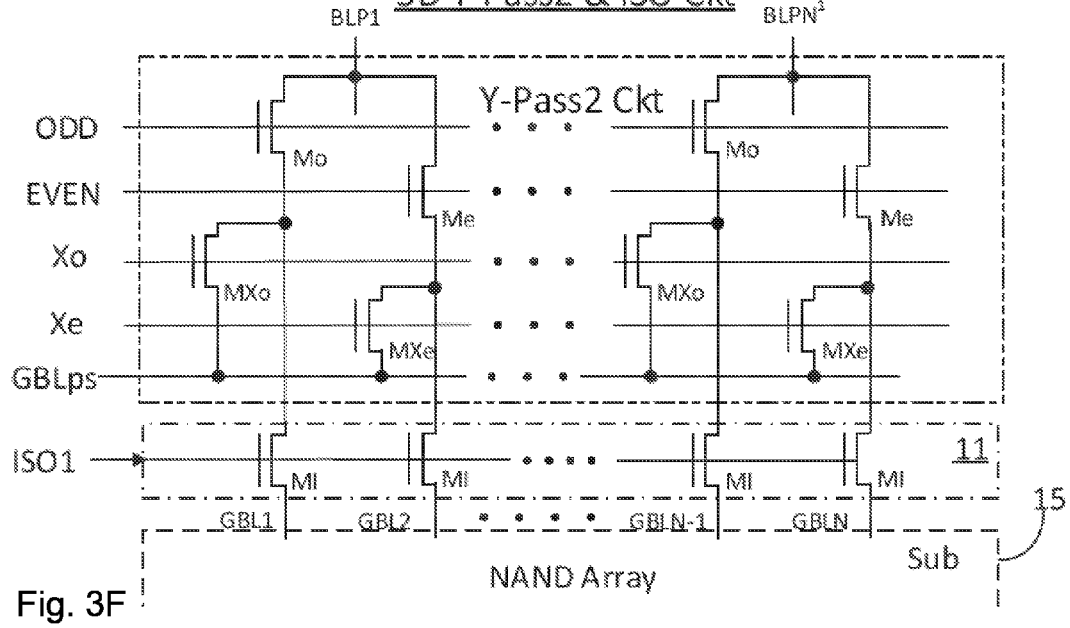
FIG. 3F is a simplified diagram of a LV Y-Pass circuit coupled to a HV ISO circuit connecting GBLs to N/2-bit data buffer in a 3D hierarchical NAND array according to an embodiment of the present invention.

FIG. 3F is a simplified diagram of a LV Y-Pass circuit coupled to a HV ISO circuit connecting GBLs to N/2-bit data buffer in 3D hierarchical NAND array according to an embodiment of the present invention. As shown, the LV Y-pass2 circuit along with the HV ISO circuit is a peripheral interface circuit between a 3D hierarchical NAND array and a LV Page Buffer. Here the 3D HV ISO circuit (11) comprises a plurality of N HV NMOS devices MI having its common gate tied to ISO1 signal formed outside the NAND array's bulk region. The N individual source nodes of N MI devices are respectively connected to N M1-level GBL metal lines in parallel (such as GBL1 to GBLN). Furthermore, the N drain nodes of N MI devices are divided into interleavingly N/2 Odd group and N/2 Even group respectively connected to the LV Y-pass2 circuit.

The LV Y-Pass2 circuit is an interface circuit between the HV ISO circuit (11) and a PB (not shown). N/2 Odd drain lines of Odd MI devices are respectively connected N/2 source nodes of LV Odd Mo devices and N/2 drain nodes of LV Odd MXo devices. Similarly, N/2 Even drain lines of Even MI devices are respectively connected to N/2 Even source nodes of LV Even Me devices and N/2 drain nodes of LV Even MXe devices. The N/2 Odd MXo and N/2 Even MXe devices are connected to a common GBLps power line formed in parallel to WL and array CSL direction.

Further more, the common drain nodes of N/2 Mo devices and N/2 Me devices are connected to $N^1 = N/2$ BLP lines from LBL1 to $BLPN^1$ and then to the LV PB.

Figure 3G:
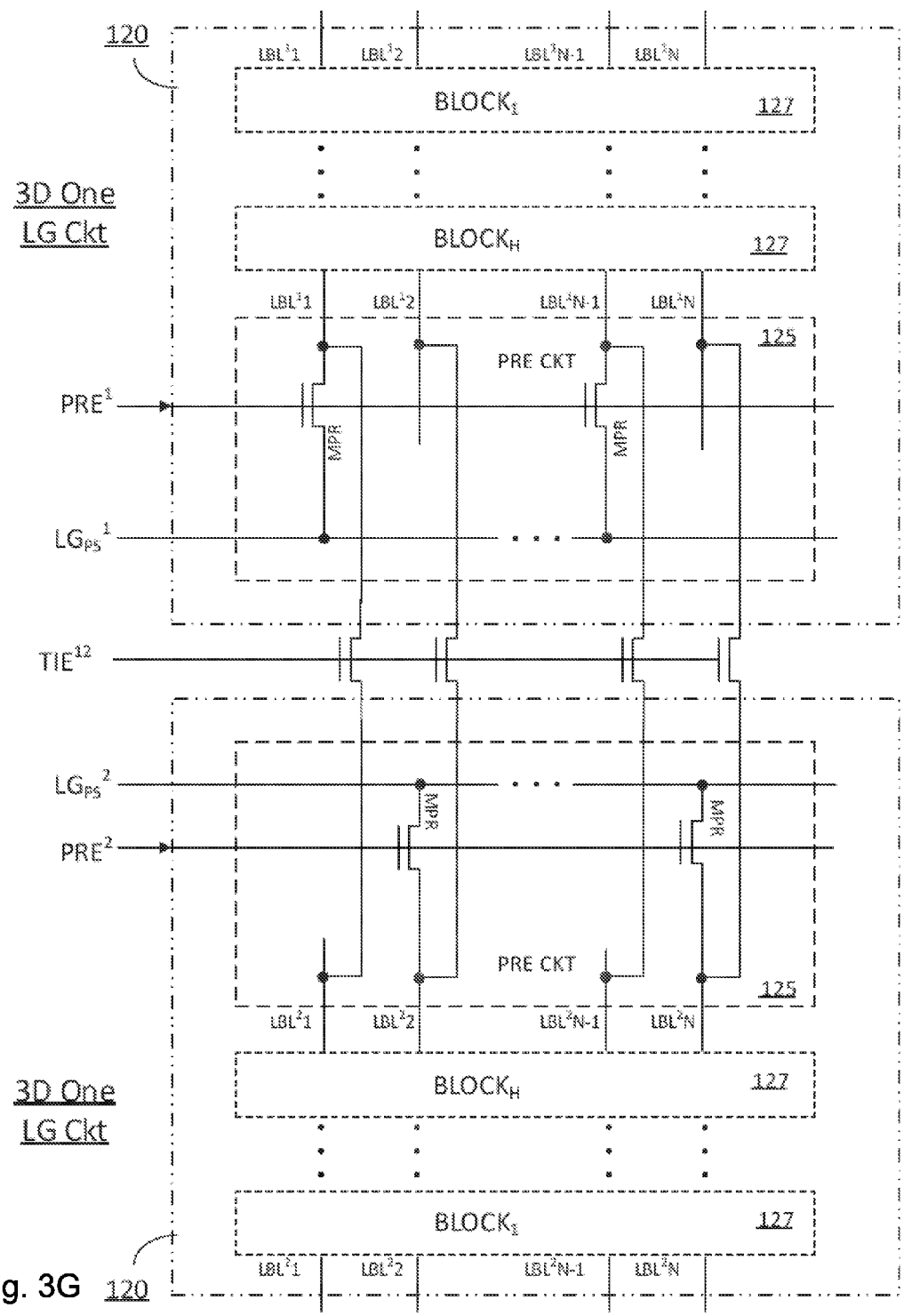
FIG. 3G is a simplified circuit diagram of two LG groups divided by a row of HV 3D ISO circuit for 3D hierarchical NAND arrays of the present invention.

FIG. 3G is a simplified circuit diagram of two LG groups divided by a row of HV 3D ISO circuit for 3D hierarchical NAND arrays of the present invention. As shown, each 3D LG1/LG2 circuit (120) includes H 3D NAND blocks such as 3D BLOCK1 to 3D BLOCKH connected to one horizontal power line of LGps1/LGps2, and a PRE circuit made by a row of N/2 3D Odd/Even MPR NMOS devices. All N drain nodes of H 3D Blocks are respectively connected by N 3D LBLs in parallel such as $LBL^1 1$ to $LBL^1 N$ in 3D LG1 and all N drain nodes of N HV TIE NMOS devices with N gates being connected to $TIE^{12}$ as a common gate line of N/2 Odd NMOS MPR devices.

Each LBL line associated with LG1/LG2 forms a $C_{LBL}$ capacitor used to store 1-bit digital program data with 2 $V_{LBL}$s of Vdd/Vss or analog data with 4 MLC analog $V_{LBL}$s or 8 TLC Analog $V_{LBL}$s. Each individual LGps line is used as one local $C_{LBL}$ precharge line within each 3D LG before each read operation. The N/2 Odd $C_{LBL}$ voltage precharging in LG1 is via the Odd PRE circuit though N/2 3D Odd MPR devices with common gate controlled by PRE¹ signal. By contrast, the N/2 Even $C_{LBL}$ voltage precharging in LG2 is via the Even PRE circuit though N/2 3D Even MPR devices with common gate controlled by $PRE^2$ signal. During each read operation, the PRE circuit is turned off after $C_{LBL}$ precharge to prevent $V_{LBL}$ leakage to LGps line.

Figure 4:
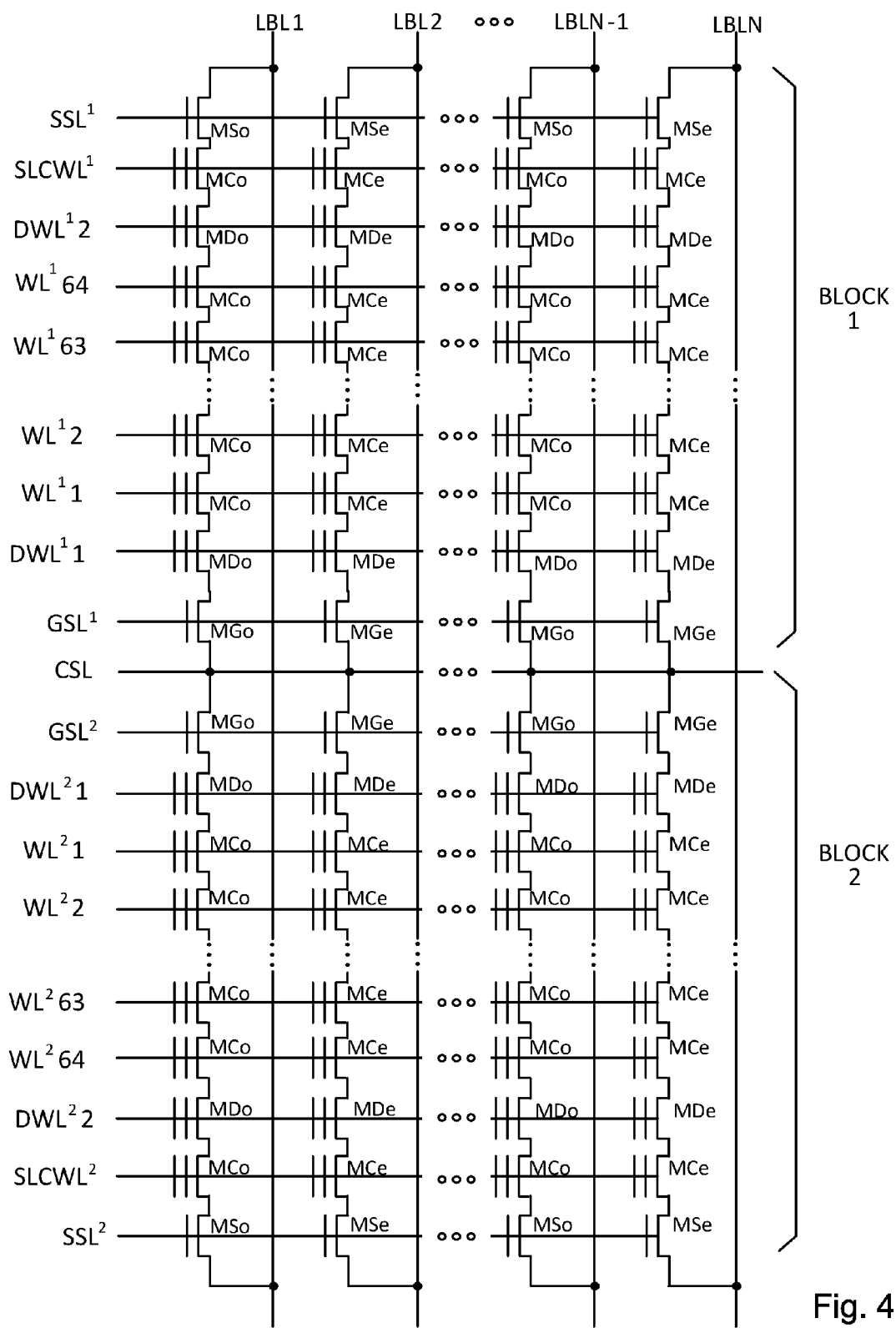
FIG. 4 shows a circuit of two adjacent 2D NAND blocks with N LBLs sharing one common sourceline CSL within one LG group of a 2D hierarchical NAND array according to an embodiment of the present invention.

FIG. 4 shows two 2D NAND block circuits within one LG group of a 2D hierarchical NAND array according to an embodiment of the present invention. As shown, one pair of physically adjacent 2D NAND blocks shares one horizontal CSL line. Each block includes N low-level N LBLs connecting N 2D NAND strings within one of plurality of 2D LGs of each corresponding HG of this preferred hierarchical 2D NAND array of the present invention. The top-level $N^1$ GBL metal lines are not shown. Each NAND string further comprises one SSLline, one SLCWL, 64 WLs, two dummy WLs (DWL1 and DWL2), one GSL and one CSL line. Typical maximum number of WLs in a 3D NAND array is 48 but in a 2D NAND array is more than 100. The single SLC WL per string is pre-erased ready to quickly store either SLC data transferred from the external DRAM chip or on-chip one-page SLC program data once the unexpected system Vdd power failure is being detected. The SLC WL is optionally inserted between SSL and DWL2, thus its SLC program would not disturb the normal NAND cells data stored in regular WLs.

The block structure shown in FIG. 4 has the shortest string length associated with the smallest 2D NAND string size. In this example, each 2D block comprises 64 WLs such as WL1 to WL64 from string bottom to string top, two dummy WLs, DWL2 at top and DWL1 at bottom, and one SLCWL placed between each DWL2 and string-select SSL line on top, and one GSL line acting as the string source select line in X-direction or WL direction. All N drain nodes of N NAND strings in one 2D NAND block are respectively connected to N LBLs, LBL1 to LBLN, at M1 level in Y-direction or BL direction, while all N source nodes of the N NAND strings are connected to one common CSL line laid out at M0 level in WL direction or X direction. This corresponds a case of 2D regular NAND array associated with (GBL//LBL)⊥(CSL//LGps).

In an embodiment, both nLC program and read operations are preferably performed on an ABL-like manner under the 2D/3D hierarchical NAND array of this invention. Unlike conventional ABL program and Odd/Even BL program, the so-called ABL-like program is to perform nLC iterative program and program-verify in a rotational manner between two groups of cells associated with Odd N/2 LBLs and cells associated with N/2 Even LBLs. In conventional N/2-bit Even/Odd program and program-verify scheme, the N/2-bit Even/Odd cells' program operations can only be performed after full iterative program and program-verify operations are completed for N/2-bit Odd/Even cells. The drawback of this conventional Odd/Even program scheme is that N/2-bit Odd or N/2-bit Even will suffer WL-gate program disturb because Odd and Even cells are not completing program at the same time. But the ABL-like program and program-verify operations under the 2D/3D hierarchical NAND array of this invention can complete the program on N/2-bit Odd 2D/3D cells and N/2-bit Even 2D/3D cells in each WL substantially at the same time. Thereby, the least WL-gate program disturb with most reliable cell data reliability can be achieved.

Figure 5A:
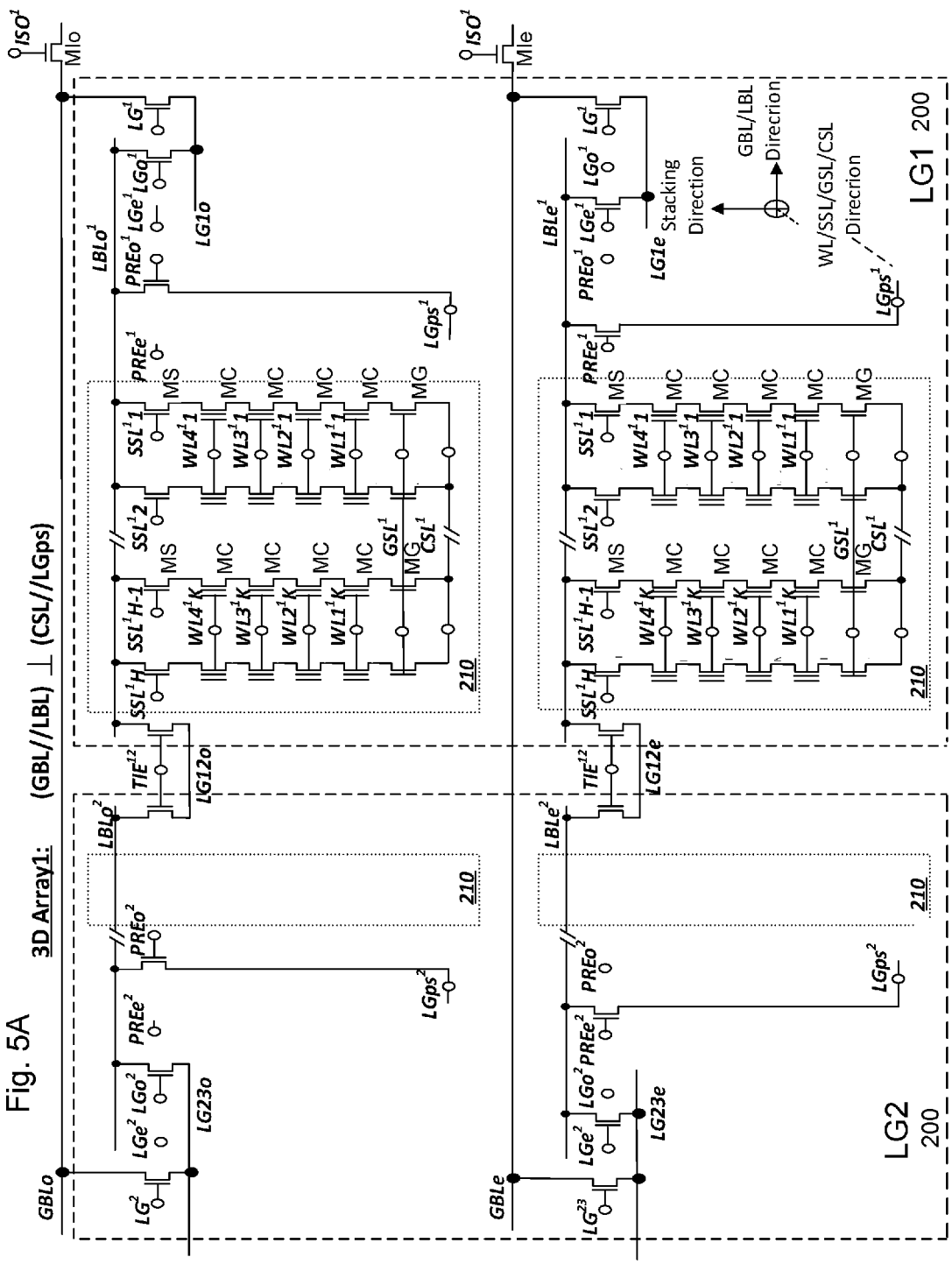
FIG. 5A shows a part of a 3D hierarchical NAND array according to an embodiment of the present invention.

FIG. 5A shows a portion of a 3D hierarchical NAND array according to an embodiment of the present invention. As shown, this 3D hierarchical NAND array, Array1, formed under the architecture of one NAND plane outlined in FIG. 2 including multiple 3D HG groups divided into multiple 3D LG groups respectively associated with a GBL metal line at top-level via a 3D GBL/LBL switch that comprises 3 3D NMOS devices controlled by 3 gate signals of LG, LGo, and LGe and coupled to a LBL metal line at lower (middle) level via a Precharge circuit configured for respective Odd and Even numbered LBLs associated with a independent power line LGps. Two 3D LG groups are paired via a row of TIE-signal controlled devices. Each 3D LG group further includes H blocks with two cross-section views shown in FIG. 5A, top part showing all devices associated with one Odd LBL (corresponding to Odd string) and bottom part showing all devices in the H blocks of the 3D LG group associated with one Even LBL (corresponding to Even string). In the cross-section view as shown in FIG. 5A, H 3D NAND strings of the H blocks are shown on one 3D NAND string per block basis, with their drain nodes being connected to one common middle-level LBL line via different string-select SSL-controlled 3D NMOS transistors and their source nodes being connected to one bottom-level common source line (CSL) via different string-select GSL-controlled NMOS transistors. Each 3D NAND string is formed with a series of 3D NAND cells sharing a common vertical bulk region vertically stacked in depth direction (of the wafer) or stacking direction as marked in FIG. 5A. The 3D NAND cell can be made of a 2-poly floating gate transistor or a 1-poly charge-trapping transistor. Optionally, each NAND cell is configured to perform nLC cell data erase via hole-electron annihilation through GIDL hot-hole injection from at least one of the two common gates of the pair of string-select devices into the vertical bulk region at floating state, where n=1 for SLC cell data with 2 threshold Vt states, n=2 for MLC cell data with 4 threshold Vt states, n=3, for TLC cell data with 8 threshold Vt states.

Furthermore, one end of each LBL is connected to each corresponding top-level GBL via a 3D GBL/LBL switch that comprises 3 3D NMOS devices controlled by 3 gate signals of LG, LGo, and LGe. The independent power line LGps is also a metal line laid at bottom-level and gated by a pair of precharge devices PREo and PREe respectively for odd and even strings. The other end of LBL (of 3D LG1 group) is connected to one 3D NMOS device with its gate being connected to TIE gate signal for connecting a neighboring LBL (of 3D LG2 group). All 3D non-string NMOS transistors are preferably formed at the same level of the 3D string-select transistors. All the above non-string devices associated with the 3D GBL/LBL switch, precharge devices, TIE device are formed near the middle level as the LBLs. The LGps line is laid in parallel to the CSL line at the lowest level below the GSL-controlled string-select devices of the 3D NAND strings.

As shown, the whole 3D NAND Array1 is configured with a (GBL//LBL) ⊥(CSL//LGps) metal line scheme, where GBL//LBL means that top-level GBL lines and the middle-level LBL lines are formed in parallel. Similarly, CSL//LGps means that the bottom-level CSL lines and LGps lines lines are formed in parallel. Lastly, both GBLs and LBLs are formed perpendicular to both CSL and LGps lines. Optionally, the numbers of GBLs and LBLs are formed to be identical.

In a specific embodiment, this 3D NAND strings include 3D NAND cells having their bulks being floated and isolated directly from the wafer's common Psubstrate. This type of 3D NAND cell uses GIDL-erase scheme to perform SL-side or BL-side full and partial block erase. The 1-sided LBL or 1-sided CSL or 2-sided LBL and CSL GIDL-based erase scheme can be used for erasing the selective full or partial 3D NAND blocks within multiple selected 3D LG groups, regardless 3D cell types of 2-poly floating-gate cell or 1-poly charge-trapping cell.

The detailed descriptions on 1-sides or 2-sided GIDL-based partial-block erase under 3D NAND Array1 of FIG. 5A are explained below in accordance with FIG. 9A of the present disclosure.

Embodiment (1)

1-sided LBL partial-block erase in the selected LG1 group. Referring to FIG. 5A, in order to perform the preferred partial block erase of 1-sided LBL GIDL erase on H 3D Odd strings (on top part of FIG. 5A) and H 3D Even strings (on bottom part of FIG. 5A), both $V_{LBLo}$ and $V_{LBLe}$ have to be coupled to one iterative Verase voltage along with one common Vsg voltage being coupled to all SSLs gate signals, $SSL^11$ to $SSL^1H$, of select-string devices to generate GIDL effect to inject hot-holes into the vertical bulk region associated with each 3D string. Here, Vsg voltage is a predetermined optimum voltage for inducing GIDL hot-holes in the vertical bulk region at floating state. Another string-select device of each string is at 0V. In other words, the bias conditions include a) $V_{LBLo}=V_{LBLe}$=Verase, where Verase=15V to 20V. b) $V_{SSL11}= \ldots =V_{SSL1H}$=Vsg. c) $V_{GSL11}$=Vss. d) CSL is set to either Vdd or Vss. e) In order to perform erase, for each selected (partial-block) WL for erase nLC data of the page of cells in selected LG1 group, the WL voltage is set to 0V. For unselected WLs in selected LG1 group, the WL biases are left at floating to prevent NAND erase of nLC data in corresponding pages.

Embodiment (2)

1-sided CSL partial-block erase in the selected LG1. On the contrary, in order to perform the preferred partial block erase from CSL side to generate GIDL effect for erasing on H 3D Odd strings and Even strings of Array1, only $V_{CSL}$ is coupled with one iterative Verase voltage along with one common gate $V_{GSL}$ of string-select devices being coupled with Vsg. Other bias conditions include $V_{LBLo}=V_{LBLe}$=Vdd or Vss. In order to perform erase, for each selected (partial-block) WL for erase nLC data of the page of cells in selected LG1 group, the WL voltage is set to 0V. For unselected WLs in selected LG1 group, the WL biases are left at floating to prevent NAND erase of nLC data in corresponding pages.

Embodiment (3)

2-sided LBL and CSL partial-block erase in the selected LG1 group. This operation is to combine above 1-sided LBL and 1-sided CSL erase so that GIDL-effect can be induced from both side of the vertical bulk region so that the erase operation can be performed faster than above 1-sided GIDL erase. The combinased bias conditions include: a) $V_{LBLo1}=V_{LBLe1}=V_{CSL}=$Verase, where Verase= 15V to 20V. b) String-select devices common gates: $V_{SSL11}=\ldots=V_{SSL1H}=V_{GSL11}=$Vsg. c) For each selected (partial-block) WL for erase nLC data of the page of cells in selected LG1 group, the WL voltage is set to 0V to erase the corresponding nLC data. For unselected WLs in selected LG1 group, the WL biases are left at floating to prevent NAND erase of nLC data in corresponding pages.

At the same time, for unselected 3D LG2 group all gate bias conditions are set 0V to be disconnected from GBLo and GBLe. For all above embodiments, the LBL voltage up to the Verase is obtained by coupling the LBL to one independent power line LGps1 to the Verase through two respective precharge devices with the following gate control conditions as following: $V_{PREo1} \geq$ Verase+Vt to fully pass Verase from LGps1 to LBLo1. $V_{PREe1} \geq$ Verase+Vt to fully pass Verase from LGps1 to LBLe1. LGo1 and LG1 are set to 0V to prevent $V_{LBLo1}$ from leaking to GBLo. LGe1=LG1 are set to 0V to prevent $V_{LBLe1}$ from leaking to GBLe. $V_{TIE12}=0$V to prevent $V_{LBLo1}$ from leaking to $V_{LBLo2}$ and $V_{LBLe1}$ from leaking to $V_{LBLe2}$. More detailed bias conditions for controlling TIE12, PREo1, PREe1, LGo1, LGe1, LG1, and ISO gate signals are set in accordance with FIG. 9A of the present disclosure.

Referred again to FIG. 5A, the plurality of 3D NAND strings (210) within the same 3D LGs (200) are connected to different SSL control lines but are connected to same GSL and CSL lines. Each 3D LG is connected to each corresponding HG via a 3D Y-pass circuit made by 3D NMOS devices with respective gates being connected to LG1, LG2, LGe, and LGo signals. The (BL) end of all HGs is connected to a LV Page Buffer (PB) with a row of 3D HV ISO devices (MIe and MIo) to protect the LV PB from being damaged by a HV erase voltage Verase applied in the 2D/3D AND array. In this 3D hierarchical NAND Array1, total three metals are used. The top metal is used for GBL broken metal lines. The middle metal is used for LBL segmented metal lines, while the bottom metal is used for the common CSL and LGps lines which are formed perpendicular to both LBL and GBL lines.

Figure 5B:
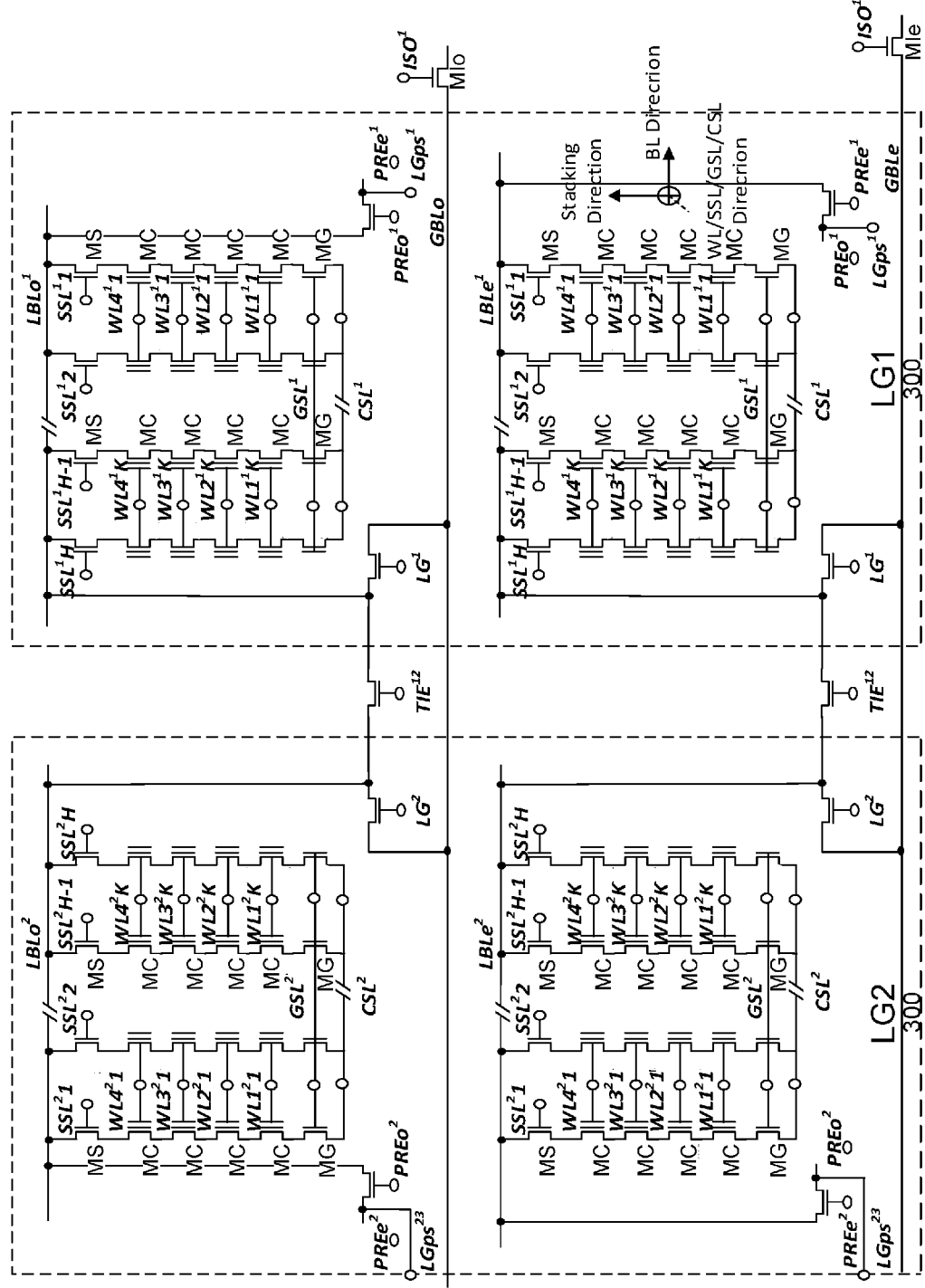
FIG. 5B shows a part of a 3D hierarchical NAND array according to another embodiment of the present invention.

FIG. 5B shows a portion of a 3D hierarchical NAND array according to another embodiment of the present invention. As shown, this 3D hierarchical NAND array, Array2, formed under the architecture outlined in FIG. 2 with multiple 3D HG groups divided into multiple 3D LG groups respectively associated with a GBL metal line at one-level and a LBL metal line at another level. Two 3D LGs are paired via a row of TIE-signal controlled devices. Each 3D LG group further comprises H blocks with two cross-section views shown in FIG. 5B, top part showing all devices associated with one Odd LBL (corresponding to Odd string) and bottom part showing all devices in the H blocks of the 3D LG associated with one Even LBL (corresponding to Even string). In the cross-section view as shown in FIG. 5A, H 3D NAND strings of the H blocks are shown on one string per block basis, with their drain nodes being connected to one common middle-level LBL line via different string-select SSL-controlled 3D NMOS transistors and their source nodes being connected to one bottom-level common source line (CSL) via different string-select GSL-controlled NMOS transistors. Each 3D NAND string is formed with a series of 3D NAND cells sharing a common vertical bulk region vertically stacked in depth direction (of the wafer) or stacking direction as marked in the FIG. 5B. The 3D NAND cell can be made of a 2-poly floating gate transistor or a 1-poly charge-trapping transistor. Optionally, each NAND cell is configured to perform nLC cell data erase via hole-electron annihilation through GIDL hot-hole injection from at least one of the two common gates of the pair of string-select devices into the vertical bulk region at floating state, where n=1 for SLC cell data with 2 threshold Vt states, n=2 for MLC cell data with 4 threshold Vt states, n=3, for TLC cell data with 8 threshold Vt states.

Optionally, one end of each LBL is connected to each corresponding GBL via a GBL/LBL switch that comprises 1 3D NMOS devices controlled by a LG gate signal. One independent power line LGps is also a metal line laid at an independent level and gated by a pair of precharge devices PREo and PREe respectively for odd and even strings to respectively couple with odd LBLo and even LBLe. The other end of LBL is also connected to one 3D NMOS device with its gate being connected to TIE gate signal and share the coupling point with the GBL/LBL switch. The whole 3D NAND Array2 is optionally formed by disposing the LBLs and associated 3D LG groups including all 3D NAND strings from one direction down into the stacking direction. All 3D non-string NMOS transistors including the GBL/LBL switch, precharge devices, TIE devices, GBLs and LGps lines, and block-decoders (not explicitly shown in FIG. 5B) are preferably formed from opposite direction by flipping the wafer substrate with their respective poly gate lines and GBL metal lines formed at the wafer substrate. GBL metals are disposed at the top level of 3D NAND Array1 in FIG. 5A. But in Array2 of FIG. 5B, the LBLs are at the top level and GBLs are formed at the bottom-level (or top at another side of the wafer substrate). Thus the associated devices of LBL/GBL switch and their circuits can be implemented as 2D hierarchical NAND. The independent power line LGps is substantially laid at the same level as and in parallel to the CSL.

Still, the 3D transistors in the 3D NAND strings have their vertical bulk regions being floated and isolated directly from the wafer's common Psubstrate. This type of 3D NAND cell uses GIDL-erase scheme to perform SL-side or BL-side full and partial block erase. In a specific embodiment, the 1-sided LBL or 1-sided CSL or 2-sided LBL and CSL GIDL-based erase scheme can be used for erasing the selective full or partial 3D NAND blocks within multiple selected 3D LG groups, regardless 3D cell types of 2-poly floating-gate cell or 1-poly charge-trapping cell.

The detailed bias conditions for performing the 1-sided or 2-sided GIDL-based partial-block erase under 3D NAND Array2 of FIG. 5B are substantially similar to those shown for Array1 and are summarized in FIG. 9B of the present disclosure with an example of 1-sided LBL erase.

Figure 5C:
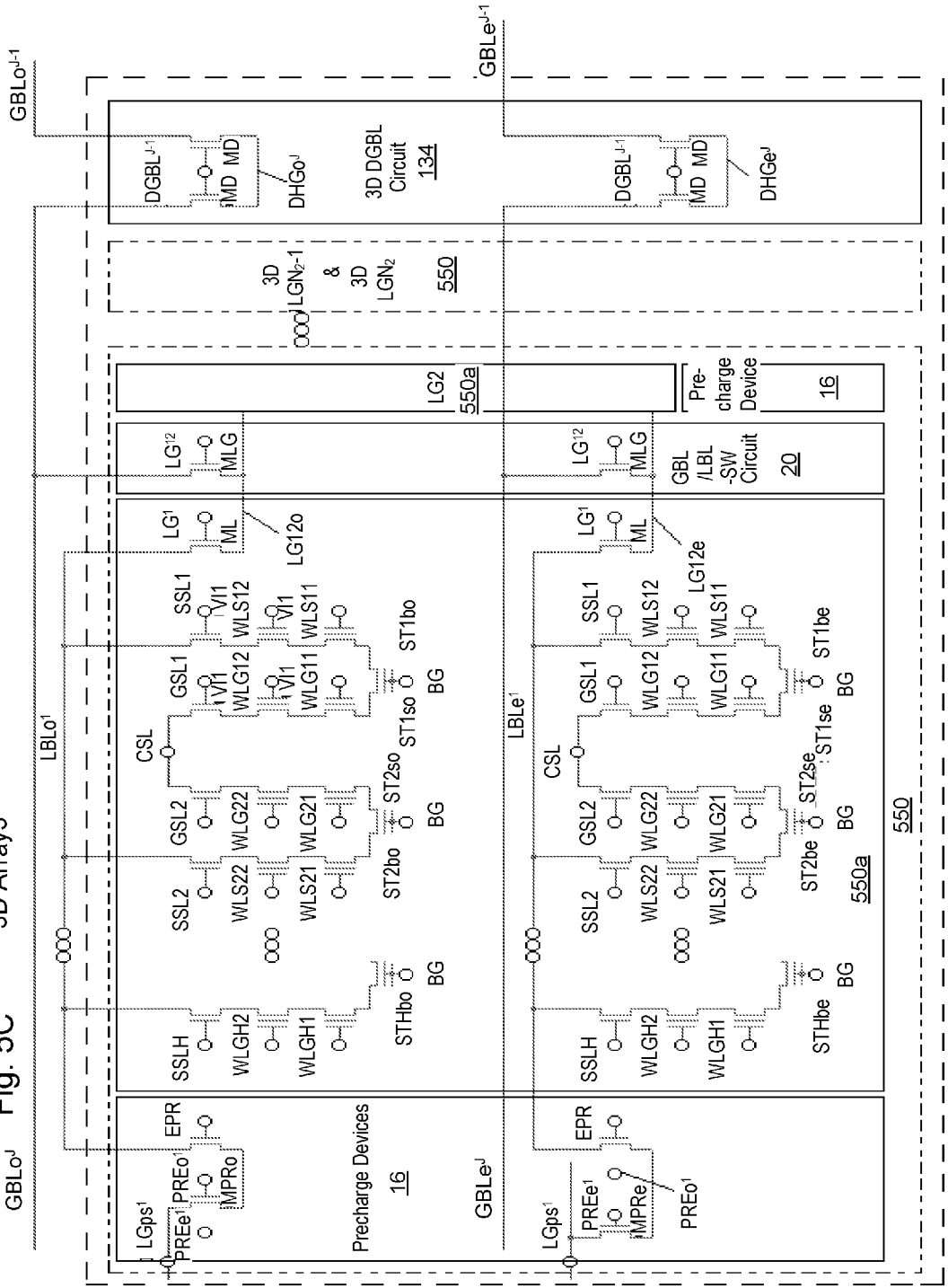
FIG. 5C shows a part of a 3D hierarchical NAND array according to yet another embodiment of the present invention.

FIG. 5C shows a portion of a 3D hierarchical NAND array according to yet another embodiment of the present invention. The 3D hierarchical NAND Array3 is substantially similarly constructed under the architecture of one plane outlined in FIG. 2 including multiple 3D HG groups divided, via a 3D DGBL circuit, into multiple 3D LG groups respectively associated with a broken GBL metal line at a top level and a LBL metal line at a middle level below the GBL in the stacking direction. As shown in a cross section view, each 3D LG further comprises H BiCS-based 3D NAND strings (belonging to H blocks respectively) with their H drain nodes being connected to one common middle-level LBL line via H different string-select SSL 3D NMOS transistors and H source nodes being connected to one common source line CSL via H string-select NMOS transistors with one common GSL control. Each BiCS-based 3D NAND string is formed as a U-shaped string with two partial strings respectively made by a series of 3D NAND cells laid in parallel to the stacking direction sharing a common vertical bulk region and joined at middle bottom level by a ST transistor gated by a BG signal. Because of the U-shape layout, both GSL and SSL signals on two common gates of the two string-select devices are located at a same upper level (yet still lower than LBL level). The CSL is laid below the LBL but above the poly line of GSL. The 3D NAND cell can be made of a 2-poly floating gate transistor or a 1-poly charge-trapping transistor. Optionally, each NAND cell is configured to perform nLC cell data erase via hole-electron annihilation through GIDL hot-hole injection from at least one of the two common gates of the pair of string-select devices into the vertical bulk region at floating state, where n=1 for SLC cell data with 2 threshold Vt states, n=2 for MLC cell data with 4 threshold Vt states, n=3, for TLC cell data with 8 threshold Vt states.

Furthermore, one end of each LBL is connected to each corresponding top-level GBL via a 3D GBL/LBL switch that comprises 2 3D NMOS devices controlled by 2 gate signals of LG1 and LG12. The other end of the LBL is connected to one independent power line LGps gated by a pair of PREo/e-controlled precharge devices and an EPR-controlled device at the same level as CSL. All 3D non-string NMOS transistors are preferably formed at the same level of the 3D string-select transistors. All 3D string NMOS transistors have their bulks being floated and not directly connected to the wafer's common Psubstrate. Therefore, these 3D NAND cells are still subjected to GIDL-erase scheme to perform CSL-side or LBL-side full and partial block erase, regardless of 2-poly floating-gate 3D cell or 1-poly charge-trapping 3D cell.

The whole 3D NAND Array3 is similarly configured with a (GBL//LBL)⊥(CSL//LGps) metal line scheme, where GBL//LBL means that top-level GBL lines and the center-level LBL lines are formed in parallel. Similarly, CSL//LGps means that the bottom-level CSL lines and LGps lines are formed in parallel. Lastly, both GBL and LBL are formed perpendicular to both CSL and LGps lines.

The detailed bias conditions for performing the 1-sided or 2-sided GIDL-based partial-block erase under 3D NAND Array3 of FIG. 5C are substantially similar to those shown for Array2 and are summarized in FIG. 9C of the present disclosure with an example of 1-sided CSL erase.

FIG. 5D shows a portion of a 3D hierarchical NAND array according to still another embodiment of the present invention. The 3D hierarchical NAND Array4 is substantially similarly to the Array3 shown in FIG. 5C with multiple 3D HG groups divided into multiple 3D LG groups (containing H BiCS-like 3D Ustrings NAND blocks) respectively associated with a GBL metal line at one-level and a LBL metal line at another level below the GBLs in the cell-stacking direction. For simplicity, only one paired 3D LG1 group and 3D LG2 group associated with only two GBL lines, GBLo1 and GBLe1, and two LBLs, LBLo1 and LBLe1, and their related devices and H BiCS-like 3D Ustrings NAND blocks are shown. As shown in the cross-section view of FIG. 5D, each 3D LG group further comprises H 3D BiCS-like NAND strings (belonging to H blocks respectively) with their H drain nodes being connected to one common middle-level LBL line via H different string-select SSL 3D NMOS transistors and H source nodes being connected to CSL line via H string-select NMOS transistors with one common GSL control. Each BiCS-like string is a U-shape string formed with two vertical partial strings bended in a U-shape. Because of the U-shape layout, both GSL and SSL signals on two common gates of the two string-select devices are located at a same upper level (yet still lower than LBL level). The CSL is laid below the LBL but above the poly line of GSL. Each partial string of the U-shaped string includes a series of 3D NAND cells vertically stacked in the stacking direction having a common vertical bulk region directly coupled to the common source line but still isolated from the chip's Psubstrate. A ST transistor gated by a BG signal is disposed at middle bottom level to join the two partial strings.

The common vertical bulk region of each BiCS-like string is directly connected to the common source line can be biased to HV, instead of being left floating in Array1, Array2, and Array3, such as Verase for utilizing a FN-tunneling scheme to perform erase operation on full or partial block WLs selected from each block in each selected 3D LG group. The 3D NAND cell in the BiCS-like string can be made of a 2-poly floating gate transistor or a 1-poly charge-trapping transistor. Optionally, each NAND cell is configured to perform nLC cell data erase by removing trapped electrons into the vertical bulk region at HV state, where n=1 for SLC cell data with 2 threshold Vt states, n=2 for MLC cell data with 4 threshold Vt states, n=3, for TLC cell data with 8 threshold Vt states.

Furthermore, one end of each LBL is connected to each corresponding top-level GBL via a 3D GBL/LBL switch that comprises 2 3D NMOS devices controlled by 2 gate signals of LG1 and LG12. The other end of the LBL is connected to one independent power line LGps gated a pair of PREo/e-controlled precharge devices and an EPR-controlled device at the same level of CSL and in parallel to the CSL. All 3D non-string NMOS transistors are preferably formed at the same level of the 3D string-select transistors.

The detailed bias conditions for the FN-channel erase of partial or full block of Array4 are shown below in accordance with FIG. 9D of the present disclosure. In order to perform the preferred partial or full block erase on LG1's H vertical 3D Odd and Even U-shaped strings of Array4, only CSL is coupled to an iterative Verase (supplied from an independent CSL voltage generator, which is not shown) and rest of nodes in the selected 3D U-shaped strings have to be left floating to operate 3D NAND strings and array. The control over all string-select common gate signals SSL1, . . . , SSLH and GSL1, . . . , GSLH per each selected 3D LG group, and voltages at LBLo1 and LBLe1 associated with this LG group are not required.

In particular, $V_{CSL1}$=Verase are applied to all CSLs for the selected blocks. Thus, both N+ source nodes and Psubstrate nodes of all selected 3D GSL NMOS transistors of all selected 3D U-shaped strings in the LG1 group are coupled to the iterative Verase voltage (stepwise ramping up to ~20V). As a result, the common bulk region of the selected 3D cells in the selected 3D U-shaped strings in the LG1 group are coupled to the Verase voltage to allow that the preferred FN-tunneling erase can be selectively performed the same way as the 2D NAND array, where the iterative Verase voltage can be in a range from 15V to 20V. For non-selected blocks all CSLs are left floating. All LBLs are left floating to avoid gate breakdown. SSL, GSL, LGps, PRE signals are all left floating. For each selected (partial-block) WL for erase nLC data of the page of cells in selected LG1 group, the WL voltage is set to 0V to erase the corresponding nLC data. For unselected WLs in selected LG1 group, the WL biases are left at floating to prevent NAND erase of nLC data in corresponding pages. Note, the erase is performed on per-LG base, therefore, a concurrent partial and full 3D blocks erase in the selected 3D LGs while other operations like nLC program, program-verify, and read are being performed in other LGs can be achieved.

FIG. 5E shows a portion of a 3D hierarchical NAND array according to yet still another embodiment of the present invention. The 3D hierarchical NAND Array5 is substantially similarly to the Array2 shown in FIG. 5B with multiple 3D HG groups divided into multiple 3D LG groups respectively associated with a GBL metal line at one level and a LBL metal line at another level below the GBLs in the cell-stacking direction. For simplicity, only one paired 3D LG1 group and 3D LG2 group associated with only two GBLs, GBLo1 and 3D GBLe1, and two LBLs, LBLo1 and 3D LBLe1, and their related devices and H vertical 3D NAND blocks are shown. As shown in the cross-section view of FIG. 5D, LG1 group and LG2 group is tied by a TIE device at bottom level. each 3D LG groups (LG1 or LG2) further comprises H 3D vertical NAND strings (belonging to H blocks respectively) with their H drain nodes being connected to one common middle-level LBL line via H different string-select SSL 3D NMOS transistors and H source nodes being connected to one CSL line laid also at the bottom level via H string-select NMOS transistors with one common GSL control. Each 3D NAND string includes a series of 3D NAND cells stacked in the stacking direction sharing a vertical bulk region directly coupled to the common source line formed on the chip's Psubstrate. GSL signal lines are located near the bottom level CSL lines and SSL signal lines are substantially located near the LBLs.

The common vertical bulk region of each 3D NAND string is directly connected to a common Psubstrate. Optionally, the common Psubstrate is associated to each 3D NAND plane. The whole chip of the 3D hierarchical NAND array can include at least two 3D NAND planes having respective Psubstrates that can be isolated from each other. This allows multiple concurrent NAND operations to be performed within one selected plane independent from the other plane. Unlike Array4 having all bulk regions of strings being isolated from the Psubstrate, now the bulk region can be biased via the common Psubstrate to HV such as Verase for utilizing a FN-tunneling scheme to perform erase operation on full or partial block WLs selected from each block in each selected 3D LG group. The 3D NAND cell in the 3D NAND string can be made of a 2-poly floating gate transistor or a 1-poly charge-trapping transistor. Optionally, each NAND cell is configured to perform nLC cell data erase by absorbing trapped electrons into the vertical bulk region at HV state, where n=1 for SLC cell data with 2 threshold Vt states, n=2 for MLC cell data with 4 threshold Vt states, n=3, for TLC cell data with 8 threshold Vt states.

Furthermore, one end of each LBL is connected to each corresponding top-level GBL via a 3D GBL/LBL switch that comprises a 3D NMOS device controlled by a gate signal of LG1. The other end of the LBL is connected to one independent power line LGps gated a pair of PREo/e-controlled precharge devices. LGps line is laid at the same bottom level of CSL and in parallel to the CSL. The CSL is formed on the Psubstrate and respectively coupled to the vertical bulk regions of the 3D NAND strings.

Under the condition that the vertical bulk region of each 3D NAND string of the 3D hierarchical Array5 is directly connected to the common Psubstrate of the wafer via each 3D NAND string's CSL node, thus the Array5 can only use FN-tunneling-erase scheme by biasing the Psubstrate to Verase which further couples the Verase to the bulk region. In other words, FN-tunneling erase can be adopted for erasing the full or partial block WLs of a selected block within multiple selected 3D LG groups such as LG1 and LG2, regardless that the 3D NAND cell is a 2-poly floating-gate 3D cell or a 1-poly charge-trapping 3D cell.

The detailed bias conditions for the FN-channel erase of partial or full block of Array5 are shown below in accordance with FIG. 9E of the present disclosure. In order to perform the preferred partial or full block erase on LG1's H vertical 3D Odd and Even U-shaped strings of Array5, the CSL is coupled to an iterative Verase (supplied from an independent CSL voltage generator, which is not shown) from the Verase-biased Psubstrate and rest of nodes in the selected 3D NAND strings have to be left floating to operate 3D NAND strings and array. The control over all string-select common gate signals SSL1, . . . , SSLH and GSL1, . . . , GSLH per each selected 3D LG group, and voltages at LBLo1 and LBLe1 associated with this LG group are not required.

In particular, for each selected (partial-block) WL for erase nLC data of the page of cells in selected LG1 group, the WL voltage is set to 0V to erase the corresponding nLC data. For unselected WLs in selected LG1 group, the WL biases are left at floating to prevent NAND erase of nLC data in corresponding pages. Note, the erase is performed on per-LG base, therefore, a concurrent partial and full 3D blocks erase in the selected 3D LGs in one NAND plane while other operations like nLC program, program-verify, and read are being performed in other LGs in another NAND plane can be achieved.

Figure 6:
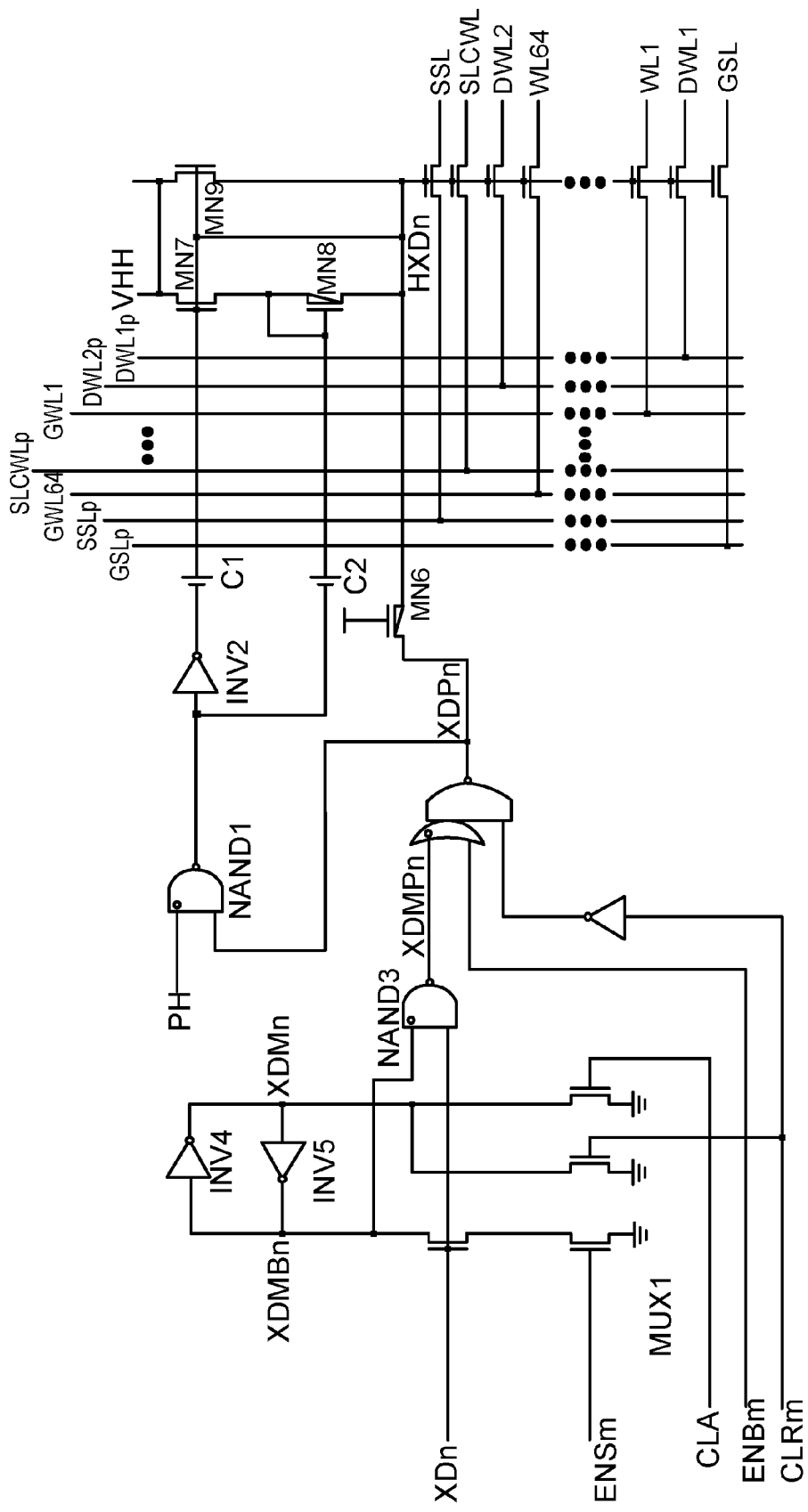
FIG. 6 is a circuit diagram of a preferred block-decoder with a latch control, bridging the inputs of a set of global bus lines and gates of all wordlines and common gates of string-select devices in association with 2D/3D hierarchical NAND array according to an embodiment of the present invention.

FIG. 6 is a circuit diagram of a block-decoder for providing global WL voltages with a latch control in association with 2D/3D hierarchical NAND array according to an embodiment of the present invention. In a specific embodiment, the block-decoder includes a latch circuit and one local charge-pump circuit so that every randomly selected set of block's SSL, WLs, and GSL voltages in any NAND key operations can be sequentially and respectively locked in their respective gate-poly parasitic capacitances for performing the desired multiple-mask concurrent operations for both preferred 2D hierarchical NAND and 3D hierarchical NAND arrays (e.g., Array1 to Array5 above) of the present disclosure. As shown, the block-decoder (50 of FIG. 2) includes an input XDn, which is the output of a Pre-decoder from an Address Register (25 of FIG. 2) and can only be enabled when a status signal XDMBn of a latch circuit is at a voltage of Vdd. The Latch circuit includes both invertors INV4 and INV5. This Latch circuit is used to determine if the addressed block-decoder is selected or not selected for a preferred flexible partial or full block erase and erase-verify operation and any subsequent concurrent/pipeline program, read, and verify operations.

In an embodiment, all Latches of all block-decoders are reset by a global one-shot Vdd pulse signal CLA to set all XDMn=Vss and then all XDMBn=Vdd. This global one-shot pulse signal CLA can be generated upon detecting power-up or a chip-enable signal of each NAND chip. When a block decoder is selected by the addressed XDn, then XDn=Vdd with one-shot pulse of ENSm=Vdd to set XDMBn=Vss to record the selection and to differentiate the selected blocks from the non-selected ones. Therefore, when XDMBn=Vss, at least some of all block-decoders are selected for performing the preferred flexible full or partial block erase operations.

When CLRm signal is set to Vss and ENBm is given an one-shot pulse Vdd, then XDPn=Vdd to enable the PH clock into a local VHH pump circuit to make HXDn to a high voltage VPP=Verase+Vt so that whole set of HVs on a set of global bus lines: SSLp, SLCWLp, DWL2p, multiple number of Global WL lines GWLs: GWl1-GWL64), DWL1p, and GSLp can be made respectively available to corresponding gate of string-select line SSL, an SLC WL, a dummy WL, all WLs in a 2D/3D NAND string (for example, 64 WLs for a 2D NAND string), another dummy WL, and gate of another string-select line GSL of any selected block without voltage drop.

When a partial block (e.g., Z (=1-63) WLs in a 64 WLs block) erase command is received, Z WL addresses will be sequentially received and forwarded to respective selected block in a selected LG regardless of 2D or 3D NAND structures. Those local HV pump circuits will be disabled when they are not selected with corresponding status signal XDMBn=Vss. The non-selected XDPn=HXDn=Vss to disconnect the non-selected sets of 1 GSL, 1 SLCWL, 2 DWLs, 64 WLs, and 1 SSL per block from corresponding global bus lines of GSLp, SLCWLp, DWL1p, GWL1-GWL64, DWL1p, and SSLp where specific WL voltages will be determined to be either at 0V or Verase and other values depended on whether each WL is selected to be erased or not based on the partial block erase command.

In an embodiment, the block-decoder shown in FIG. 6 is functionally equivalent to a combination of 2D/3D block dec with Latch circuit 50, the voltage provider 56 coupled to the High, Medium, Analog Low voltage generator 60, as well as the Address Register 25 of the 2D/3D NAND chip shown in FIG. 2 to provide corresponding HV, MHV, or analog LV voltages selectively for a set of global conductive poly bus lines. These voltages can be controlled and delivered to a corresponding whole set of GSL/DWL/WL/DWL/SLCWL/SSL lines of a selected block and latch thereof before freeing the set of global conductive poly lines for concurrently performing other NAND operation such as program, read, and verify on an alternate selected block. For example, the block-decoder provides a non-self-timed voltage charge of Verase voltage to a random size partial-block of each selected block before the erase operation is started by an ENBm pulse of ~5 μs controlled by the on-chip state-machine. Additionally, the block-decoder provides a self-timed (Tpgm=100 μs) voltage locking on each selected set poly2 parasitic capacitor lines of the block during the application of Verase=20V. Furthermore, the block-decoder provides a self-timed (Tdischarge~2.5 μs) discharge of the HV remained in each selected set poly2 parasitic capacitor lines per block automatically.

This block-decoder provides a voltage latching function for all selected sets of 1 SSL, 1 SLCWL, 2 dummy WLs, Z (optionally Z=1~63 for partial block and Z=64 for full block) WLs, and 1 GSL lines as well as $V_{TPW}$ and $V_{DNW}$ to allow the fully random selected erase for multiple randomly selected full and partial blocks at the same time to save power consumption and in each full-block or partial-block erase operation. The different between full and partial block erase is to latch different gate voltages such as selected $V_{WL}$=0V, and non-selected one are in floating. In a specific embodiment, if there are same erase operations in each randomly selected block for same locations of WLs, then no need to enable the latch function. We can directly using the global bus lines of all GWLs, DWLp, SLCWLp, SSLp and GSLp lines to drive all selected blocks simultaneously. Once all the erase biased voltages for the selected sets of WLs, BWLs, SSL and GSL, dummy WLs, and TPW and DNW are latched, the HV pump circuit can be shut off. The latching is performed in accordance with the following sequences.

1) Discharge and then disconnect each selected set of Z WLs, 2 Dummy WLs 1 SLCWL, 1 SSL, and 1 GSL of the selected erase block from one common sets signals of Z GWLs, 2 global Dummy WLs, 1 SLCWLp, 1 SSLp and 1 GSLp lines. In other words, the selected block's WLs are set in floating state with 0V initially.
2) Ramp $V_{TPW}$=$V_{DNW}$ from 0V to Verase or stepwise increasing Verase. As a result,
  a) $V_{TPW}$=$V_{DNW}$=Verase.
  b) $V_{WL}$s=Verase.
  c) $V_{SSL}$=$V_{GSL}$=Verase.
  d) $V_{DWL}$s=Verase ($V_{SLCWL}$=Verase).
  In this step, all selected full-blocks or partial-blocks would not be erased due to $V_{WL}$=$V_{TPW}$.
3) Set the selected partial-block WLs voltage for erase as the followings from each corresponding bus line voltages $V_{GWL}$:
  a) Set the selected erase WLs: $V_{WL}$=0V.
  b) Set the unselected WLs: $V_{WL}$=Verase (float).
  c) Set the rest dummy WLs, SSL, and GSL to float.
  d) Latch above WLs, BWLs, Dummy WLs, SSL and GSL on the same time by disconnecting from GWL signals.

Several key sets of operating voltages of local gate signals of 1 SSL, 64 WLs, 1 SLCWL, 2 DWLs, and 1 GSL in all different 2D or 3D NAND concurrent operations are sequentially latched. The selected WL address of each 2D or 3D string inside the selected blocks can be randomly selected and latched along with the unselected gate signals in each selected block. Note, the right timing to latch the whole set of voltages into each selected block's poly parasitic gate capacitors is after each set of local gate voltages are settled from one common set of global signals of 1 SSLp, 64 GWLs, 1 SLCWLp, 2 DWLp, and 1 GSLp. The key operations are summarized below.

1) nLC concurrent program operation. The following set of local gate program voltages are latched from the corresponding set of same global voltages (with the common source line being set to Vdd):
  a) $V_{SSL}$=Vdd.
  b) $V_{DWL}$=$V_{SLCWL}$=Vpass=~10V.
  c) $V_{WL}$(selected)=iterative Vpgm.
  d) $V_{WL}$(unselected)=Vpass~10V.
  e) $V_{GSL}$=Vdd.
2) nLC concurrent program-verify and read operations. The following set of local program-verify or read voltages are latched from the corresponding set of same global voltages (with the common source line CSL being set to Vss):
  a) $V_{SSL}$=Vdd.
  b) $V_{PWL}$=$V_{SLCWL}$=Vread=~5V.
  c) $V_{WL}$(selected)=iterative VRn:
    i. For SLC read, one VRn.
    ii. For MLC read, three VRn.
    iii. For TLC read, seven VRn.
    iv. For XLC read, fifteen VRn.
  d) $V_{WL}$(unselected)=Vread=~5V.
  e) $V_{GSL}$=Vdd.
3) nLC concurrent erase operation using GIDL scheme (for 3D NAND from LBL side). The following set of local erase voltages are latched from the corresponding set of same global voltages (with the common source line being at float):

a) $V_{SSL}$=Floating at Verase
b) $V_{DWL}$=$V_{SLCWL}$=Floating at Verase.
c) $V_{WL}$(selected)=0V.
d) $V_{WL}$(unselected)=Floating at Verase.
e) $V_{GSL}$=Floating at Verase.

For partial-block erase, Z WLs per block in multiple selected blocks are erased at the same time. Typically, when Z regular nLC WLs are erased, the SLCWL mentioned above is also erased at the same time to prepare for the new nLC program data to be to be saved in SLC form once a sudden Vdd power loss is occurred. One SLCWL for one NAND block. But H blocks have H SLCWLs to store more pages of nLC data. The SLCWLs are selectively erased with bias conditions of $V_{SLCWL}$=0V and $V_{TPW}$=$V_{DNW}$=Verase with the remaining Z WLs, 2 dummy WLs and two string select SSL and GSL lines in the same string and same block being biased in the floating state to protect the whole or partial nLC data stored in Z nLC WLs in each string. For example, if J pages of MLC program operation is completed, then only J pages of remaining MSB program data to be programmed simultaneously into J SLCWLs in J LGs. More detail descriptions about the random-size partial-block erase operation will be found throughout the specification and particularly below.

In an alternative embodiment, the present invention is related to a 3D hierarchical-BL NAND plane and array configured for performing J-page ABL or ABL-like, AVtz, concurrent and pipeline nLC program operation like above 2D hierarchical-BL NAND array. Similarly, one option of the whole 3D NAND array is at least divided into 2 vertically physical 3D planes with a full physical SUB separation by one row of first ISO 20V circuit in 3D BL or column direction. Each 3D plane further comprises a preferred hierarchical 2-level vertically unbroken 2λ-pitch M2 3D GBL but broken 2λ-pitch M1 3D LBL nLC 3D NAND array structure with each 3D GBL layout pitch is formed with same pitch as each tight 3D LBL one. Each 3D NAND array is further divided into J bottom-level 3D LGs (Low-group) per 3D GBL line in 3D GBL-direction respectively coupled to J M0-level metal line LGps and J common source line CSL. Each 3D LG is further divided into H 3D NAND blocks. Each 3D block further comprises N 3D strings cascaded in a 3D WL or row direction and each string comprises X 3D memory cells (and optionally dummy cells) connected in series with one top 3D string select transistor MHV MS and one bottom 3D string select transistor MHV MG, where X=8, 16, 24, 32 or Integer number. The number of 3D NAND cells in each 3D NAND string is smaller than the number of 2D NAND cells in each 2D NAND string so far.

Optionally, in this 3D NAND array, all M0-level CSLs and M0-level LGps lines are laid out to be perpendicular to all 3D M1-level LBLs and 3D M2-level GBLs but in parallel to WLs, SSL and GSL lines. In addition, one 2λ-pitch 3D M1-level LBL line is connected to one 2λ-pitch 3D M2-level GBL line.

Optionally, every 3D M0-level SL line is a CSL to be connected to N source nodes of one 3D NAND block. Thus the 3D M0-level SL is laid out to be perpendicular to the 3D M1-level LBL and 3D M2-level GBL lines in the 3D NAND array. In an alternative 3D NAND array, every 3D M0-level SL line is an individual line to corresponding 3D M2-level GBL and 3D M1-level LBL line to be connected to multiple source nodes of multiple 3D NAND blocks. Thus the 3D M0-level SL is laid out to be perpendicular to 3D WL, SSL and GSL lines but is in parallel to 3D M2-level GBL line and 3D M1-level LBL lines. The erase schemes of these two 3D NAND array are same by using a GIDL scheme. These two 3D NAND planes are connected to one shared DB (30) via the second ISO circuit with 20V protection during any Plane erase operation. As a result, both planes can be erased on the same time or at different time, depending on the operation needs.

In a specific embodiment, the present disclosure shows a random-size erase operation is able to be performed for both 2D and 3D hierarchical NAND array of the present invention. Some major features of the random-size erase operation are summarized below.

1) The erased size can be a full-block with S WLs (for example S=64) or a partial block with Z WLs, where Z varies from 1 to 63.

2) The number of the erased blocks can be one or more than one such as W blocks, where 1≤W≤T and T is the total block numbers within whole NAND chip on same TPW and DNW voltages for 2D NAND array or same bulk voltage for 3D NAND array.

3) The locations of erased WLs are fully random in each selected partial-block.

4) The erase blocks can be W all full-blocks or W all partial-blocks, or W mixed full and partial blocks.

5) All selected blocks can be erased at the same time, regardless of the full-blocks or the partial-blocks.

6) All WLs' gates in the selected, erased full or partial blocks are biased at 0V with respect to the Verase at triple-P-well $V_{TPW}$ in the 2D hierarchical NAND or at bulk voltage $V_B$ in the 3D hierarchical NAND.

7) The random-size erase can be performed in an iterative way, i.e., an iterative erase-verify operation.

8) The number of randomly erased partial block can be one to J to make them ready for the J-page, AVtz, ABL or ABL-like, concurrent nLC program operation with many randomly dispersed WLs.

9) For an Alt-WL program scheme, the order of nLC program is preferably performed but not limited in one direction along the string such as from string bottom to string top or vise versa when the number of erased border WL are more than 1.

10) The erase physics uses FN-tunneling effect for the 2D/3D NAND cell to remove or inject electrons from or into the floating-gate or a charge-trapping layer in 2D/3D NAND cells or just uses a hot-hole injection in a 3D floating-gate or charge-trapping layer NAND cell.

11) The averaged erase time for both partial-block and the full-block takes around 1-3 ms.

12) Border WL (BWL) exists for partial block erase along with a potential WL-WL punch through issue. During erase operation, Verase is stepwise increased up to ~20V at TPW base, if BWL is at 20V while the next WL for erase is at 0V, risk of accidental erase or WL-BWL oxide breakdown exist. Optionally, these BWLs' gates are biased at $V_{BWL}$=Verase the same HV for TPW to prevent FN-tunneling effect from happening on those BWLs if WL-WL oxide breakdown would not happen when 20V exists between the BWLs and regular WLs. Optionally, a pre-read operation is performed on cells associated with the BWL to retrieve the nLC data therein first, and program the nLC data onto an alternative available WL in alternate plane isolated from the current plane with independent TPW/DNW base or save it to an off-chip flash controller. Later the nLC data can be reloaded back after the current partial-block erase operation on the current plane is finished.

The 3D NAND's random partial-block or a full-block erase are substantially the same as 2D NAND except that the certain bias conditions are different. The bias conditions of this partial-block erase is performed on the 2D hierarchical array based on an exemplary 2D block shown in FIG. 4 with a scheme of (GBL//LBL) are made perpendicular to (CSL// LGps) lines. Each erase WL erasure is performed with their gates being tied to 0V with respect to $V_{TPW}=V_{DNW}=$Verase or a stepwise increasing Verase.

The J-page nLC concurrent program can be performed on all cases of random-size erase operation, where J erased WLs may be selected randomly from partial-blocks or full-blocks from J LGs in each HG. The locations of J selected WLs in J blocks in J different LGs can be same or different for achieving the desired the highest flexibility of random erase and random program to reduce the stress of the notorious program-amplification and even erase-amplification.

FIGS. 7A-7F are circuit diagrams with bias conditions set for various different cases of random-size partial-block erase operations in 2D hierarchical NAND array of FIG. 4 according to an embodiment of the present invention. The random-size partial-block erase operations can also be performed in other 2D hierarchical NAND array structures in substantially similar manner and the corresponding descriptions would not be repeated here.

Figures 7A, 7B, 7C:

FIG. 7A shows a set of WL bias conditions for a random partial-block erase operation in a case of S=64−(K+1) number of WLs being selected for erase with only 1 BWL (border-WL), WLK+1, for both 2D NAND blocks, where the values of S are randomly defined as S=64−(K+1). When S=64, it means the full-block erase, else is called as the partial-block erase. The erase features and bias conditions of this case are summarized below.

1) One randomly selected partial-block erase size of nLC WLs is 64−(K+1) WLs. $V_{WLK+2}=\ldots=V_{WL64}$ are set to 0V and latched for the selected WLs from number K+2 to number 64. 2) 1 SLCWL and 1 DWL2 are also erased as one option, $V_{SLCWL}=0V$, $V_{DWL2}=0V$. 3) One randomly unselected partial-block erase size of nLC WLs is K+1 WLs. Here $V_{wL1}=\ldots=V_{WLK}$ are set to Verase and latched. The border WLK+1 is still set to Verase, yet a pre-read followed by a program may be needed to save the corresponding page data to an alternative plane or an off-chip flash controller. 4) All selected 64−(K+1) WLs, 1 DWL2, and 1 SLCWL are erased and WL1 to WLK+1 are erased-inhibited at the same time for each iterative erase step. 5) For an Alt-WL program scheme, the order of nLC program is preferably performed but not limited in one direction such as from WLK+2 to WL64 in accordance with the partial-block erase guideline. 6) $V_{TPW}=V_{DNW}=$Verase increasing stepwisely.

As a result of the erase operation, the nLC data in WLK+2 to WL64 and SLC data in SLCWL and DWL2 will be erased to turn their Vt states to Vte negative state with, for example, Vtemax<−2V, within 1-3 ms erase time. The data in BWL (WLK+1) may be affected due to the reduced $V_{BWL}$ compared to $V_{TPW}=V_{DNW}=$Verase. In order to preserve the data in BWL cells, a read operation is firstly performed and the read data is programmed into a WL in another plane with separate P-well/N-well base on the same chip or can be saved to off-chip flash controller before the erase operation and re-programmed back to the BWL in this plane after the current partial-block erase operation and subsequent partial-block erase-verify operation are finished.

FIG. 7B shows a set of WL bias conditions for another random partial-block erasure operation in a case with 2 BWLs as explained below. The erase features and bias conditions of this case are summarized below.

1) One randomly selected partial-block erase size of nLC WLs is 4 WLs from WLK to WLK+3, where $V_{WLK}=V_{WLK+1}=V_{WLK+2}=V_{WLK+3}$ are set to 0V and latched.

2) 1 SLCWL and 1 DWL2 are also erased as one option with $V_{SLCWL}=0V$ and $V_{DWL2}=0V$, and being latched.

3) Two randomly unselected partial-block erase sizes of nLC WLs can be a) bottom unselected partial-block of K−1 WLs from WL1 to WLK−1 including a BWL WLK−1. The $V_{WL1}=\ldots=V_{WLK-1}$ are set to Verase; b) top unselected partial-block includes all WLs from WLK+4 to WL64, with border WLK+4 $V_{WLK+4}=V_{WLK+5}=\ldots=V_{WL64}$ set to Verase and latched.

4) Four selected WLs (WLK to WLK+3), 1 DWL2, and 1 SLCWL are erased and the rest of 60 nLC WLs are erased-inhibited at the same time for each iterative erase step.

5) For an Alt-WL program scheme, the order of nLC program is preferably performed but not limited in one string direction such as from WLK to WLK+3 in accordance with the partial-block erase guideline.

6) $V_{TPW}=V_{DNW}=$Verase of stepwisely increasing value.

As a result of the erase operation, the nLC data in WLK to WLK+3 and SLC data in SLCWL will be erased to a Vte negative state with Vtemax<−2V within 1-3 ms erase time.

FIG. 7C shows a set of WL bias conditions for another random partial-block erasure in a case with 1 BWL as explained below. The erase features and bias conditions of this case are summarized below:

1) One randomly selected partial-block erase size of nLC WLs=K+1 from WL1 to WLK+1, where $V_{WLK1}=\ldots=V_{WLK+1}$ are set to 0V and latched.

2) 1 SLCWL and 1 DWL1 are also erased as one option with $V_{SLCWL}=0V$ and latched $V_{DWL1}=0V$ and latched.

3) One randomly unselected partial-block erase sizes of nLC WLs. a) For top unselected partial-block of WLK+2 to WL64, $V_{WLK+2}=\ldots=V_{WL64}$ are set to Verase and latched.

4) K+1 selected WLs (WL1 to WLK+1), 1 DWL1, and 1 SLCWL are erased and the rest of 64−(K+1) nLC WLs are erased-inhibited at the same time.

5) For an Alt-WL program scheme, the order of nLC program is preferably performed but not limited in one string direction such as from WL1 to WLK+1 in accordance with the partial-block erase guideline.

6) $V_{TPW}=V_{DNW}=$Verase, a stepwise increasing Verase.

As a result of the erase operation, the nLC data in WL1 to WLK+1 and SLC data in SLCWL and DWL1 will be erased to Vte negative state with Vtemax<−2V.

FIG. 7D shows a set of WL bias conditions for two random partial-block erase operations in a case with 3 BWLs. The erase features and bias conditions of this case are summarized below.

1) First randomly selected partial-block erase size of 2 WLs, WLK and WLK+1, where $V_{WLK}=V_{WLK+1}$ are set to 0V and latched.

2) Second randomly selected partial-block in same block with erase size of 64−(K+3) WLs from WLK+4 to WL64, where $V_{WLK+4}=\ldots=V_{WL64}$ are set to 0V and latched.

3) 1 SLCWL and 1 DWL2 are also erased as one option with $V_{SLCWL}=0V$ and latched and $V_{DWL2}=0V$ and latched.

4) Two randomly unselected partial-block erase sizes of nLC WLs with a) Top 2 unselected partial-block: WLK+2 and WLK+3, both are border WLs, $V_{WLK+2}=V_{WLK+3}$ are set to Verase and latched; b) Bottom K−1 unselected partial-block: WL1 and WLK−1, $V_{WL1}=\ldots=V_{WLK-1}$ are set to Verase and latched.

5) Total nLC WLs of WLK, WLK+1, and WLK+4 to WL64, 1 DWL2, and 1 SLCWL are erased and the rest of nLC WLs are erased-inhibited on the same time.

6) For an Alt-WL program scheme, the order of nLC program is preferably performed but not limited in one direction such as from WLK to WLK+1 and WLK+4 to WL64 in accordance with the partial-block erase guideline.

7) $V_{TPW}=V_{DNW}=$Verase of stepwise increased.

FIG. 7E shows a set of WL bias conditions for two random partial-block erase operations in a case with 2 BWLs only. The erase features and bias conditions of this case are summarized below.

1) First randomly selected partial-block erase size of K−1 WLs, WL1 and WLK−1, where $V_{wL1}=\ldots=V_{WLK-1}$ are set to 0V and latched.

2) Second randomly selected partial-block in same block with erase size from WLK+4 to WL64, where $V_{WLK+4}=\ldots=V_{WL64}$ are set to 0V and latched.

3) 1 SLCWL, 1 DWL1, and 1 DWL2 are also erased as one option with $V_{SLCWL}=0V$ (L.=Latched), $V_{DWL1}=0V$ (L.=Latched), and $V_{DWL2}=0V$ (Latched).

4) One randomly unselected partial-block erase sizes of nLC WLs with middle unselected partial-block: 4 WLs from WLK to WLK+3 with $V_{WLK}=V_{WLK+3}$ being set to Verase and latched.

5) Total nLC WLs of WL1 to WLK−1 and WLK+4 to WL64, 1 DWL2, 1 DWL1, and 1 SLCWL are erased and the rest of nLC WLs are erased-inhibited at the same time.

6) For an Alt-WL program scheme, the order of nLC program is preferably performed but not limited in one direction such as from WL1 to WLK−1 and WLK+4 to WL64 in accordance with the partial-block erase guideline.

7) $V_{TPW}=V_{DNW}=$Verase of step Verase.

FIG. 7F shows a set of WL bias conditions for two random partial-block erase operations in a case with 1 WL erase per partial-block but with 4 BWLs. The erase features and bias conditions of this case are summarized below.

1) First randomly selected partial-block erase size of 1 WL, which is WLK, where $V_{WLK}=0V$ (Latched).

2) Second randomly selected partial-block in same block with 1 WL erase size, WLK+3, where $V_{WLK+3}=0V$ (Latched).

3) 1 SLCWL is also erased as one option with $V_{SLCWL}=0V$ (Latched).

4) 4 BWLs: BWL1=WLK−1, BWL2=WLK+1, BWL3=WLK+2, and BWL4=WLK+4, each being set to $V_{BWL}=$Verase.

5) Total nLC WLs of WLK and WLK+3, and 1 SLCWL are erased and the rest of nLC WLs are erased-inhibited at the same time.

6) For an Alt-WL program scheme, this case no Alt-WL program is performed due to the smallest erase size of single-WL erase. In this case, WLK+1 and WLK−1 nLC verify maybe necessary to ensure no nLC data error before and after the 1−WL erase.

Optionally, all above cases of the partial-block or full-block erase-operations need to set both $V_{SSL}=V_{GSL}=$Verase (and are latched) to avoid the oxide breakdown of MS and MG devices in each NAND string, regardless of 2D or 3D NAND blocks.

Optionally, all above bias condition of Verase (Latched) of the present invention means the Verase voltage on unselected WLs, SSL, GSL, and DWLs is not coupled from $V_{TPW}=$Verase as prior art's approach. Instead, each Verase (Latched) for each unselected WLs or SSL and GSL lines is set directly from each corresponding global bus line GWL of the block-decoder with $V_{GWL}=$Verase.

Optionally, all above bias condition of Verase (Floating) of the present invention means the Verase voltage is coupled from $V_{TPW}=$Verase when it floats initially by disconnecting from GWLs as prior art approach.

FIG. 8 shows a preferred random-size partial-block erase operation with the optimal bias conditions for 2D hierarchical NAND array according to an embodiment of the present invention. In general, all program operations are to perform on the blocks being erased first. In other words, a typical sequence of NAND operation is first to perform an erase operation, secondly to perform program operations, and thirdly, to perform concurrent erase, program and read operations. Illustrated as an example for 2D hierarchical NAND array, a random-size partial-block erase operation is performed by setting the following bias conditions for 5 terminals of selected and non-selected cells as well as using a HXD control signal generated by an X-decoder (block-decoder) for controlling the application of various voltage signals to selected WLs of selected blocks. These bias conditions are defined in 3 cycles of T0, T1, and T2 for this partial-block erase operation. Minimum random block size is one WL.

First of all, setting $V_{TPW}=$Verase, $V_{DNW}=$Verase, and Vpsub=0V. At T0 cycle, applying bias voltages $V_G(V_{WL})$ to gate nodes, $V_D/V_S$ to drain/source nodes and $V_{HXD}$ to a control node of a X-decoder on all blocks. For selected WLs in the selected blocks: $V_G=$FL(Verase), $V_D/V_S=$FL(Verase), $V_{GWL}=$Verase (GWL is corresponding global word line from the X-decoder linked to the corresponding WL), $V_{HXD}=0V$ initially. For 1 or 2 Border-WLs (non-selected WLs) in the selected blocks: $V_G=$FL(Verase), $V_D/V_S=$FL(Verase), $V_{GWL}=$Verase, $V_{HXD}=0V$. For non-Border WLs in the selected blocks and non-selected WLs in non-selected blocks: $V_G=$FL(Verase), $V_D/V_S=$FL(Verase), $V_{GWL}=$Verase, $V_{HXD}=0V$. Optionally, Border-WLs' data have to be stored On-chip in different TPW/DNW or Off-chip before and after erase for checking the possible erase-induced bit errors. Optionally, if the partial-erase block includes WL1 or WL64, then there is only one Border-WL. Otherwise, there are two Border-WLs.

At T1 cycle, the partial block erase operation is performed on one selected block at a time. For selected WLs in the selected blocks: $V_G=0V$, $V_D/V_S=$FL(Verase), $V_{GWL}=0V$, $V_{HXD}=$VPP, where VPP=Verase+Vt. For 1 or 2 Border-WLs in the selected blocks: $V_G=$Verase, $V_D/V_S=$FL(Verase), $V_{GWL}=$Verase, $V_{HXD}=$VPP, where VPP=Verase+Vt. For non-Border WLs (non-selected WLs) in the selected blocks: $V_G=$Verase, $V_D/V_S=$FL(Verase), $V_{GWL}=$Verase, $V_{HXD}=$VPP. For non-selected WLs in the non-selected blocks: $V_G=$FL(Verase), $V_D/V_S=$FL(Verase), $V_{GWL}=0V$ or Verase, and $V_{HXD}=0V$.

At T2 cycle, the partial block erase operation is performed on one selected block at a time. For selected WLs in the selected blocks: $V_G=$FL(0V), $V_D/V_S=$FL(Verase), $V_{GWL}=0V$, $V_{HXD}=0V$. For 1 or 2 Border-WLs in the selected blocks: $V_G=$FL(Verase), $V_D/V_S=$FL(Verase), $V_{GWL}=$Verase, $V_{HXD}=0V$. For non-Border-WLs (non-selected WLs) in the selected blocks: $V_G=$FL(Verase), $V_D/V_S=$FL(Verase), $V_{GWL}=$Verase, $V_{HXD}=0V$. For non-selected WLs in non-selected blocks: $V_G=$FL(Verase), $V_D/V_S=$FL(Verase), $V_{GWL}=0V$ or Verase, and $V_{HXD}=0V$.

FIG. 9A shows a set of bias conditions for performing full or partial-block erase operation on a 3D hierarchical NAND array of FIG. 5A of the present disclosure. The 3D hierarchical NAND array is used as an example for illustrating the erase operation of this invention. All memory cells in the 3D hierarchical NAND array are formed optionally with 3D vertical NAND cells or optionally with 3D floating-gate cells. As shown in FIG. 9A, as an example, the bias conditions are designated for 3D NAND cells that use GIDL erase scheme regardless of the 3D NAND cells being the 2-poly floating gate transistor type or the 1-poly charge-trapping transistor type with cell's vertical bulk region being isolated from the chip's Psubstrate to allow concurrent different operations among different 3D LGs.

This erase operation is divided into 3 operational phases such as preparation phase, charge-up phase, and erase phase in a preferred sequential order with corresponding bias conditions to control signals in association with the 3D hierarchical NAND array such as $V_{GBL}$, $V_{ISO}$, $V_{GSL}$, $V_{LGo}$, $V_{LGe}$, $V_{LBLo}$, $V_{LBLe}$, $V_{PREo}$, $V_{PREe}$, $V_{LGps}$, in addition to the common string-select signals of $V_{SSL}$, $V_{GSL}$ and source line signal $V_{SL}$. The details of bias conditions setup for each phase are summarized below.

1) Preparation phase: This is a first step of the erase operation. It is to drive the LBLs locally from LGps line to increase the $V_{LBL}$s to Vsg in the selected 3D LGs, where Vsg is an optimum voltage for inducing GIDL effect. This is an example of one-sided erase for a 3D string in which GIDL holes are generated from LBL drain side for erase while CSL side is biased off to prevent the leakage from LBLs. Optionally, the one-sided erase from CSL side is also available under the same Array1. Optionally, a two-sided GIDL erase is applicable under the same Array1. Similarly, the $V_{LBL}$ charge is prevented from leaking to GBL as well in accordance with the 3D NAND array circuit of the present invention. Therefore, the bias conditions include: a) $V_{GBL}$=float, $V_{ISO}$=Vpass~10V; b) $V_{GSL}$=float for selected blocks and $V_{GSL}$=0V for unselected blocks in the selected 3D LGs and $V_{GSL}$=0V in the unselected 3D LGs; c) $V_{LG}$=0V and $V_{LGo/e}$=0V; $V_{LBLo/e}$ is raised from 0V to Vsg for the selected 3D LGs and $V_{LBLo/e}$ is set to Floating at 0V for the unselected 3D LGs.

Unlike the prior art where there are no divided LBL lines and each BL is shared by the selected and unselected erase blocks, so that only the full-blocks are selected for erase with all Vb1=Verase. In the embodiment of this invention, the LBLs are separated as selected ones and unselected ones. Thus, any values of BL voltages of any randomly selected and unselected blocks can be independently assigned from any local LGps line associated with each 3D LG. Thus, Verase power consumption is dramatically reduced.

The bias conditions further includes: e) Setting $V_{PREo/e}$ to Vsg+Vt for the selected 3D LGs and to 0V for the unselected 3D LGs; f) Setting $V_{LGps}$ to Verase for the selected 3D LGs and 0V for the unselected 3D LGs; g) $V_{SSL}$ for a first common gate of string-select devices of the selected block is raised to Vsg for the selected 3D LGs but $V_{SSL}$ for unselected blocks is set to Floating in both selected and the unselected 3D LGs; h) $V_{GSL}$ for a second common gate of string-select devices of the selected block is Vdd for the selected 3D LGs but $V_{GSL}$ for unselected blocks is set to Floating in both selected and the unselected 3D LGs; i) $V_{WL}$ is set to Floating for all WLs in this preparation phase.

Optionally, the preparation phase is mainly to prepare the GBL, LBL, CSL, and LGps control signals/voltages to either the 3D strings' drain nodes or the 3D strings' source nodes of the selected and unselected ones.

2) Charge-up phase: Firstly, the highest Verase voltage (~20V) may be reached by raising from the initial Vsg at each iterative step. The Verase is applied to all local N LBLs of all selected full or partial blocks from those selected LGps lines, rather from GBLs. Secondly, all WLs remain at floating state to avoid accidental erase during this Verase ramping up phase. Most of signals/voltages (including voltages at both the first and second common gates of string-select devices) are not changed from the precharge phase except for the following ones: a) $V_{LBLo/e}$ are raised from Vsg to Verase for the selected 3D LGs and $V_{LBLo/e}$ are set to Floating for the unselected 3D LGs; b) $V_{PREo/e}$ are raised from Vsg+Vt to Verase+Vt to allow the full passage of Verase from corresponding LGps lines to the selected LBLs for the selected 3D LGs and $V_{PREo/e}$ are set to 0V for the unselected 3D LGs; c) $V_{LGps}$=Verase for the selected 3D LGs and $V_{LGps}$=0V for the unselected 3D LGs.

3) Erase phase: In this phase, only WLs bias voltages are changed as follows: a) For those selected WLs of selected blocks of selected LGs for erase, $V_{WL}$s are pull down from Floating to 0V; b) For those unselected WLs of unselected blocks of unselected 3D LGs for erase, $V_{WL}$s are kept at Floating at Verase.

Optionally, in order to perform the randomly selected number of WLs in randomly selected full or partial blocks, each individual block-decoder's Latch is use to load and latch one set of S WLs, 2 dummy WLs, 1 SLCWL, 1 SSL, and 1 GSL lines of each randomly selected block. These WL voltages are loaded and latched with safety. Note, the set of the bias voltages in this table are applicable for performing erase operation on each of the five types of 3D NAND arrays of Array1 shown in FIG. 5A of this disclosure.

FIG. 9B shows a set of bias conditions for performing full or partial-block erase operation on a 3D hierarchical NAND array of FIG. 5B of the present disclosure. In particular, a set of bias conditions are applicable on a 3D hierarchical NAND array: 3D Array2. As an example, the following bias conditions are only designated for 3D NAND cells that use GIDL erase scheme regardless of the 3D NAND cells being the 2-poly floating gate transistor type or the 1-poly charge-trapping transistor type with cell's vertical bulk region being isolated from the chip's Psubstrate to allow concurrent different operations among different 3D LGs. Yet, Array2 is different from the Array1 by forming its GBL and related peripherial circuits below the common source line via a flip-substrate process.

The erase operation on 3D hierarchical NAND array also includes 3 phases of preparation phase, charge-up phase and erase phase in a sequential order similar to the operation shown in FIG. 9A. It is optionally expenable with extra bias conditions being set to generate Verase to CSL lines for performing two-sided erase of each selected 3D NAND string. In other words, both drain and source sides are used to generate GIDL hot-holes during the erase phase, thus achieving a faster erase operation. The following bias condition is just for 1-sided LBL GIDL erase.

1) Preparation phase: A first step is to drive the LBLs locally from LGps line to increase $V_{LBL}$s to Vsg in the selected 3D LGs. Similarly, the $V_{LBL}$ is prevented from leaking to GBL as well in accordance with the 3D NAND array circuit of the present invention. The preparation phase bias conditions include: a) $V_{GBL}$=Float, $V_{ISO}$=Vpass; b) $V_{CSL}$(selected) is at float in the selected 3D LG and $V_{CSL}$ (unselected) is set to 0V in the unselected 3D LGs; c) $V_{LG}$=0V for both the selected and the unselected 3D LGs; $V_{LBLo/e}$ is raised from Vss to Vsg for the selected LGs and $V_{LBLo/e}$ is set to Floating at 0V for the unselected LGs. The LBL lines are separated from selected ones and unselected ones. Thus, any values of BL voltages of any randomly selected and unselected blocks can be independently assigned from any local $V_{LGps}$. Thus, Verase power consumption is dramatically reduced.

The preparation phase bias conditions further include: e) $V_{PREo/e}$ are raised to Vsg+Vt for the selected LGs or kept at 0V for the unselected LGs; f) $V_{LGps}$ is set to Verase for the selected LGs and 0V for the unselected LGs; g) $V_{SSL}$ for the first common gate of string-select devices for the selected block is raised to Vsg for the selected LGs but $V_{SSL}$ for unselected block is kept at Floating in both selected and the unselected LGs; h) $V_{GSL}$ for the second common gate of string-select devices for both the selected block and unselected blocks are set to floating; i) $V_{WL}$ is set to Floating for all WLs in the preparation phase.

Optionally, the preparation phase is mainly to prepare the GBL, LBL, CSL, and LGps control signals and voltages to either the 3D strings' drain nodes or the 3D strings' source nodes of the selected and unselected ones.

2) Charge-up phase: In this step, firstly the Verase voltage is raised from the initial Vsg at each iterative step up to the highest Verase~20V. The Verase is applied to all local N LBLs (and optionally to CSLs as well) of all selected full or partial blocks from those selected LGps line. Secondly, all WLs remain at to Floating to avoid accidental erase during this Verase ramping phase. Most of signals/voltages are not changed from the preparation phase except for the following ones: a) $V_{LBLo/e}$ is raised from Vsg to Verase for the selected LGs and kept at Floating for the unselected LGs; b) $V_{PREo/e}$ is raised from Vsg+Vt to Verase+Vt to allow the full passage of Verase from LGps line to the selected LBLs for the selected LGs and $V_{PREo/e}$=0V for the unselected LGs; c) $V_{LGps}$=Verase is kept for the selected LGs and VLGps=0V is kept for the unselected LGs.

3) Erase phase: In this phase, again only WLs voltages are changed following the charge-up phase as follows: a) For those selected WLs of selected blocks of selected LGs for erase, $V_{WL}$s are pull down from Floating to 0V; b) For those unselected WLs of unselected blocks of unselected LGs for erase, $V_{WL}$s are kept Floating at Verase.

FIG. 9C shows a set of bias conditions for performing full or partial-block erase operation on a 3D hierarchical NAND array of FIG. 5C of the present disclosure. In particular, a set of bias conditions are applicable on a 3D hierarchical NAND array: 3D Array3. As an example, the following bias conditions are only designated for 3D NAND cells that use GIDL erase scheme regardless of the 3D NAND cells being the 2-poly floating gate transistor type or the 1-poly charge-trapping transistor type with cell's vertical bulk region being isolated from the chip's Psubstrate to allow concurrent different operations among different 3D LGs. Yet, Array3 is different from the Array1 by replacing simple vertical string with a BiCS-based U-shaped string with its GBL and related peripherial circuits still laid at a top level as the Array1.

The erase operation on 3D hierarchical NAND array also includes 3 phases of preparation phase, charge-up phase and erase phase in a sequential order similar to the operation shown in FIG. 9A except that it is a 1-sided GIDL erase induced from the LBL side of the 3D NAND string. It is optionally expenable with extra bias conditions being set to generate Verase to LBLs for performing two-sided erase of each selected 3D NAND string. In other words, both drain and source sides are used to generate GIDL hot-holes during the erase phase, thus achieving a faster erase operation. The following bias condition is just for 1-sided CSL GIDL erase. Array3 employees a BiCS-based 3D NAND string in U-shape with a joint transistor at bottom gated by a BG signal.

1) Preparation phase: A first step is to drive the CSL line of the selected block in the selected 3D LGs by a local driver to increase from 0V to the Vsg voltage (optimum for inducing GIDL effect in the bulk region of the 3D NAND string. Similarly, the LBL is prevented from leaking to GBL as well in accordance with the 3D NAND array circuit of the present invention. The preparation phase bias conditions include: a) $V_{GBL}$=Float, $V_{EPR}$=0V, $V_{BG}$=float; b) $V_{CSL}$(selected) is raised from 0 v to Vsg in the selected 3D LG and $V_{CSL}$(unselected) is set to 0V in the unselected 3D LGs; c) $V_{LG}$=0V for both the selected and the unselected 3D LGs; d) $V_{LBLo/e}$ is set to float for both the selected and the unselected 3D LGs; $V_{PREo/e}$=0V, with LGps line being set to 0V for both the selected and the unselected 3D LGs; f) $V_{SSL}$ for the first common gate of string-select devices for the selected block is floating for both the selected and the unselected 3D LGs; g) $V_{GSL}$ for the second common gate of string-select devices is raised from 0V to Vsg for the selected block while is left to float for the unselected blocks; h) $V_{WL}$ is set to Floating for all WLs in the preparation phase.

2) Charge-up phase: In this step, firstly the $V_{CSL}$ voltage is raised from the Vsg at each iterative step up to the highest Verase-20V. Secondly, all WLs remain at to Floating to avoid accidental erase during this Verase ramping phase. Most of signals/voltages are not changed from the preparation phase.

3) Erase phase: In this phase, again only WLs voltages are changed following the charge-up phase as follows: a) For those selected WLs of selected blocks of selected LGs for erase, $V_{WL}$s are pull down from Floating to 0V; b) For those unselected WLs of unselected blocks of unselected LGs for erase, $V_{WL}$s are kept Floating at Verase.

FIG. 9D shows a set of bias conditions for performing full or partial-block erase operation on a 3D hierarchical NAND array of FIG. 5D of the present disclosure. In particular, a set of bias conditions are applicable on a 3D hierarchical NAND array: 3D Array4. As an example, the following bias conditions are designated for 3D NAND cells that use FN-tunneling erase scheme regardless of the 3D NAND cells being the 2-poly floating gate transistor type or the 1-poly charge-trapping transistor type. Yet, Array4 is different from the Array3 by providing a BiCS-like 3D NAND string with its vertical bulk region being directly connected to the common source line yet still isolated from the chip's Psubstrate to allow concurrent different operations among different 3D LGs.

The erase operation on 3D hierarchical NAND array also includes 3 phases of preparation phase, charge-up phase and erase phase in a sequential order similar to the operation shown in FIG. 9C but employing FN-tunneling erase scheme. Array4 employes a BiCS-like 3D NAND string in U-shape with a joint transistor at bottom gated by a BG signal and an additional circuit for connecting the CSL to the vertical bulk region shared by each 3D NAND string.

1) Preparation phase: A first step is to drive the CSL line of the selected block in the selected 3D LGs by a local driver to increase from 0V to a predetermined Ver1 voltage (optimum for inducing FN-tunneling effect within the vertical bulk region). Similarly, the LBL is prevented from leaking to GBL as well in accordance with the 3D NAND array circuit of the present invention. The preparation phase bias conditions include: a) $V_{GBL}$=Float, $V_{EPR}$=0V, $V_{BG}$=float; b) $V_{CSL}$(selected) is raised from 0 v to Ver1 in the selected 3D LG and $V_{CSL}$(unselected) is set to 0V in the unselected 3D LGs; c) $V_{LG}$=0V for both the selected and the unselected 3D LGs; $V_{LBLo/e}$ is set to float for both the selected and the unselected 3D LGs; e) $V_{PREo/e}$=0V, with LGps line being set to 0V for both the selected and the unselected 3D LGs; f) $V_{SSL}$ for the first common gate of string-select devices for the selected block is floating for both the selected and the unselected 3D LGs; g) $V_{GSL}$ for the second common gate of string-select devices is set to 0V for the selected block while is left to float for the unselected blocks; h) $V_{WL}$ is set to 0V for all WLs in the preparation phase.

2) Charge-up phase: In this step, firstly the $V_{CSL}$ voltage is raised from the Ver1 at each iterative step up to the highest Verase-20V. Secondly, WLs selected for erase remain at 0V while unselected WLs are raised from 0V to float. Most other signals/voltages are not changed from the preparation phase except that $V_{GSL}$ for the second common gate of string-select devices is raised from 0V to float for the selected block.

3) Erase phase: In this phase, all bias conditions remain unchanged for all gate controls for performing the full or partial block erase on those selected WLs via a FN-tunneling scheme.

FIG. 9E shows a set of bias conditions for performing full or partial-block erase operation on a 3D hierarchical NAND array of FIG. 5E of the present disclosure. In particular, a set of bias conditions are applicable on a 3D hierarchical NAND array: 3D Array5. As an example, the following bias conditions are designated for 3D NAND cells that use FN-tunneling erase scheme regardless of the 3D NAND cells being the 2-poly floating gate transistor type or the 1-poly charge-trapping transistor type. Yet, Array5 is different from the Array4 by providing a straight vertical 3D NAND string with its vertical bulk region being directly connected to the common source line formed on a common Psubstrate used by a single NAND plane. The Array5 is formed with at least two NAND planes having independent Psubstrate to allow concurrent different operations among different planes.

The erase operation on 3D hierarchical NAND array also includes 3 phases of preparation phase, charge-up phase and erase phase in a sequential order similar to the operation shown in FIG. 9C but employing FN-tunneling erase scheme to remove charged electron in floating gate or charge-traps into the vertical bulk region by raising its bias to Verase in iterative way from the connected Psubstrate of a selected plane containing the selected WLs for erase in the selected block of selected 3D LGs.

1) Preparation phase: A first step is to drive the Psubstrate of a selected plane containing the selected block in the selected 3D LGs by a local driver to increase from 0V to a predetermined Ver1 voltage (optimum for inducing FN-tunneling effect within the vertical bulk region). For unselected plane, the Psubstrate bias voltage is kept at 0V. Similarly, the LBL is prevented from leaking to GBL as well in accordance with the 3D NAND array circuit of the present invention. The preparation phase bias conditions include: a) $V_{GBL}$=Float, $V_{TIE}$=float; b) $V_{CSL}$(selected) is at float to go along with the Psubstrate bias for both the selected 3D LGs and the unselected 3D LGs; c) $V_{LG}$=float for both the selected and the unselected 3D LGs; d) $V_{LBLo/e}$ is set to float for both the selected and the unselected 3D LGs; $V_{PREo/e}$=float, with LGps line being set to float for both the selected and the unselected 3D LGs; f) $V_{SSL}$ for the first common gate of string-select devices for the selected block is floating for both the selected and the unselected 3D LGs; g) $V_{GSL}$ for the second common gate of string-select devices is set to 0V for the selected block while is left to float for the unselected blocks; h) $V_{WL}$ is set to 0V for all WLs (selected block or unselected blocks) in the selected 3D LGs and is set to float for all WLs in the unselected 3D LGs in the preparation phase.

2) Charge-up phase: In this step, firstly the Psubstrate voltage is raised from the Ver1 at each iterative step up to the highest Verase-20V, which coupling other gates voltage up too. Secondly, WLs selected for erase remain at 0V while unselected WLs in the selected 3D LGs are raised from 0V to float. Most other signals/voltages are not changed from the preparation phase except that $V_{GSL}$ for the second common gate of string-select devices is raised from 0V to float for the selected block.

3) Erase phase: In this phase, all bias conditions remain unchanged for all gate controls for performing the full or partial block erase on those selected WLs via a FN-tunneling scheme.

Figure 10:
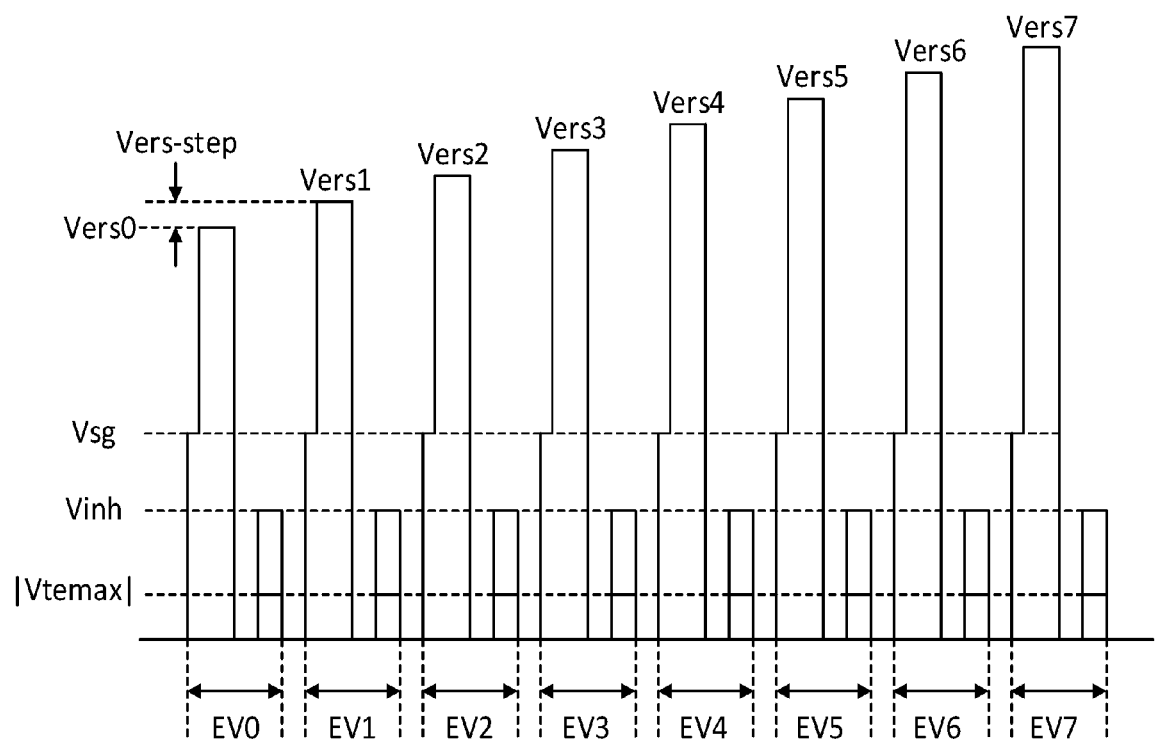
FIG. 10 is a diagram showing iterative erase and erase-verify pulses for selected 3D cells in selected strings of 3D hierarchical NAND array according to an embodiment of the present invention.

FIG. 10 is a diagram showing iterative erase and erase-verify pulses for selected 3D cells in selected strings of 3D hierarchical NAND array according to an embodiment of the present invention. As shown, multiple iterative operations of erase for the selected 3D cells in selected strings of 3D hierarchical NAND array are respectively followed by corresponding operations of erase-verify of the same 3D cells are depicted by a diagram with interleaved erase and erase-verify voltage pulses. The erase pulses, Vers, are raised at each iterative step EV0 through EV7 with an equal increment of Vers-step from Vers0 sequentially to Vers1, Vers2, . . . , Vers7 on either $V_{LBL}$ only for the case of 3D hierarchical NAND array of FIG. 9A or on both $V_{LBL}$ and $V_{CSL}$ for the case of 3D hierarchical NAND array of FIG. 9B. A single increment amplitude Vers-step is involved per each iterative erase step for raising the Vers pulse. While, two erase-verify voltages of |Vtemax| and Vinh are involved with the erase-verify operation, where |Vtemax| is the absolute voltage due to a setting of $V_{CSL}$=|Vtemax|.

For those unselected 3D strings and cells, Vsg=Floating or 0V with $V_{CSL}$=Verase or 0V to inhibit GIDL effect from happening. Optionally, $V_{LBL}$=Vinh during erase-verify operation means that some of the 3D NAND cells' Vts are still higher than Vtemax, thus no conduction cell current to pull down the precharged $V_{LBL}$=Vinh to the $V_{CSL}$=Vtemax. Thus, the iterative 3D erase operation of either of above two cases has to be continued.

Optionally, $V_{LBL}$=|Vtemax| during erase-verify operation means that some of the 3D NAND cells' Vts are erased lower than Vtemax (a negative value), thus cells conduction current will pull down the precharged $V_{LBL}$=Vinh to the $V_{CSL}$=Vtemax. Therefore, the iterative 3D erase operation of either of above two cases has to be stopped to avoid over-erase.

Optionally, the voltage difference between Vinh and |Vtemax| of Vinh−|Vtemax| is larger than 4V, which is within the sensing capability of SA with or without the analog voltage amplification of the Multiplier of the present invention after charge sharing is performed between each $C_{LBL}$ and each corresponding $C_{GBL}$ of this preferred 3D hierarchical NAND array.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A 3D NAND array with 2-level hierarchical bit line architecture comprising:
   one or more planes formed on isolated Psubstates, each plane comprising a plurality of global bit lines (GBLs) laid at a first level in bitline (BL) direction associated with K 3D HG groups separated by group-dividing devices, each 3D HG group being divided into J 3D LG groups, each 3D LG group being associated with a plurality of local bit lines (LBLs) laid at a second level in parallel to and respectively coupled to the plurality of GBLs via a plurality of GBL/LBL switch circuits, a pair of 3D LG groups being tied via a row of TIE-signal controlled devices, each 3D LG group including H blocks, each of the H blocks including the plurality of 3D NAND strings respectively associated with the plurality of LBLs cascaded in a row along a word line (WL) direction orthogonal to the BL-direction and commonly coupled via a row of precharge devices with two PRE signals for respective coupling odd and even LBLs to an independent power line laid in a third level along the WL-direction, each 3D NAND string comprising a series of S 3D NAND cells stacked around a vertical bulk region in a stacking-direction orthogonal to both the BL-direction and the WL-direction and terminated by a pair of string-select devices respectively at two ends of the 3D NAND string having its source node connected to a common source line per one or more blocks, the vertical bulk region being isolated from the Psubstrate of the plane, wherein K, J, H, and S are integers of 2 and greater based on memory chip design.

2. The 3D NAND array of claim 1 further comprising:
a block-decoder configured to use a latch signal to control passing a set of voltage signals from a voltage generator via a set of global bus lines respectively to all WLs and two common gates of two rows of the plurality of string-select devices per block;
a set of decoders for respectively sending control signals to the group-dividing devices, GBL/LBL switch circuit, TIE signal for TIE-signal controlled devices, two PRE signals for precharge devices;
driver circuits for respectively providing voltage signals for the common source line per one or more blocks and the independent power line per 3D LG group.

3. The 3D NAND array of claim 2 wherein the block-decoder comprises a latch circuit coupled to an Address Register to decode address information for selecting WLs of any full or partial block for erase and guiding the voltage generator to provide a set of bias voltages for the WLs of a selected block.

4. The 3D NAND array of claim 1 wherein the 3D NAND cell comprises a 2-poly floating gate transistor or a 1-poly charge-trapping transistor configured to perform nLC cell data erase via hole-electron annihilation through GIDL hot-hole injection from at least one of the two common gates of the pair of string-select devices into the vertical bulk region at floating state, where n=1 for SLC cell data with 2 threshold Vt states, n=2 for MLC cell data with 4 threshold Vt states, n=3, for TLC cell data with 8 threshold Vt states.

5. The 3D NAND array of claim 1 wherein the 3D NAND string is a single vertical string along the stacking-direction with a first string-select device on top near the second level associated with the LBL and a second string-select device at bottom near the third level associated with the common source line, each of the first and second string-select device being a 3D 1-poly NMOS transistor with source line and drain line being laid in vertical stacking-direction.

6. The 3D NAND array of claim 1 wherein the common source line is a metal line laid in parallel to the independent power line substantially at the same third level below the second level along the WL-direction but perpendicular to the GBLs and LBLs.

7. The 3D NAND array of claim 1 wherein the GBLs are laid above the Psubstrate at the first level higher than the LBLs laid in the second level in the stacking-direction with the plurality of GBL/LBL switch circuits, each row of TIE-signal controlled devices per one paired 3D LG groups, and each row of precharge devices per each 3D LG group being laid near the second level of the LBLs.

8. The 3D NAND array of claim 7 wherein each GBL/LBL switch circuit comprises a 3D LG-controlled 1-poly NMOS transistor coupled between the GBL and a pair of 3D LGo-controlled and LGe-controlled 1-poly NMOS transistors respectively connecting to an odd-numbered LBL and an even-numbered LBL in each 3D LG group.

9. The 3D NAND array of claim 7 wherein each TIE-signal controlled device comprises a pair of 3D 1-poly NMOS transistors commonly gated by the TIE signal and respectively connected to two LBLs of one paired 3D LG groups.

10. The 3D NAND array of claim 7 wherein each precharge device comprises a pair of 3D PREo-controlled and PREe-controlled 1-poly NMOS transistors connected the independent power line respectively to an odd-numbered LBL and an even-numbered LBL per each 3D LG group, wherein the independent power line being laid at deep at the third level below the 3D NAND strings.

11. The 3D NAND array of claim 1 wherein the GBLs are laid on the Psubstrate at the first level lower than the common source line laid at the third level in the stacking-direction with the plurality of GBL/LBL switch circuits, each row of TIE-signal controlled devices per one paired 3D LG groups, and each row of precharge devices per each 3D LG group being laid below the third level of the common source line from the backside of wafer in a flip-substrate process.

12. The 3D NAND array of claim 11 wherein each GBL/LBL switch circuit comprises a 2D LG-controlled 1-poly NMOS transistor coupled between a GBL and a corresponding LBL in each 3D LG group.

13. The 3D NAND array of claim 11 wherein each TIE-signal controlled device comprises a 2D 1-poly NMOS transistor gated by the TIE signal with source node and drain node respectively connected to two LBLs of one paired 3D LG groups.

14. The 3D NAND array of claim 11 wherein each precharge device comprises a pair of 2D PREo-controlled and PREe-controlled 1-poly NMOS transistors connected the independent power line respectively to an odd-numbered LBL and an even-numbered LBL per each 3D LG group, wherein the independent power line being laid at a level near the GBLs from the backside of the wafer.

15. The 3D NAND array of claim 3 wherein one or more partial-block WLs randomly located in a selected block are configured to be selected for performing an erase operation, the selected block belonging to one of H blocks in any selected 3D LG group, wherein total number of the one or more partial-block WLs for erase is an integer Z selected from 1 to S−1.

16. The 3D NAND array of claim 15 wherein the one or more partial-block WLs for erase comprise one or more non-selected border WLs subjected to a pre-read operation to obtain a corresponding page data and a program operation to write the page data to an alternative pair of LBLs in another pair of 3D LG groups not currently selected for erase or to save the page data to an off-chip flash controller.

17. The 3D NAND array of claim 15 wherein the erase operation on the one or more partial-block WLs in a selected block in a selected 3D LG group comprises a 1-sided GIDL-erase scheme with steps of:
  floating all gates of group-dividing devices, GBL/LBL switch circuit, TIE-signal controlled devices, and pre-charge devices in the selected 3D LG group;
  raising from 0V to Vsg voltage supplied from the corresponding independent power supply line in a preparation phase at the plurality of LBLs of the selected 3D LG group, the Vsg voltage being a predetermined optimum voltage for inducing GIDL hot-holes in the vertical bulk region at floating state;
  setting voltage signals for the two common gates of the two rows of the plurality of string-select devices associated with each selected block in the preparation phase and a subsequent charge-up phase;
  ramping up further from the Vsg voltage to a Verase voltage in the charge-up phase at the plurality of LBLs while keeping at least one of the two common gates of the pair of string-select devices at the Vsg voltage; and
  providing a corresponding set of bias voltages from the block-decoder to all WLs of each selected block while keeping the corresponding the plurality of LBLs at the Verase voltage in an erase phase, the set of bias voltages comprising 0V pull down from a floating state voltage to each of the one or more partial-block WLs for erase and the Verase voltage latched to all rest unselected WLs at the floating state.

18. The 3D NAND array of claim 17 wherein raising from 0V to Vsg voltage in the preparation phase at the plurality of LBLs of each selected 3D LG group comprises:
  applying Verase up to ~20V to the independent power line associated with the selected 3D LG group while keeping 0V at the independent power lines associated with non-selected 3D LG groups;
  raising a gate voltage for the row of precharge devices connected to the independent power line associated with the selected 3D LG group from 0V to the Vsg voltage plus a transistor threshold voltage Vt while keeping 0V for other gate voltages of other rows of precharge devices associated with non-selected 3D LG groups;
  floating the common source line of each selected block in the selected 3D LG group while keeping 0V at the common source lines of non-selected blocks.

19. The 3D NAND array of claim 17 wherein setting voltage signals for two common gates of the two rows of string-select devices associated with each selected block in the preparation phase comprising:
  generating the Vsg voltage at one of the set of global bus lines and 0V at another one of the set of global bus lines by the voltage generator;
  setting the latch signal of the block-decoder at a high voltage, to raise from 0V to the Vsg voltage at a first common gate of the first row of string-select devices coupled to the LBL at the second level by connecting to the one of the set of global bus lines at the Vsg voltage and to float a second common gate of the second row of string-select devices coupled to the common source line;
  floating common gates of string-select devices associated with non-selected blocks.

20. The 3D NAND array of claim 19 wherein setting voltage signals for two common gates of the two rows of string-select devices associated with each selected block in the charge-up phase comprising:
  keeping the Vsg voltage at the first common gate but float at the second common gate, and further through the erase phase;
  floating common gates of string-select devices associated with non-selected blocks.

21. The 3D NAND array of claim 17 wherein providing a corresponding set of bias voltages from the block-decoder to all WLs of each selected block comprises:
  switching the latch signal to a high voltage equal to the Verase plus a threshold level for each control transistor to connect the set of global bus lines to all WLs of each selected block including common gates of string-select devices and optional dummy WLs all at floating state on a basis of one-selected block at a time;
  switching the latch signal to 0V again in the erase phase to latch 0V to all the selected partial-block WLs for erase and the Verase voltage to all rest unselected WLs and dummy WLs at floating state; and
  keeping the latch signal at 0V for all non-selected blocks.

22. The 3D NAND array of claim 17 further comprising:
  raising from 0V to the Vsg voltage at the common source line for the selected block in the preparation phase;
  raising from 0V to the Vsg voltage at the second common gate of the second row of string-select devices coupled to the common source line;
  raising from the Vsg voltage further to the Verase voltage at the common source line in the charge-up phase for initiating a two-sided GIDL effect from both LBL side and common source line side to inject hot-holes into vertical bulk region at floating state.

23. The 3D NAND array of claim 3 wherein a partial plane comprising all 3D NAND strings in one or more blocks in one or more 3D HG groups of the plane wherein at least one 3D HG group includes random number L of 3D LG groups with L being selected from 1 up to J−1 3D LG groups, the partial plane being configured to perform an erase operation on all selected partial/full block WLs in the selected 3D NAND strings by connecting all corresponding LBLs associated with all selected 3D LG groups isolated from other non-selected 3D LG groups, latching 0V at all WLs for all blocks in the selected 3D LG groups while setting the string-select devices next to corresponding LBLs to a high voltage and floating the string-select devices coupled to corresponding common source line, ramping up the connected LBLs from 0V to Verase for initiating 1-sided GIDL effect from LBL side for each 3D NAND string to inject hot-holes into the respective vertical bulk regions at floating state.

24. The 3D NAND array of claim 23 wherein the concurrent erase operation for the partial plane further comprising:
  connecting all common source lines associated with all 3D NAND strings in the selected L 3D LG groups;
  latching 0V at all WLs for all blocks in the selected L 3D LG groups while setting the string-select devices next to corresponding common source lines to a high voltage and floating the string-select devices coupled to corresponding LBLs;
  ramping up from 0V to Verase via the driver circuit for the common source line for initiating another 1-sided GIDL effect to inject hot-holes into the respective vertical bulk regions at floating state.

25. A 3D NAND array with 2-level hierarchical bit line architecture comprising:
  one or more NAND planes with independent Psubstrates, each plane comprising a plurality of global bit lines (GBLs) laid at a first level associated with J 3D HG groups mutually connected by a row of 3D DGBL circuits, each 3D HG group being divided into $N_2$ 3D LG groups, each 3D LG group being associated with a plurality of local bit lines (LBLs) laid at a second level in parallel to GBL-direction and respectively coupled to the plurality of GBLs via a plurality of 3D GBL/LBL switch circuits, each 3D LG group including H blocks, each of the H blocks including a plurality of 3D NAND strings respectively associated with the plurality of LBLs cascaded in a row along a word line (WL) direction orthogonal to the GBL-direction and commonly coupled via a row of 3D precharge devices and an additional 3D EPR-controlled device with two PRE signals for respective coupling odd and even LBLs to an independent power line laid in a third level along the WL-direction, each 3D NAND string comprising a series of S 3D NAND cells formed in U-shape with two partial strings being stacked around a vertical bulk region in a stacking-direction orthogonal to both the GBL-direction and the WL-direction and linked by a BG-controlled device at bottom of the string, the 3D NAND string having its source node connected to a first string-select device controlled by SSL signal and its drain node connected to a second string-select device controlled by GSL signal and coupled to a common source line per one or more blocks, the vertical bulk region being isolated from the Psubstrate of the plane, wherein J, $N_2$, H, and S are integers of 2 and greater based on memory chip design.

26. The 3D NAND array of claim 25 further comprising:
a block-decoder configured to use a latch signal to control passing a set of voltage signals from a voltage generator via a set of global bus lines respectively to all WLs and SSL and GSL of the first and second string-select devices per block;
a set of decoders for respectively sending control signals to the row of 3D DGBL devices, a plurality of 3D GBL/LBL switch circuits, two PRE signals and an EPR signal for a row of 3D precharge devices;
driver circuits for respectively providing voltage signals for the common source line per one or more blocks and the independent power line per 3D LG group.

27. The 3D NAND array of claim 26 wherein the block-decoder comprises a latch circuit coupled to an Address Register to decode address information for selecting WLs of any full or partial block for erase and guiding the voltage generator to provide a set of bias voltages for the WLs of a selected block.

28. The 3D NAND array of claim 25 wherein the 3D NAND cell comprises a 2-poly floating gate transistor or a 1-poly charge-trapping transistor configured to perform nLC cell data erase via hole-electron annihilation through GIDL hot-hole injection from at least one of the two common gates of the pair of string-select devices into the vertical bulk region at floating state, where n=1 for SLC cell data with 2 threshold Vt states, n=2 for MLC cell data with 4 threshold Vt states, n=3, for TLC cell data with 8 threshold Vt states.

29. The 3D NAND array of claim 25 wherein the common source line is a metal line laid in parallel to the independent power line substantially at the same third level below the second level along the WL-direction but perpendicular to the GBLs and LBLs.

30. The 3D NAND array of claim 25 wherein the GBLs are laid above the Psubstrate at the first level higher than the LBLs laid in the second level in the stacking-direction with each row of 3D DGBL devices, the plurality of 3D GBL/LBL switch circuits, and each row of 3D precharge devices per each 3D LG group being laid near the second level of the LBLs.

31. The 3D NAND array of claim 25 wherein each 3D DGBL device comprises a pair of 3D NMOS transistors sharing a common gate controlled by a DGBL signal for respectively connecting two neighboring GBLs.

32. The 3D NAND array of claim 25 wherein each 3D GBL/LBL switch circuit comprises a 3D LG12-controlled NMOS transistor with its drain node coupled to the GBL and source node commonly coupled to source nodes of a 3D LG1-controlled NMOS transistor and a LG2-controlled NMOS transistor respectively having their drain nodes connected to the LBL of a 3D LG group and the LBL of a neighboring 3D LG group.

33. The 3D NAND array of claim 25 wherein the 3D precharge device comprises a pair of 3D PREo-controlled and PREe-controlled NMOS transistors coupled the independent power line through a 3D EPR-controlled NMOS transistor respectively to an odd-numbered LBL and an even-numbered LBL per each 3D LG group.

34. The 3D NAND array of claim 25 wherein one or more partial-block WLs randomly located in a selected block are configured to be selected for performing an erase operation, the selected block belonging to one of H blocks in any selected 3D LG group, wherein total number of the one or more partial-block WLs for erase is an integer Z selected from 1 to S−1.

35. The 3D NAND array of claim 34 wherein the one or more partial-block WLs for erase comprise one or more non-selected border WLs subjected to a pre-read operation to obtain a corresponding page data followed by a program operation to write the page data to an alternative pair of LBLs in another pair of 3D LG groups not currently selected for erase or to save the page data to an off-chip flash controller.

36. The 3D NAND array of claim 34 wherein the erase operation on the one or more partial-block WLs in a selected block in a selected 3D LG group comprises a 1-sided GIDL-erase scheme with steps of:
setting EPR signal to 0V for controlling the 3D EPR-controlled device;
floating all gates of 3D GBL/LBL switch circuit, DGBL circuit, and 3D precharge devices in the selected 3D LG group;
raising from 0V to Vsg voltage in a preparation phase at the common source line of each selected block of each selected 3D LG group, the Vsg voltage being a predetermined optimum voltage for inducing GIDL hot-holes in the vertical bulk region at floating state;
setting voltage signals for SSL and GSL of the plurality of the first and the second string-select devices associated with each selected block in the preparation phase and a subsequent charge-up phase;
ramping up further from the Vsg voltage to a Verase voltage in the charge-up phase at the common source line while keeping the Vsg voltage for GSL signal of the plurality of second string-select devices coupled to the common source line; and
providing a corresponding set of bias voltages from the block-decoder to all WLs of each selected block while keeping the corresponding the plurality of LBLs at the Verase voltage in an erase phase, the set of bias voltages in an erase phase comprising 0V pull down from a floating state voltage to each of the one or more partial-block WLs for erase and the Verase voltage latched to all rest unselected WLs at the floating state.

37. The 3D NAND array of claim 36 wherein setting voltage signals for SSL and GSL of the plurality of the first and the second string-select devices for each selected block in the preparation phase comprising:
  generating the Vsg voltage at one of the set of global bus lines and 0V at another one of the set of global bus lines by the voltage generator;
  setting the latch signal of the block-decoder at a high voltage, to raise from 0V to the Vsg voltage for the GSL signal of the second string-select device coupled to the common source line by connecting to the one of the set of global bus lines at the Vsg voltage and to float the first string-select device coupled to the LBL;
  floating common gates of other string-select devices associated with non-selected blocks.

38. The 3D NAND array of claim 37 wherein setting voltage signals for SSL and GSL of the plurality of the first and the second string-select devices for each selected block in the charge-up phase comprising:
  keeping the Vsg voltage for the GSL of the second string-select device but float the SSL of the first string-select device, and further through the erase phase;
  floating common gates of other string-select devices associated with non-selected blocks.

39. The 3D NAND array of claim 36 wherein providing a corresponding set of bias voltages from the block-decoder to all WLs of each selected block comprises:
  switching the latch signal to a high voltage equal to the Verase plus a threshold level for each control transistor to connect the set of global bus lines to all WLs of each selected block including the SSL and GSL of the first and second string-select devices and optional dummy WLs all at floating state on a basis of one-selected block at a time;
  switching the latch signal to 0V again in the erase phase to latch 0V to all the selected partial-block WLs for erase and the Verase voltage to all rest unselected WLs and dummy WLs at floating state; and
  keeping the latch signal at 0V for all non-selected blocks.

40. The 3D NAND array of claim 27 wherein a partial plane comprising all 3D NAND strings in one or more blocks in one or more 3D HG groups of the plane wherein at least one 3D HG group includes random number L of 3D LG groups with L being selected from 1 up to J−1 3D LG groups, the partial plane being configured to perform an erase operation on all selected partial/full block WLs in selected 3D NAND strings by connecting all corresponding LBLs associated with all selected 3D LG groups isolated from other non-selected 3D LG groups, latching 0V at all WLs for all blocks in the selected 3D LG groups while setting the string-select devices next to corresponding LBLs to a high voltage and floating the string-select devices coupled to corresponding common source line, ramping up the connected LBLs from 0V to Verase for initiating 1-sided GIDL effect from LBL side for each 3D NAND string to inject hot-holes into the respective vertical bulk regions at floating state.

41. The 3D NAND array of claim 27 further comprising:
  one DHG circuit for grounding transistor channels of each 3D DGBL circuit;
  a first VSP-controlled circuit to the 3D GBL/LBL switch circuit per 3D LG group;
  a second VSP-controlled circuit to the 3D precharge devices per 3D LG group;
  wherein each 3D NAND string is configured to have the corresponding vertical bulk region connected to the common source line.

42. The 3D NAND array of claim 41 wherein each 3D NAND cell in each 3D NAND string comprises a 2-poly floating gate transistor or a 1-poly charge-trapping transistor configured to perform nLC cell data erase operation on one or more partial-block WLs, where n=1 for SLC cell data with 2 threshold Vt states, n=2 for MLC cell data with 4 threshold Vt states, n=3, for TLC cell data with 8 threshold Vt states.

43. The 3D NAND array of claim 42 wherein the erase operation on the one or more partial-block WLs comprises a FN-tunneling scheme in a selected block of a selected 3D LG group with steps of:
  grounding the VSP signal and setting EPR signal to 0V for controlling the EPR-controlled device;
  floating all gates of 3D GBL/LBL switch circuit, 3D DGBL circuit, and 3D precharge devices in the selected 3D LG group;
  raising from 0V to a predetermined Ver1 voltage in a preparation phase at the common source line of each selected block of each selected 3D LG group;
  setting voltage signals for SSL and GSL of the first and second string-select devices in the preparation phase and a subsequent charge-up phase;
  ramping up further from the Ver1 voltage to a Verase voltage up to ~20V in the charge-up phase at the common source line connected to the vertical bulk region to enable a FN-tunneling erase scheme while raising from 0V to float at GSL for the second string-select device; and
  providing a corresponding set of bias voltages from the block-decoder to all WLs of each selected block, the set of bias voltages comprising 0V for all WLs in the preparation phase, 0V for each of the one or more partial-block WLs in the charge-up phase through an erase phase, and a voltage at float state raised from 0V for all unselected WLs in the charge-up phase through the erase phase.

44. The 3D NAND array of claim 43 wherein setting voltage signals for SSL and GSL of the first and second string-select devices for each selected block in the preparation phase comprising:
  floating at SSL of the plurality of the first string-select devices coupled to the LBLs associated with the selected 3D LG group;
  setting 0V at GSL of the second row of string-select devices coupled to the common source line;
  floating other common gates of string-select devices associated with non-selected blocks.

45. The 3D NAND array of claim 44 wherein setting voltage signals for SSL and GSL of the first and second string-select devices for each selected block in the charge-up phase comprising:
  keeping the SSL of the first string-select devices at floating state, and further through the erase phase;
  raising from 0V to floating state at the GSL of the second string-select devices, and further through the erase phase;
  floating other common gates of string-select devices associated with non-selected blocks.

46. The 3D NAND array of claim 43 wherein providing a corresponding set of bias voltages from the block-decoder to all WLs of each selected block comprises:
  switching the latch signal to a high voltage equal to the Verase plus a threshold level for each control transistor to connect the set of global bus lines to all WLs of each selected block including SSL and GSL of string-select devices and optional dummy WLs on a basis of one-selected block at a time;

switching the latch signal to 0V again in the erase phase to latch 0V to all the selected partial-block WLs for erase and the Verase voltage to all rest unselected WLs and dummy WLs at floating state; and keeping the latch signal at 0V for all non-selected blocks.

47. The 3D NAND array of claim 41 wherein a partial plane comprising all 3D NAND strings in one or more blocks in one or more 3D HG groups of the plane wherein at least one 3D HG group includes random number L of 3D LG groups with L being selected from 1 up to J−1 3D LG groups, the partial plane being configured to perform an erase operation on all selected partial/full block WLs in 3D NAND strings of partial/full blocks by connecting all corresponding common source lines coupled to corresponding vertical bulk regions a same driver circuit, latching 0V at all WLs for all blocks in the selected 3D LG groups while floating the SSL and GSL for the string-select devices for corresponding 3D NAND strings, ramping up the connected common source lines from 0V to Verase via the same driver circuit for removing electrons from 3D NAND cells to the respective vertical bulk regions via FN-tunneling effect.

48. A 3D NAND array with 2-level hierarchical bit line architecture comprising:

one or more NAND planes on respective Psubstrates, each plane comprising a plurality of global bit lines (GBLs) laid at a first level in bit line (BL) direction associated with K 3D HG groups separated by group-dividing devices, each 3D HG group being divided into J 3D LG groups, each 3D LG group being associated with a plurality of local bit lines (LBLs) laid at a second level in parallel to and respectively coupled to the plurality of GBLs via a plurality of 2D GBL/LBL switch circuit, a pair of 3D LG groups being tied via a row of 2D TIE-signal controlled devices, each 3D LG group including H blocks, each of the H blocks including a plurality of 3D NAND strings respectively associated with the plurality of LBLs cascaded in a row along a word line (WL) direction orthogonal to the BL-direction and commonly coupled via a row of 2D precharge devices with two PRE signals for respective coupling odd and even LBLs to an independent power line laid in a third level along the WL-direction, each 3D NAND string comprising a series of S 3D NAND cells stacked around a vertical bulk region in a stacking-direction orthogonal to both the BL-direction and the WL-direction, the 3D NAND string having its source node connected to a first string-select device controlled by SSL signal and its drain node connected to a second string-select device controlled by GSL signal and coupled to a common source line per one or more blocks, the vertical bulk region being directly formed on the Psubstrate of the plane, wherein K, J, H, and S are integers of 2 and greater based on memory chip design;

a block-decoder configured to use a latch signal to control passing a set of voltage signals from a voltage generator via a set of global bus lines respectively to all WLs and SSL and GSL of the first and second string-select devices per block;

a set of decoders for respectively sending control signals to the group-dividing devices, each 2D GBL/LBL switch circuit, TIE signal for each row of TIE-signal controlled devices, two PRE signals for 2D precharge devices;

driver circuits for respectively providing voltage signals for the common source line per one or more blocks and the independent power line per 3D LG group.

49. The 3D NAND array of claim 48 wherein the block-decoder comprises a latch circuit coupled to an Address Register to decode address information for selecting WLs of any full or partial block for erase and guiding the voltage generator to provide a set of bias voltages for the WLs of a selected block.

50. The 3D NAND array of claim 48 wherein the 3D NAND cell comprises a 2-poly floating gate transistor or a 1-poly charge-trapping transistor configured to perform nLC cell data erase via FN-tunneling effect by absorbing trapped electrons into the vertical bulk region at the Verase voltage, where n=1 for SLC cell data with 2 threshold Vt states, n=2 for MLC cell data with 4 threshold Vt states, n=3, for TLC cell data with 8 threshold Vt states.

51. The 3D NAND array of claim 48 wherein the common source line is a metal line laid in parallel to the independent power line substantially at the same third level below the second level along the WL-direction but perpendicular to the GBLs and LBLs.

52. The 3D NAND array of claim 48 wherein the GBLs are laid above the Psubstrate at the first level higher than the LBLs laid in the second level in the stacking-direction with corresponding 2D GBL/LBL switch circuit, 2D TIE-signal controlled devices per a paired 3D LG groups, and 2D precharge devices per each 3D LG group being laid near the third level for the independent power line;

wherein the 2D GBL/LBL switch circuit comprises a 2D LG-controlled NMOS transistor coupled between the GBL and the corresponding LBL;

wherein the 2D TIE-signal controlled device comprises a TIE signal controlling a 2D NMOS transistor having drain and source node respectively connected to two LBLs per one paired 3D LG groups;

wherein the 2D precharge device comprises a pair of 2D PREo-controlled and PREe-controlled NMOS transistors connected the independent power line respectively to odd LBL and even LBL per each 3D LG group.

53. The 3D NAND array of claim 48 wherein one or more partial-block WLs randomly located in a selected block are configured to be selected for performing an erase operation, the selected block belonging to one of H blocks in any selected 3D LG group, wherein total number of the one or more partial-block WLs for erase is an integer Z selected from 1 to S−1.

54. The 3D NAND array of claim 53 wherein the one or more partial-block WLs for erase comprise one or more non-selected border WLs subjected to a pre-read operation to obtain a corresponding page data followed by a program operation to write the page data to an alternative pair of LBLs in another pair of 3D LG groups in another plane associated with an alternative Psubstrate not currently selected for erase or to save the page data to an off-chip flash controller.

55. The 3D NAND array of claim 53 wherein the erase operation on the one or more partial-block WLs in a selected block in a selected 3D LG group comprises a FN-tunneling scheme with steps of:

floating all gates of group-dividing devices, 2D GBL/LBL switch circuits, 2D TIE-signal controlled devices, and 2D precharge devices in the selected 3D LG group;

raising from 0V to a predetermined Ver1 voltage in a preparation phase at the Psubstrate of the plane containing one or more partial-block WLs selected for erase in each selected block of each selected 3D LG group;

setting voltage signals for SSL and GSL of the first and second string-select devices in the preparation phase and a subsequent charge-up phase;

ramping up further from the Ver1 voltage to a Verase voltage up to ~20V in the charge-up phase at the Psubstrate as well as the vertical bulk region to enable a FN-tunneling erase scheme while raising from 0V to float the GSL of the second string-select devices coupled to the common source line; and providing a corresponding set of bias voltages from the block-decoder to all WLs of each selected block, the set of bias voltages comprising 0V for all WLs in the preparation phase, 0V for each of the one or more partial-block WLs in the charge-up phase through an erase phase, and a voltage at float state raised from 0V for all unselected WLs in the charge-up phase through the erase phase.

56. The 3D NAND array of claim 54 wherein setting voltage signals for SSL and GSL of the first and second string-select devices for each selected block in the preparation phase comprising:

floating the SSL of a plurality of the first string-select devices coupled to the LBLs associated with the selected 3D LG group;

setting 0V at the GSL of a plurality of the second string-select devices coupled to the common source line;

floating other common gates of string-select devices associated with non-selected blocks.

57. The 3D NAND array of claim 55 wherein setting voltage signals for SSL and GSL of the first and second string-select devices for each selected block in the charge-up phase comprising:

keeping the SSL of the first string-select devices at floating state, and further through the erase phase;

raising from 0V to floating state at the GSL of the second string-select devices, and further through the erase phase;

floating other common gates of string-select devices associated with non-selected blocks.

58. The 3D NAND array of claim 54 wherein providing a corresponding set of bias voltages from the block-decoder to all WLs of each selected block comprises:

switching the latch signal to a high voltage equal to the Verase plus a threshold level for each control transistor to connect the set of global bus lines to all WLs of each selected block including SSL and GSL of the first and second string-select devices and optional dummy WLs on a basis of one-selected block at a time;

switching the latch signal to 0V again in the erase phase to latch 0V to all the selected partial-block WLs for erase and the Verase voltage to all rest unselected WLs and dummy WLs at floating state; and keeping the latch signal at 0V for all non-selected blocks.

59. The 3D NAND array of claim 48 wherein a partial plane comprising all 3D NAND strings in one or more blocks in one or more 3D HG groups of the plane wherein at least one 3D HG group includes random number L of 3D LG groups with L being selected from 1 up to J−1 3D LG groups, the partial plane being configured to perform an erase operation on all selected partial/full block WLs in 3D NAND strings of partial/full blocks latching 0V at selected WLs for all partial/full blocks in the selected 3D LG groups while floating SSL and GSL for the string-select devices of corresponding 3D NAND strings, ramping up the Psubstrate from 0V to Verase for removing electrons from 3D NAND cells to the respective vertical bulk regions via FN-tunneling effect.

* * * * *